US012237358B2

United States Patent
Tochigi et al.

(10) Patent No.: US 12,237,358 B2
(45) Date of Patent: Feb. 25, 2025

(54) SOLID-STATE IMAGE SENSOR AND ELECTRONIC DEVICE

(71) Applicant: SONY SEMICONDUCTOR SOLUTIONS CORPORATION, Kanagawa (JP)

(72) Inventors: Yasuhisa Tochigi, Kanagawa (JP); Yuki Kawahara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 357 days.

(21) Appl. No.: 17/775,843

(22) PCT Filed: Nov. 10, 2020

(86) PCT No.: PCT/JP2020/041789
§ 371 (c)(1),
(2) Date: May 10, 2022

(87) PCT Pub. No.: WO2021/100528
PCT Pub. Date: May 27, 2021

(65) Prior Publication Data
US 2022/0392944 A1 Dec. 8, 2022

(30) Foreign Application Priority Data

Nov. 19, 2019 (JP) ................. 2019-208998

(51) Int. Cl.
*H01L 27/146* (2006.01)
*H01L 31/107* (2006.01)
(52) U.S. Cl.
CPC ...... *H01L 27/14641* (2013.01); *H01L 31/107* (2013.01); *H01L 27/14623* (2013.01); *H01L 27/14643* (2013.01)
(58) Field of Classification Search
CPC .................. H01L 31/107; H01L 27/14643
See application file for complete search history.

(56) References Cited

U.S. PATENT DOCUMENTS

| 10,204,950 B1 | 2/2019 | Yamashita |
| 2012/0217602 A1 | 8/2012 | Enomoto |

(Continued)

FOREIGN PATENT DOCUMENTS

| CN | 108574000 | 9/2018 |
| CN | 110050348 A | 7/2019 |

(Continued)

OTHER PUBLICATIONS

International Search Report and Written Opinion prepared by the Japan Patent Office on Jan. 7, 2021, for International Application No. PCT/JP2020/041789, 3 pgs.

(Continued)

*Primary Examiner* — Thanh Luu
(74) *Attorney, Agent, or Firm* — SHERIDAN ROSS P.C.

(57) ABSTRACT

A solid-state image sensor including a photoelectric conversion region partitioned by trenches, a first semiconductor region surrounding the photoelectric conversion region, a first contact in contact with the first semiconductor region at a bottom portion of the trench, a first electrode in contact with the first contact in the first trench, a second semiconductor region in contact with the first semiconductor region having the same conductive type as the first semiconductor region, a third semiconductor region in contact with the second semiconductor region, between the second semiconductor region and a first surface, and having a second conductive type, a second contact on the first surface in contact with the third semiconductor region, and a second electrode in contact with the second contact, and a second surface at which the first contact and the first electrode are in contact with each other is inclined with respect to the first surface.

20 Claims, 36 Drawing Sheets

(56) References Cited

U.S. PATENT DOCUMENTS

| | | | |
|---|---|---|---|
| 2016/0099278 A1* | 4/2016 | Guyader | H01L 27/1203 257/432 |
| 2019/0006399 A1 | 1/2019 | Otake et al. | |
| 2019/0043901 A1 | 2/2019 | Honda et al. | |
| 2019/0157323 A1 | 5/2019 | Ogi et al. | |

FOREIGN PATENT DOCUMENTS

| | | |
|---|---|---|
| CN | 110098124 | 8/2019 |
| CN | 110190079 | 8/2019 |
| JP | H09-261671 | 10/1997 |
| JP | 2006-147758 | 6/2006 |
| JP | 2010-114274 | 5/2010 |
| JP | 2012-178457 | 9/2012 |
| JP | 2015-041746 | 3/2015 |
| JP | 2018-201005 | 12/2018 |
| JP | 2020-149987 | 9/2020 |
| TW | 1637494 B | 10/2018 |
| TW | 1665796 B | 7/2019 |
| WO | WO 2017/187957 | 11/2017 |
| WO | WO 2018/139279 | 8/2018 |
| WO | WO 2018/174090 | 9/2018 |
| WO | WO 2018/212175 | 11/2018 |
| WO | WO 2019/098035 | 5/2019 |

OTHER PUBLICATIONS

Notice of Allowance for China Application No. 202080074083.2. dated Nov. 23, 2024; 7 pages.

* cited by examiner

SOLID-STATE IMAGE SENSOR AND ELECTRONIC DEVICE

CROSS REFERENCE TO RELATED APPLICATIONS

This application is a national stage application under 35 U.S.C. 371 and claims the benefit of PCT Application No. PCT/JP2020/041789, having an international filing date of 10 Nov. 2020, which designated the United States, which PCT application claimed the benefit of Japanese Patent Application No. 2019-208998, filed 19 Nov. 2019, the entire disclosures of each of which are incorporated herein by reference.

FIELD

The present disclosure relates to a solid-state image sensor and an electronic device.

BACKGROUND

In recent years, Single Photon Avalanche Diode (SPAD) has been developed, which amplifies charges generated by photoelectric conversion by means of avalanche multiplication (also referred to as avalanche amplification) and outputs them as an electric signal. The avalanche amplification is a phenomenon in which electrons accelerated by an electric field collide with latticed atoms in an impurity diffusion region of a PN junction to break the bonds, and the newly generated electrons collide with other latticed atoms to break the bonds, and in which, by repeating the process, the current is multiplied.

Such a SPAD can be applied to a distance measuring device that measures a distance to an object on the basis of time until light emitted from a light emitting unit is reflected on the object and returned, a solid-state image sensor that converts the amount of incident light into an electric signal, and the like.

In order to discharge the large current generated by the avalanche amplification from the SPAD pixel, it is desirable to form contacts with low resistance and ohmic contact. As a method of forming a contact with low resistance and ohmic contact in the impurity diffusion region formed in the semiconductor substrate, it is generally known to form a high-concentration impurity region in the contact portion.

CITATION LIST

Patent Literature

Patent Literature 1: JP 2015-41746 A

SUMMARY

Technical Problem

Here, in order to obtain an electric field strength sufficient to generate the avalanche amplification, it is necessary to apply high voltage in the reverse bias direction to the PN junction. However, in a case where the distance from the PN junction to the contact is short, a strong electric field is formed therebetween, and a tunnel effect is generated. In a case where such a tunnel effect is generated, the electron-hole pair generated by the photoelectric conversion is immediately recombined by the tunnel current, which causes a problem in which the avalanche amplification cannot be generated.

In order to avoid the generation of the tunnel effect, a method of arranging the contact on the outermost periphery of the impurity diffusion region to increase the distance from the PN junction region to the contact can be considered. However, in this case, it is difficult to secure a large contact area between the contact and the electrode. Therefore, the sensitivity (Photon Detection Efficiency (PDE)) decreases due to the voltage drop caused by the high contact resistance. In a case where the voltage value is increased to suppress the decrease in PDE, the power consumption increases.

Therefore, the present disclosure proposes a solid-state image sensor and an electronic device capable of suppressing high contact resistance and improving PDE.

Solution to Problem

To solve the problems described above, a solid-state image sensor according to the present disclosure includes: a semiconductor substrate including a first trench provided on a first surface and a second trench provided along a bottom portion of the first trench; and a photoelectric conversion element provided on the semiconductor substrate, wherein the photoelectric conversion element includes a photoelectric conversion region provided in an element region partitioned by the first trench and the second trench in the semiconductor substrate and photoelectrically converting incident light to generate a charge, a first semiconductor region surrounding the photoelectric conversion region in the element region, a first contact in contact with the first semiconductor region at the bottom portion of the first trench, a first electrode in contact with the first contact in the first trench, a second semiconductor region provided in a region in the element region in contact with the first semiconductor region and having a first conductive type, which is an equal type to that of the first semiconductor region, a third semiconductor region serving as a region in the element region in contact with the second semiconductor region, provided between the second semiconductor region and the first surface, and having a second conductive type, which is an opposite type to that of the first conductive type, a second contact provided on the first surface so as to be in contact with the third semiconductor region, and a second electrode in contact with the second contact, and a second surface at which the first contact and the first electrode are in contact with each other is inclined with respect to the first surface.

DESCRIPTION OF EMBODIMENTS

Hereinbelow, embodiments of the present disclosure will be described in detail with reference to the drawings. Note that, in each of the following embodiments, identical components are labeled with the same reference signs, and duplicate description is omitted.

Also, the present disclosure will be described according to the order of items illustrated below.
1. First Embodiment
1.1 Electronic Device
1.2 Solid-State Image Sensor
1.3 SPAD Pixel
1.4 Example of General Operation of SPAD Pixel
1.5 Example of Color Filter Layout
1.6 Example of Stacked Structure of Solid-State Image Sensor
1.7 Example of Cross-Sectional Structure of SPAD Pixel
1.8 Positional Relationship Between Anode Contact and Cathode Contact and/or N+-Type Semiconductor Region
1.9 Manufacturing Method
1.10 Effects
1.11 Modification Examples
1.11.1 First Modification Example
1.11.2 Second Modification Example
1.11.3 Third Modification Example
1.11.4 Fourth Modification Example
1.11.5 Fifth Modification Example
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
9.1 Example of Cross-Sectional Structure of SPAD Pixel
9.2 Effects
9.3 Modification Examples
9.3.1 First Modification Example
9.3.2 Second Modification Example
9.3.3 Third Modification Example
10. Example of Application to Electronic Device
11. Example of Application to Movable Body
12. Application example to Endoscopic Surgery System
13. Appendix

1. FIRST EMBODIMENT

First, a solid-state image sensor and an electronic device according to a first embodiment will be described in detail with reference to the drawings.

1.1 Electronic Device

Figure 1:
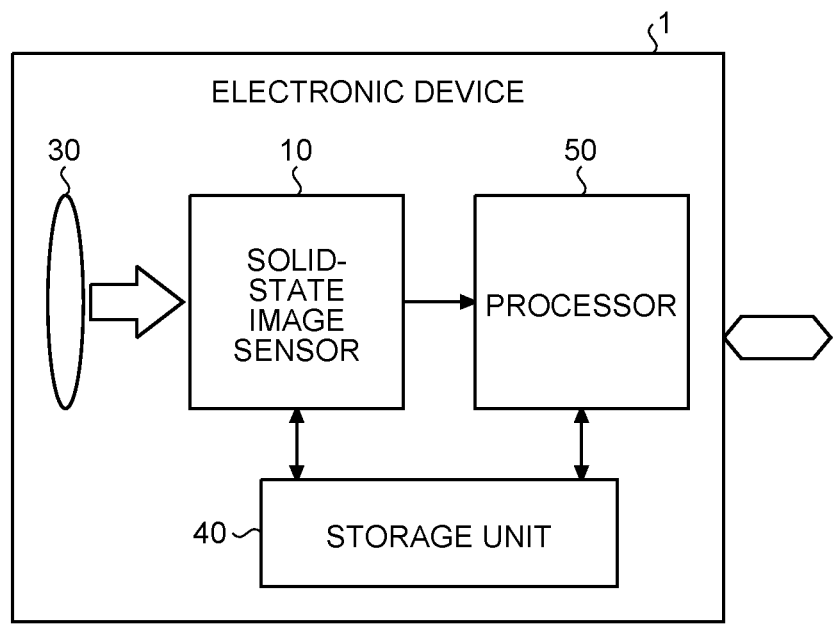
FIG. 1 is a block diagram illustrating a schematic configuration example of an electronic device equipped with a solid-state image sensor according to a first embodiment.

FIG. 1 is a block diagram illustrating a schematic configuration example of an electronic device equipped with a solid-state image sensor according to the first embodiment. As illustrated in FIG. 1, an electronic device 1 includes, for example, an image capturing lens 30, a solid-state image sensor 10, a storage unit 40, and a processor 50.

The image capturing lens 30 is an example of an optical system that collects incident light and forms an image on the light receiving surface of the solid-state image sensor 10. The light receiving surface may be a surface of the solid-state image sensor 10 on which photoelectric conversion elements are arranged. The solid-state image sensor 10 photoelectrically converts the incident light to generate image data. The solid-state image sensor 10 also executes predetermined signal processing such as denoising and white balance control on the generated image data.

The storage unit 40 includes, for example, a flash memory, a dynamic random access memory (DRAM), and a static random access memory (SRAM), and records image data or the like input from the solid-state image sensor 10.

The processor 50 is configured by using, for example, a central processing unit (CPU), and may include an application processor that executes an operating system, various kinds of application software, and the like, a graphics processing unit (GPU), a baseband processor, and the like. The processor 50 executes various kinds of processing as necessary to image data input from the solid-state image sensor 10, image data read from the storage unit 40, and the like, displays the image data to the user, and transmits the image data to the outside via a predetermined network.

1.2 Solid-State Image Sensor

Figure 2:
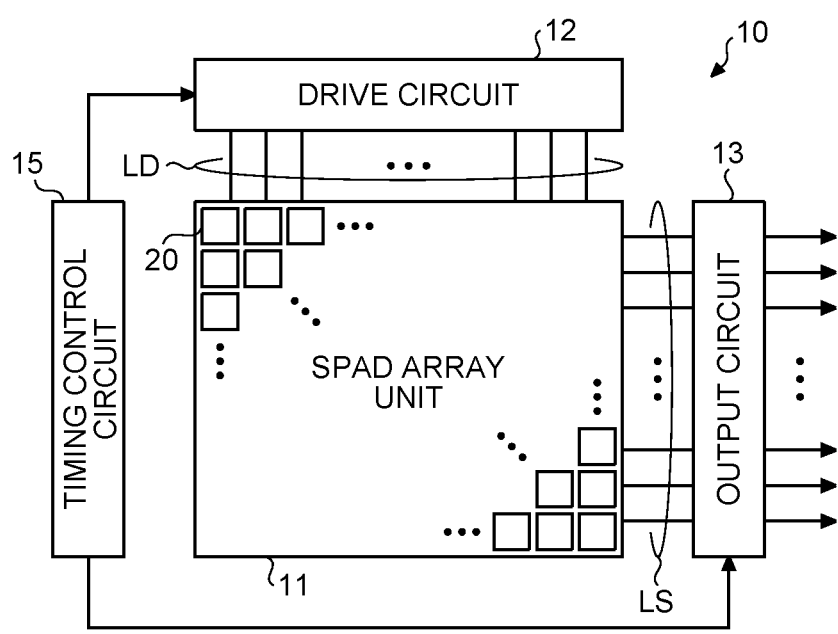
FIG. 2 is a block diagram illustrating a schematic configuration example of an image sensor according to the first embodiment.

FIG. 2 is a block diagram illustrating a schematic configuration example of a complementary metal-oxide-semiconductor (CMOS) type solid-state image sensor (hereinbelow, simply referred to as an image sensor) according to the first embodiment. Here, the CMOS type image sensor is an image sensor created by applying or partially using the CMOS process. In the present embodiment, the so-called back-illuminated image sensor 10, in which the surface of the semiconductor substrate opposite to the element-forming surface is the light incident surface, is exemplified, but the present embodiment is not limited to the back-illuminated image sensor and may use the so-called front-illuminated image sensor, in which the element-forming surface is the light incident surface.

As illustrated in FIG. 2, the image sensor 10 includes a SPAD array unit 11, a timing control circuit 15, a drive circuit 12, and an output circuit 13.

The SPAD array unit 11 includes a plurality of SPAD pixels 20 arranged in a matrix form. To the plurality of SPAD pixels 20, a pixel drive line LD (up-down direction in the figure) is connected for each column, and an output signal line LS (right-left direction in the figure) is connected for each row. One end of the pixel drive line LD is connected to the output end corresponding to each of the columns of the drive circuit 12, and one end of the output signal line LS is connected to the input end corresponding to each of the lines of the output circuit 13.

The drive circuit 12 includes a shift register, an address decoder, and the like, and drives the respective SPAD pixels 20 of the SPAD array unit 11 all at a time, for each column, or the like. The drive circuit 12 at least includes a circuit that applies a quench voltage V_QCH described below to each of the SPAD pixels 20 in a selected column in the SPAD array unit 11, and a circuit that applies a selection control voltage V_SEL described below to each of the SPAD pixels 20 in a selected column. The drive circuit 12 then applies the selection control voltage V_SEL to the pixel drive line LD corresponding to the column to be read to select the SPAD pixels 20 in the column to be used for detecting incidence of a photon.

A signal (referred to as a detection signal) V_OUT output from each of the SPAD pixels 20 in the column selected and scanned by the drive circuit 12 is input into the output circuit 13 through each of the output signal lines LS. The output circuit 13 outputs the detection signal V_OUT input from each of the SPAD pixels 20 as a pixel signal to the external storage unit 40 or processor 50.

The timing control circuit 15 includes a timing generator and the like that generate various timing signals, and controls the drive circuit 12 and the output circuit 13 on the basis of various timing signals generated by the timing generator.

1.3 SPAD Pixel

Figure 3:
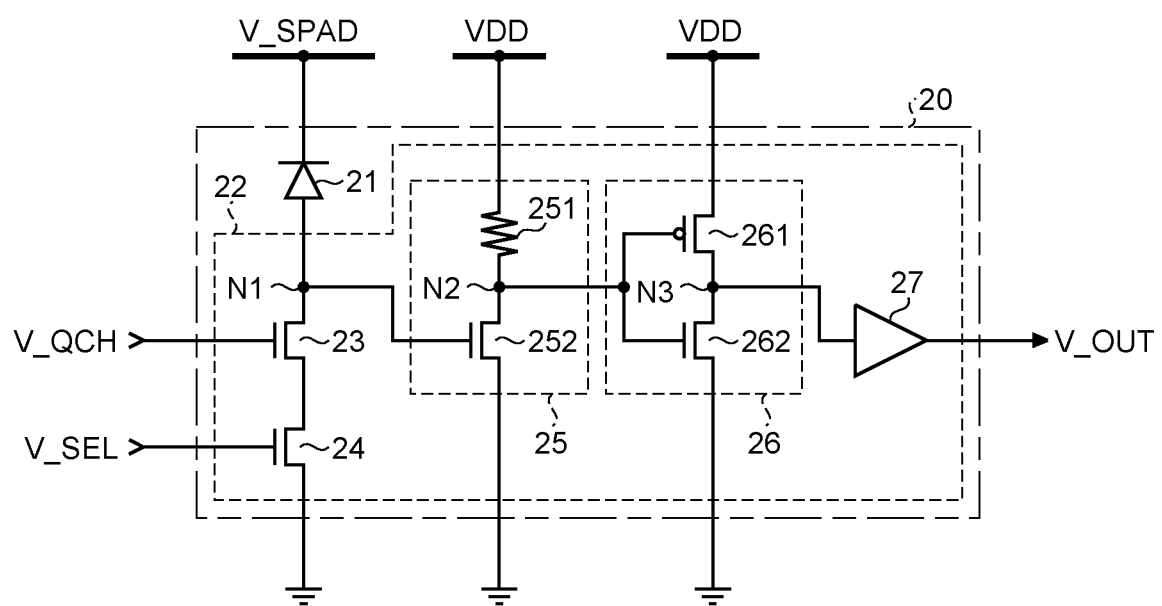
FIG. 3 is a circuit diagram illustrating a schematic configuration example of a SPAD pixel according to the first embodiment.

FIG. 3 is a circuit diagram illustrating a schematic configuration example of the SPAD pixel according to the first embodiment. As illustrated in FIG. 3, the SPAD pixel 20 includes a photodiode 21 that serves as a light receiving element and a readout circuit 22 that detects that a photon is incident on the photodiode 21. The photodiode 21 generates an avalanche current when a photon is incident in a state where a reverse bias voltage V_SPAD equal to or higher than the breakdown voltage (breakdown voltage) is applied between its anode and cathode.

The readout circuit 22 includes a quench resistor 23, a digital converter 25, an inverter 26, a buffer 27, and a selection transistor 24. The quench resistor 23 is, for example, an N-type metal oxide semiconductor field effect transistor (MOSFET) (hereinbelow referred to as an NMOS transistor), its drain is connected to the anode of the photodiode 21, and its source is grounded via the selection transistor 24. Also, the quench voltage V_QCH, which is preset in order to cause the NMOS transistor to act as the quench resistor, is applied to the gate of the NMOS transistor constituting the quench resistor 23 from the drive circuit 12 via the pixel drive line LD.

In the present embodiment, the photodiode 21 is a SPAD. The SPAD is an avalanche photodiode that operates in a Geiger mode when a reverse bias voltage equal to or higher than the breakdown voltage (breakdown voltage) is applied between its anode and cathode, and can detect the incident of one photon.

The digital converter 25 includes a resistor 251 and an NMOS transistor 252. As for the NMOS transistor 252, its drain is connected to a power supply voltage VDD via the resistor 251, and its source is grounded. Also, the voltage of a connection point N1 between the anode of the photodiode 21 and the quench resistor 23 is applied to the gate of the NMOS transistor 252.

The inverter 26 includes a P-type MOSFET (hereinbelow referred to as a PMOS transistor) 261 and an NMOS transistor 262. As for the PMOS transistor 261, its drain is connected to the power supply voltage VDD, and its source is connected to the drain of the NMOS transistor 262. As for the NMOS transistor 262, its drain is connected to the source of the PMOS transistor 261, and its source is grounded. The voltage of a connection point N2 between the resistor 251 and the drain of the NMOS transistor 252 is applied to the gate of the PMOS transistor 261 and the gate of the NMOS transistor 262. The output of the inverter 26 is input into the buffer 27.

The buffer 27 is a circuit for impedance conversion, and when an output signal is input from the inverter 26, the buffer 27 impedance-converts the input output signal and outputs it as a detection signal V_OUT.

The selection transistor 24 is, for example, an NMOS transistor, its drain is connected to the source of the NMOS transistor constituting the quench resistor 23, and its source is grounded. The selection transistor 24 is connected to the drive circuit 12, and when the selection control voltage V_SEL from the drive circuit 12 is applied to the gate of the selection transistor 24 via the pixel drive line LD, the selection transistor 24 changes from an off state to an on state.

1.4 Example of General Operation of SPAD Pixel

The readout circuit 22 illustrated in FIG. 3 operates as follows, for example. That is, first, while the selection control voltage V_SEL is applied from the drive circuit 12 to the selection transistor 24, and the selection transistor 24 is in an on state, the reverse bias voltage V_SPAD equal to or higher than the breakdown voltage (breakdown voltage) is applied to the photodiode 21. This allows the operation of the photodiode 21.

On the other hand, while the selection control voltage V_SEL is not applied from the drive circuit 12 to the selection transistor 24, and the selection transistor 24 is in off on state, the reverse bias voltage V_SPAD is not applied to the photodiode 21, and the operation of the photodiode 21 is thus prohibited.

When a photon is incident on the photodiode 21 while the selection transistor 24 is in the on state, an avalanche current is generated in the photodiode 21. As a result, the avalanche current flows through the quench resistor 23, and the voltage at the connection point N1 rises. When the voltage at the connection point N1 becomes higher than the on voltage of the NMOS transistor 252, the NMOS transistor 252 is in an on state, and the voltage at the connection point N2 changes from the power supply voltage VDD to 0 V. When the voltage at the connection point N2 changes from the power supply voltage VDD to 0V, the PMOS transistor 261 changes from an off state to an on state, the NMOS transistor 262 changes from an on state to an off state, and the voltage at the connection point N3 changes from 0 V to the power supply voltage VDD. As a result, the high level detection signal V_OUT is output from the buffer 27.

Thereafter, as the voltage at the connection point N1 continues to rise, the voltage applied between the anode and cathode of the photodiode 21 becomes lower than the breakdown voltage, which causes the avalanche current to stop and the voltage at the connection point N1 to drop. Then, when the voltage at the connection point N1 becomes lower than the on voltage of the NMOS transistor 252, the NMOS transistor 252 is in an off state, and the output of the detection signal V_OUT from the buffer 27 is stopped (low level).

In this manner, the readout circuit 22 outputs the high-level detection signal V_OUT during a period from the time when a photon is incident on the photodiode 21 to generate an avalanche current, which causes the NMOS transistor 252 to be in an on state, to the time when the avalanche current is stopped, which causes the NMOS transistor 252 to be in an off state. The output detection signal V_OUT is input into the output circuit 13.

1.5 Example of Color Filter Layout

Figure 4:
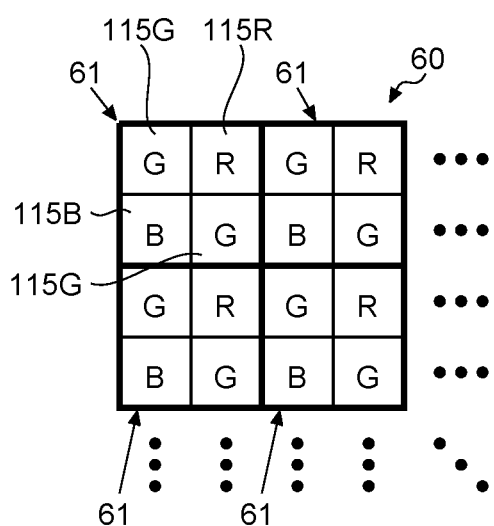
FIG. 4 is a diagram illustrating an example of a color filter layout according to the first embodiment.

As described above, a color filter that selectively transmits light of a specific wavelength is arranged in the photodiode 21 of each SPAD pixel 20. FIG. 4 is a diagram illustrating an example of a color filter layout according to the first embodiment.

As illustrated in FIG. 4, a color filter array 60 has, for example, a configuration in which patterns (hereinbelow referred to as unit patterns) 61, which are units of repetition in the color filter array, are arranged in a two-dimensional grid pattern.

Each of the unit patterns 61 has a so-called Bayer array configuration consisting of a total of four color filters including, for example, a color filter 115R that selectively transmits light having a red (R) wavelength component, two color filters 115G that selectively transmit light having a green (G) wavelength component, and a color filter 115B that selectively transmits light having a blue (B) wavelength component.

Note that, in the present disclosure, the color filter array 60 is not limited to the Bayer array. For example, various color filter arrays can be employed such as an X-Trans (registered trademark) type color filter array with a unit pattern of 3×3 pixels, a quad Bayer array with 4×4 pixels, and a white RGB type color filter array with 4×4 pixels including color filters for the three primary colors of RGB as well as a color filter having a broad light transmission characteristic to the visible light region (hereinbelow, also referred to as a clear or a white).

1.6 Example of Stacked Structure of Solid-State Image Sensor

Figure 5:
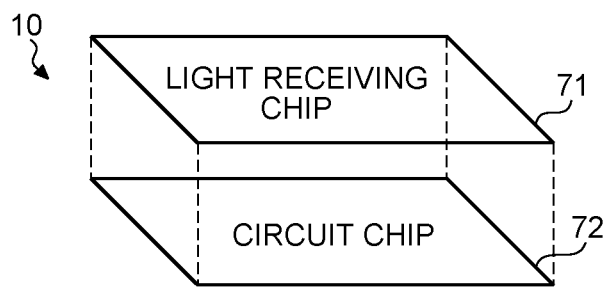
FIG. 5 is a diagram illustrating an example of a stacked structure of the image sensor according to the first embodiment.

FIG. 5 is a diagram illustrating an example of a stacked structure of the image sensor according to the first embodiment. As illustrated in FIG. 5, the image sensor 10 has a structure in which a light receiving chip 71 and a circuit chip 72 are stacked one above the other. The light receiving chip 71 is, for example, a semiconductor chip that includes the SPAD array unit 11 in which the photodiodes 21 are arrayed, and the circuit chip 72 is, for example, a semiconductor chip in which the readout circuits 22 illustrated in FIG. 3 are arrayed. Note that, on the circuit chip 72, peripheral circuits such as the timing control circuit 15, the drive circuit 12, and the output circuit 13 may be arranged.

For bonding the light receiving chip 71 and the circuit chip 72, for example, so-called direct bonding, in which the respective bonding surfaces are planarized and bonded by an interelectronic force, can be used. However, the bonding is not limited to this, and for example, so-called Cu—Cu bonding, in which copper (Cu) electrode pads formed on the bonding surfaces of the chips are bonded together, bump bonding, or the like can be used.

Also, the light receiving chip 71 and the circuit chip 72 are electrically connected via a connection portion such as Through-Silicon Via (TSV) penetrating the semiconductor substrate. For connection using the TSV, for example, a so-called twin TSV method, in which two TSVs, a TSV provided in the light receiving chip 71 and a TSV provided from the light receiving chip 71 to the circuit chip 72, are connected on the outer surface of the chip, or a so-called shared TSV method, in which both the chips are connected by a TSV that penetrates from the light receiving chip 71 to the circuit chip 72, can be employed.

However, in a case where the Cu—Cu bonding or the bump bonding is used for bonding the light receiving chip 71 and the circuit chip 72, the chips are electrically connected via the Cu—Cu bonding portion or the bump bonding portion.

1.7 Example of Cross-Sectional Structure of SPAD Pixel

Figure 6:
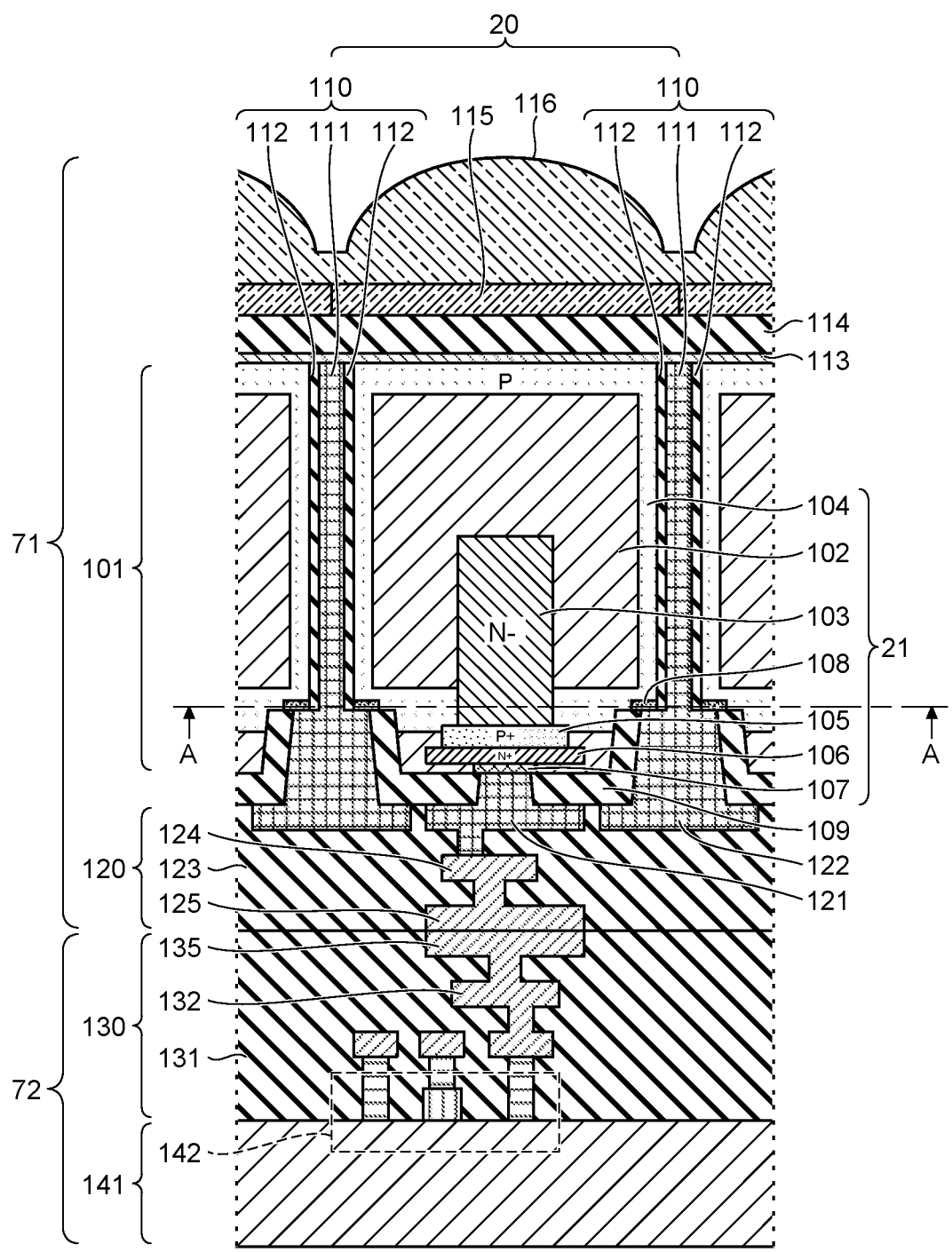
FIG. 6 is a vertical cross-sectional view illustrating an example of a cross-sectional structure of a surface of the SPAD pixel according to the first embodiment perpendicular to the light incident surface.
Figure 7:
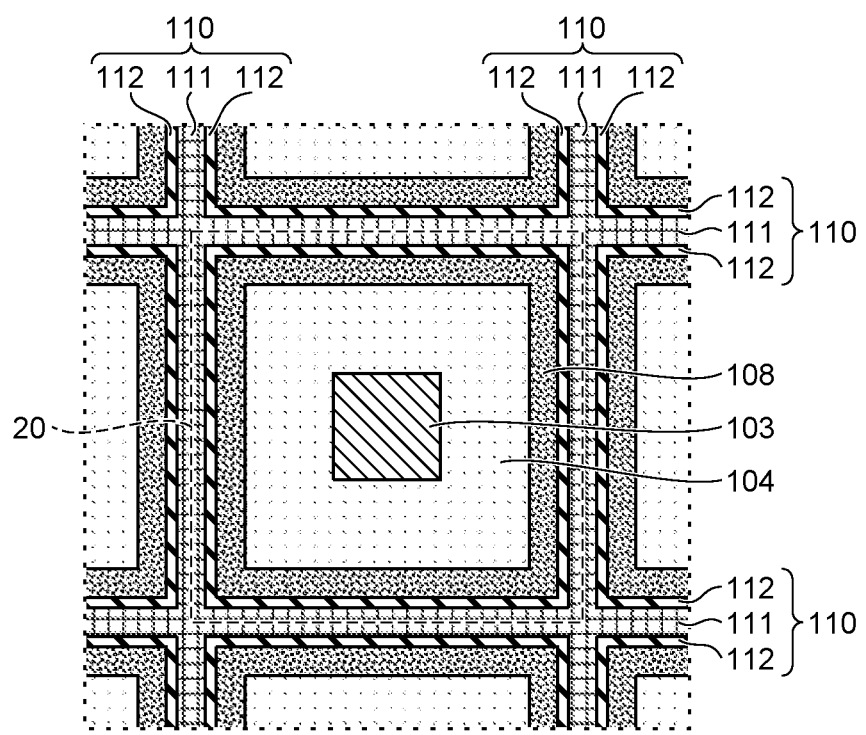
FIG. 7 is a horizontal cross-sectional view illustrating an example of a cross-sectional structure of the plane A-A in FIG. 6.

FIG. 6 is a vertical cross-sectional view illustrating an example of a cross-sectional structure of a surface of the SPAD pixel according to the first embodiment perpendicular to the light incident surface. FIG. 7 is a horizontal cross-sectional view illustrating an example of a cross-sectional structure of the plane A-A in FIG. 6. Note that FIG. 6 focuses on the cross-sectional structure of the photodiode 21.

As illustrated in FIG. 6, the photodiode 21 of the SPAD pixel 20 is provided, for example, in a semiconductor substrate 101 constituting the light receiving chip 71. The semiconductor substrate 101 is partitioned into a plurality of element regions by an element separation unit 110 formed in a grid-like shape as viewed from the light incident surface (refer to the example in FIG. 7). The photodiode 21 is provided in each of the element regions partitioned by the element separation unit 110. Note that the element separation unit 110 may include an anode electrode 122 and an insulating film 109 in a first trench, which will be described below.

Each photodiode 21 includes a photoelectric conversion region 102, a P-type semiconductor region 104, an N--type semiconductor region 103, a P+-type semiconductor region 105, an N+-type semiconductor region 106, a cathode contact 107, and an anode contact 108.

The photoelectric conversion region 102 is, for example, an N-type well region or a region containing low concentrations of donors, and photoelectrically converts incident light to generate electron-hole pairs (hereinbelow referred to as charges).

The P-type semiconductor region 104 is, for example, a region containing P-type acceptors, and is provided in a region surrounding the photoelectric conversion region 102 as illustrated in FIGS. 6 and 7. When the reverse bias voltage V_SPAD is applied to the below-mentioned anode contact 108, the P-type semiconductor region 104 forms an electric field for guiding the charges generated in the photoelectric conversion region 102 to the N--type semiconductor region 103.

The N--type semiconductor region 103 is, for example, a region containing donors the concentration of which is higher than that in the photoelectric conversion region 102. As illustrated in FIGS. 6 and 7, the N--type semiconductor region 103 is arranged at the center portion of the photoelectric conversion region 102, and takes in the charges generated in the photoelectric conversion region 102 and guides them to the P+-type semiconductor region 105. Note that the N--type semiconductor region 103 is not an essential component and may be omitted.

The P+-type semiconductor region 105 is, for example, a region containing acceptors the concentration of which is higher than that in the P-type semiconductor region 104 and is partially in contact with the P-type semiconductor region 104. Also, the N+-type semiconductor region 106 is, for example, a region containing donors the concentration of which is higher than that in the N--type semiconductor region 103 and is in contact with the P+-type semiconductor region 105.

These P+-type semiconductor region 105 and N+-type semiconductor region 106 form a PN junction and function as an amplification region that accelerates the inflowing charges to generate an avalanche current.

The cathode contact 107 is, for example, a region containing donors the concentration of which is higher than that in the N+-type semiconductor region 106, and is provided in a region in contact with the N+-type semiconductor region 106.

The anode contact 108 is, for example, a region containing acceptors the concentration of which is higher than that in the P+-type semiconductor region 105. The anode contact 108 is provided in a region in contact with the outer periphery of the P-type semiconductor region 104. The width of the anode contact 108 may be, for example, about 40 nm (nanometers). The anode contact 108 comes in contact with the entire outer periphery of the P-type semiconductor region 104 in this manner to enable a uniform electric field to be formed in the photoelectric conversion region 102.

Also, as illustrated in FIGS. 6 and 7, the anode contact 108 is provided on the bottom surface of a trench (hereinbelow referred to as a first trench) provided in a grid pattern along the element separation unit 110 on the front surface (lower surface in the drawing) side of the semiconductor substrate 101. Due to such a structure, as will be described below, the position to form the anode contact 108 is displaced in the height direction from the positions to form the cathode contact 107 and the N+-type semiconductor region 106.

The front surface (lower surface in the drawing) side of the semiconductor substrate 101 is covered with the insulating film 109. The film thickness (thickness in the substrate width direction) of the insulating film 109 in the first trench depends on the voltage value of the reverse bias voltage V_SPAD applied between the anode and the cathode, but may be, for example, about 150 nm.

The insulating film 109 is provided with openings that expose the cathode contact 107 and the anode contact 108 on the front surface of the semiconductor substrate 101, and the openings are provided with a cathode electrode 121 in contact with the cathode contact 107 and an anode electrode 122 in contact with the anode contact 108, respectively.

The element separation unit 110 that partitions the semiconductor substrate 101 into the respective photodiodes 21 is provided in a trench (hereinbelow referred to as a second trench) that penetrates the semiconductor substrate 101 from the front surface to the back surface. The second trench is connected to the first trench on the front surface side of the semiconductor substrate 101. The inner dimension of the second trench is shorter than the inner dimension of the first trench, and a step portion formed as the result is provided with the anode contact 108.

Each of the element separation units 110 includes an insulating film 112 that covers the inner surface of the second trench and a light-shielding film 111 with which the inside of the second trench is filled. The film thickness (thickness in the substrate width direction) of the insulating film 112 depends on the voltage value of the reverse bias voltage V_SPAD applied between the anode and the cathode, but may be, for example, about 10 nm to 20 nm. Also, the film thickness (thickness in the substrate width direction) of the light-shielding film 111 depends on the material used for the light-shielding film 111, but may be, for example, about 150 nm.

Here, by using a conductive material having a light-shielding property for the light-shielding film 111 and the anode electrode 122, the light-shielding film 111 and the anode electrode 122 can be formed in the same process. Further, by using the same conductive material as the light-shielding film 111 and the anode electrode 122 for the cathode electrode 121 as well, the light-shielding film 111, the anode electrode 122, and the cathode electrode 121 can be formed in the same process.

As such a conductive material having a light-shielding property, tungsten (W) or the like can be used. However, the conductive material is not limited to tungsten (W), and can be changed with various materials such as aluminum (Al), an aluminum alloy, and copper (Cu) as long as it is a conductive material that has the property of reflecting or absorbing visible light or light required for each element.

However, the material for the light-shielding film 111 in the second trench is not limited to the conductive material, and can be, for example, a high-refractive-index material having a higher refractive index than the semiconductor substrate 101 or a low-refractive-index material having a lower refractive index than the semiconductor substrate 101.

Further, since the material used for the cathode electrode 121 is not required to have a light-shielding property, a conductive material such as copper (Cu) may be used instead of the conductive material having a light-shielding property.

Note that, in the present embodiment, a so-called front full trench isolation (FFTI) type element separation unit 110, which penetrates the semiconductor substrate 101 from the front surface side is exemplified as the second trench, but the second trench is not limited to this, and a full trench isolation (FTI) type element separation unit, which penetrates the semiconductor substrate 101 from the back surface side and/or the front surface side, or a deep trench isolation (DTI) type or reverse deep trench isolation (RDTI) type element separation unit, which is formed from the front surface or the back surface to the middle of the semiconductor substrate 101, can be employed as the second trench.

In a case where the second trench is of the FTI type penetrating the semiconductor substrate 101 from the back surface side, the material for the light-shielding film 111 may be inserted into the second trench from the back surface side of the semiconductor substrate 101.

The upper portions of the cathode electrode 121 and the anode electrode 122 project to the front surface (lower surface in the drawing) of the insulating film 109. On the front surface (lower surface in the drawing) of the insulating film 109, an interconnect layer 120 is provided, for example.

The interconnect layer 120 includes an interlayer insulating film 123 and an interconnect 124 provided in the interlayer insulating film 123. The interconnect 124 is in contact with, for example, the cathode electrode 121 projecting from the front surface (lower surface in the drawing) of the insulating film 109. Note that the interconnect layer 120 is also provided with an interconnect that comes into contact with the anode electrode 122 although it is omitted in FIG. 6.

On the front surface (lower surface in the drawing) of the interconnect layer 120, a connection pad 125 made of copper (Cu) is exposed, for example. The connection pad 125 may be a part of the interconnect 124. In this case, the interconnect 124 is also made of copper (Cu).

To the front surface of the interconnect layer 120, an interconnect layer 130 in the circuit chip 72 is connected. The interconnect layer 130 includes an interlayer insulating film 131 and an interconnect 132 provided in the interlayer insulating film 131. The interconnect 132 is electrically connected to a circuit element 142 such as the readout circuit 22 formed on a semiconductor substrate 141. Therefore, the cathode electrode 121 of the semiconductor substrate 101 is connected to the readout circuit 22 illustrated in FIG. 3 via the interconnect 124, the connection pads 125 and 135, and the interconnect 132.

Also, on the front surface (upper surface in the drawing) of the interconnect layer 130, the connection pad 135 made of copper (Cu) is exposed, for example. By bonding this connection pad 135 and the connection pad 125 exposed on the surface of the interconnect layer 120 of the light receiving chip 71 (Cu—Cu joining), the light receiving chip 71 and the circuit chip 72 are electrically and mechanically connected.

The connection pad 135 may be a part of the interconnect 132. In this case, the interconnect 132 is also made of copper (Cu).

Also, on the back surface (upper surface in the drawing) of the semiconductor substrate 101, a pinning layer 113 and a planarizing film 114 are provided. Further, on the planarizing film 114, a color filter 115 and an on-chip lens 116 for each SPAD pixel 20 are provided.

The pinning layer 113 is a fixed charge film constituted by a hafnium oxide ($HfO_2$) film or an aluminum oxide ($Al_2O_3$) film containing a predetermined concentration of acceptors, for example. The planarizing film 114 is an insulating film made of an insulating material such as silicon oxide ($SiO_2$) and silicon nitride (SiN), and is a film to planarize the surface on which the upper color filter 115 and on-chip lens 116 are to be formed.

In the above structure, when the reverse bias voltage V_SPAD equal to or higher than the breakdown voltage is applied between the cathode contact 107 and the anode contact 108, an electric field is formed that guides charges generated in the photoelectric conversion region 102 to the N−-type semiconductor region 103 due to a potential difference between the P-type semiconductor region 104 and the N+-type semiconductor region 106. In addition, a strong electric field is formed in the PN junction region between the P+-type semiconductor region 105 and the N+-type semiconductor region 106 to accelerate the inflowing charges and generate an avalanche current. As a result, the photodiode 21 is allowed to operate as an avalanche photodiode.

1.8 Positional Relationship Between Anode Contact and Cathode Contact and/or N+-Type Semiconductor Region Next, the positional relationship between the anode contact 108 and the cathode contact 107 and/or the N+-type semiconductor region 106 in the present embodiment will be described.

As described above, in the present embodiment, the anode contact 108 is arranged at the bottom of the first trench formed on the front surface side of the semiconductor substrate 101. Accordingly, in the present embodiment, the anode contact 108 is arranged at a deeper position than the cathode contact 107 and the N+-type semiconductor region 106 from the front surface (lower surface in the drawing) of the semiconductor substrate 101. That is, in the present embodiment, in a case where the front surface (lower surface in the drawing) of the semiconductor substrate 101 is used as a reference, the position to form the anode contact 108 is displaced in the height direction from the positions to form the cathode contact 107 and the N+-type semiconductor region 106.

In other words, the height of the anode contact 108 from the front surface of the semiconductor substrate 101 is different from the height of the N+-type semiconductor region 106 from the front surface of the semiconductor substrate 101. In a specific example, the height of the anode contact 108 from the front surface of the semiconductor substrate 101 is longer than the height of the N+-type semiconductor region 106 from the front surface of the semiconductor substrate 101.

In this manner, since the position to form the anode contact 108 and the positions to form the cathode contact 107 and the N+-type semiconductor region 106 are displaced from each other in the height direction, the distance from the anode contact 108 to the cathode contact 107 and/or the N+-type semiconductor region 106 can be extended without enlarging the size of the SPAD pixel 20 in the lateral direction (direction parallel to the incident surface).

As a result, since generation of a tunnel effect can be suppressed without enlarging the pixel size, avalanche amplification can be generated in a stable manner while suppressing a decrease in resolution.

1.9 Manufacturing Method

Next, a method for manufacturing the image sensor 10 according to the present embodiment will be described in detail with reference to the drawings. Note that, in the following description, attention will be paid to a method for manufacturing the light receiving chip 71.

FIGS. 8 to 20 are process cross-sectional views illustrating a method for manufacturing the solid-state image sensor according to the first embodiment.

Figure 8:
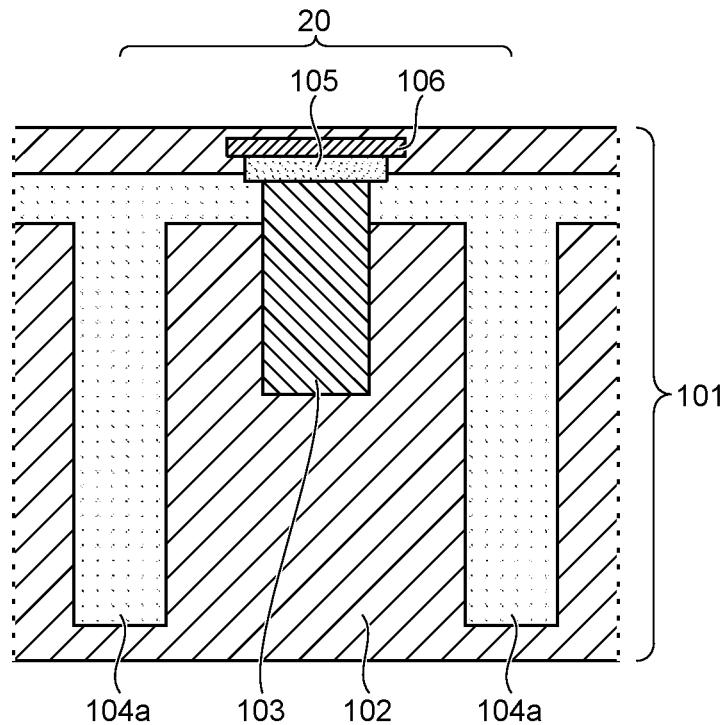
FIG. 8 is a process cross-sectional view illustrating a method for manufacturing the solid-state image sensor according to the first embodiment (Process 1).

In the present manufacturing method, first, as illustrated in FIG. 8, donors and acceptors are ion-implanted into predetermined regions of the semiconductor substrate 101 entirely containing low concentrations of donors to form a part of the P-type semiconductor region 104 (P-type semiconductor region 104a) that partitions the photoelectric conversion region 102, the N−-type semiconductor region 103, the P+-type semiconductor region 105, and the N+-type semiconductor region 106. Note that the ion implantation may be performed from the front surface (upper surface in the drawing) of the semiconductor substrate 101, for example. Also, after the ion implantation, annealing for damage recovery at the time of the ion implantation and improvement of the profile of the implanted dopant may be performed once or a plurality of times.

Figure 9:
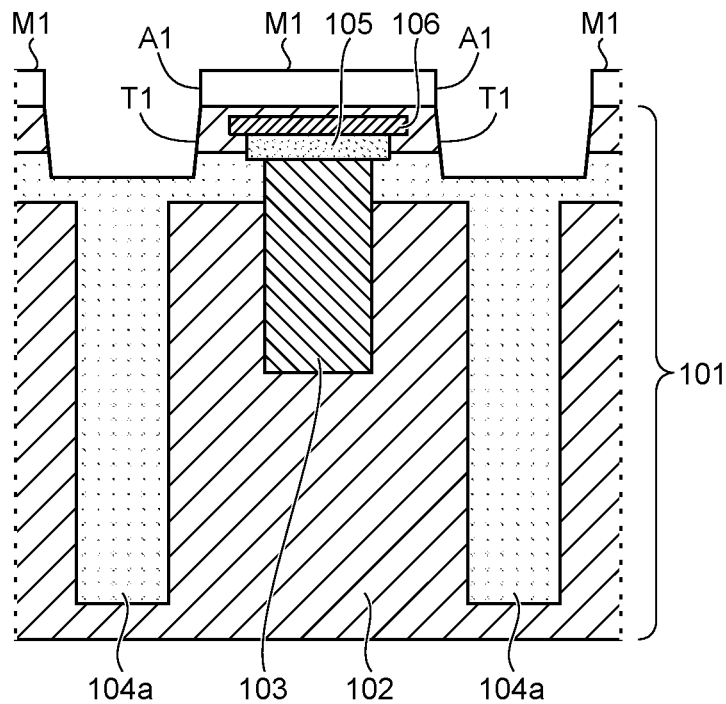
FIG. 9 is a process cross-sectional view illustrating the method for manufacturing the solid-state image sensor according to the first embodiment (Process 2).

Subsequently, as illustrated in FIG. 9, a mask M1 having a grid-like opening A1 is formed on the front surface of the semiconductor substrate 101, and the semiconductor substrate 101 is engraved by means of anisotropic dry etching such as reactive ion etching (RIE) from the upper side of the mask M1 to form a grid-like first trench T1 along the boundary portion with the adjacent SPAD pixel 20. Note that the depth of the first trench T1 may be long enough for the bottom surface thereof to be located at a deeper level than the lower surface of the P+-type semiconductor region 105 and to reach the P-type semiconductor region 104a.

Note that the longer the depth of the first trench T1 from the front surface of the semiconductor substrate 101, the longer the distance to be secured from the anode contact 108 to the N+-type semiconductor region 106 and the cathode contact 107, which is preferable. However, if the first trench T1 is made too deep, the process accuracy may decrease, and the yield may be lowered. Therefore, the depth of the first trench T1 should be set deep within a range in which the process accuracy higher than necessary can be ensured.

Figure 10:
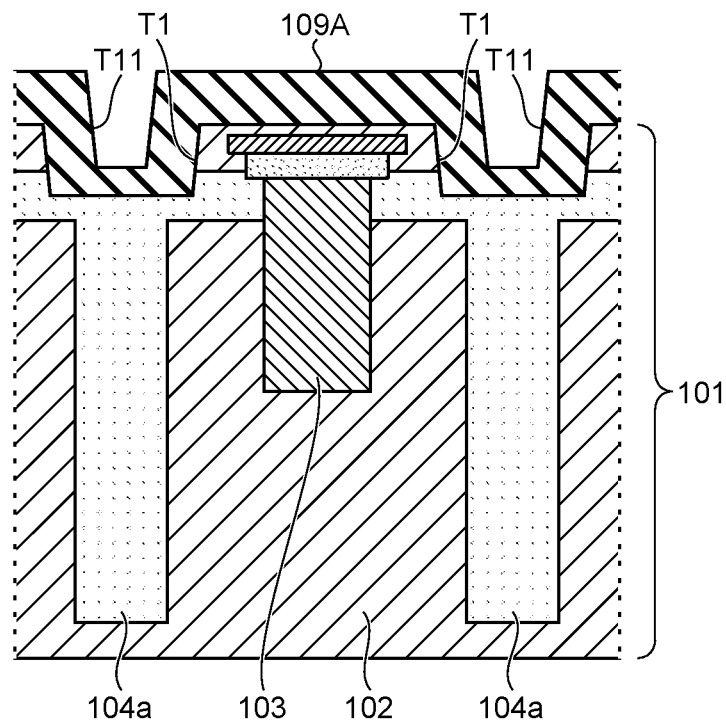
FIG. 10 is a process cross-sectional view illustrating the method for manufacturing the solid-state image sensor according to the first embodiment (Process 3).

Subsequently, as illustrated in FIG. 10, after removing the mask M1, an insulating film 109A covering the front surface of the semiconductor substrate 101 and the inside of the first trench T1 is formed by using a film forming technique such as sputtering and a chemical vapor deposition (CVD) method. Note that, for the insulating film 109A, an insulating material such as silicon oxide ($SiO_2$), silicon nitride (SiN), silicon carbide (SiC), and aluminum oxide ($Al_2O_3$) can be used. Also, the insulating film 109A may have a single-layer structure or a stacked structure. As described above, since a high reverse bias voltage V_SPAD is applied to the anode electrode 122, the insulating film 109A is required to have high withstand voltage performance. In view of the requirement, it is preferable to use an insulating material having high withstand voltage performance such as silicon oxide ($SiO_2$) as a material for the insulating film 109A.

Figure 11:
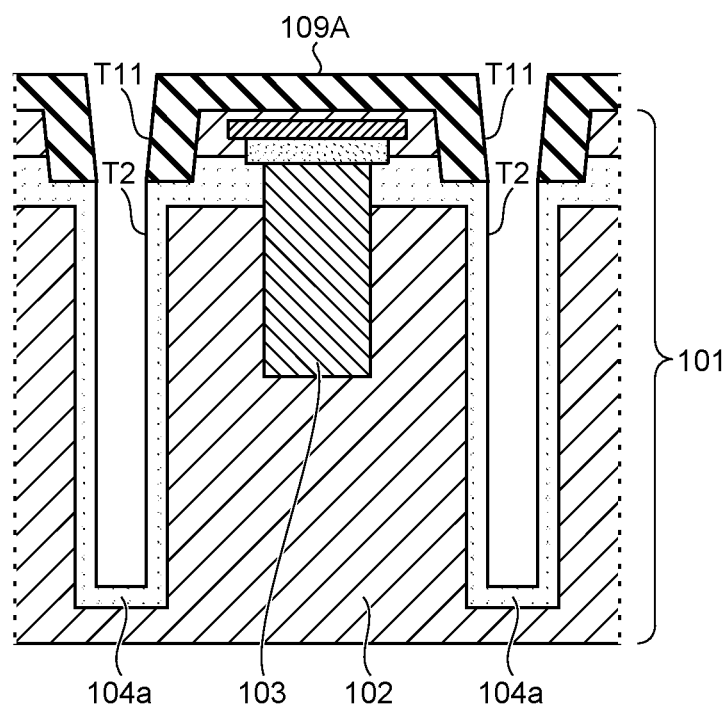
FIG. 11 is a process cross-sectional view illustrating the method for manufacturing the solid-state image sensor according to the first embodiment (Process 4).

Subsequently, as illustrated in FIG. 11, the bottom surface of a trench T11 formed by the surface of the insulating film 109A in the first trench T1 is engraved in the substrate thickness direction to form a second trench T2 ranging from the front surface side of the semiconductor substrate 101 to the vicinity of the back surface. Note that, for formation of the second trench T2, anisotropic dry etching that enables a sufficiently high selectivity with respect to the semiconductor substrate 101 to be obtained can be used, for example. Therefore, it is possible to etch the grid-like region of the semiconductor substrate 101 at which the element separation unit 110 is to be formed while using as a mask the insulating film 109A formed on the inner surface of the first trench T1 and the upper surface of the semiconductor substrate 101.

Figure 12:
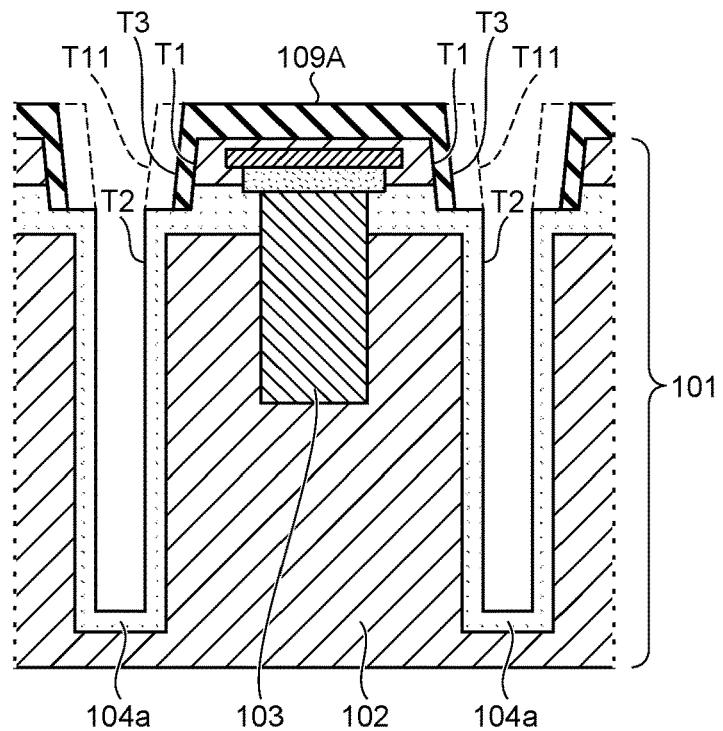
FIG. 12 is a process cross-sectional view illustrating the method for manufacturing the solid-state image sensor according to the first embodiment (Process 5).

Subsequently, as illustrated in FIG. 12, the insulating film 109A in the first trench T1 is thinned by means of isotropic etching such as wet etching to expose the outer periphery portion of the P-type semiconductor region 104a at the bottom of the first trench T1. At this time, the insulating film 109A on the front surface of the semiconductor substrate 101 may be thinned.

Figure 13:
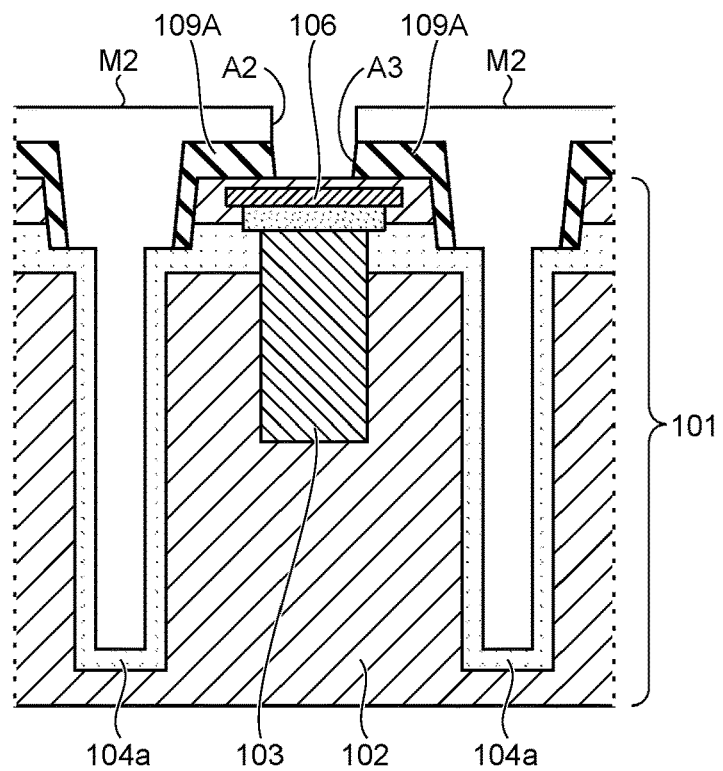
FIG. 13 is a process cross-sectional view illustrating the method for manufacturing the solid-state image sensor according to the first embodiment (Process 6).

Subsequently, as illustrated in FIG. 13, a mask M2 having an opening A2 above the N+-type semiconductor region 106 is formed on the insulating film 109A, and the insulating film 109A is etched from the upper side of the mask M2 by means of anisotropy dry etching such as RIE to form an opening A3 that exposes a part of the upper surface of the semiconductor substrate 101.

Figure 14:
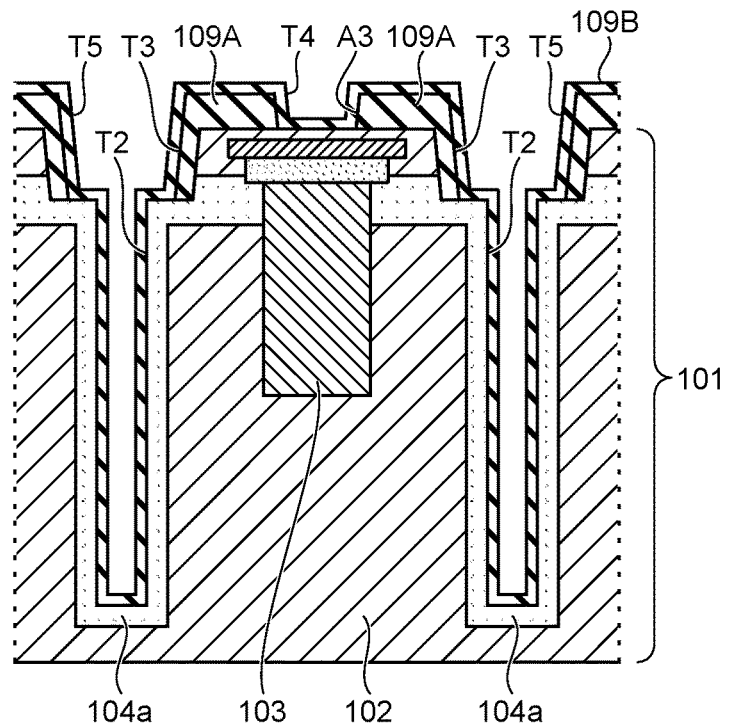
FIG. 14 is a process cross-sectional view illustrating the method for manufacturing the solid-state image sensor according to the first embodiment (Process 7).

Subsequently, as illustrated in FIG. 14, after removing the mask M2, by using a film forming technique such as the CVD method, an insulating film 109B covering the surface of the insulating film 109A, the inner side surface and the bottom surface of the opening A3, and the inner side surfaces of the first trench T1 and the second trench T2 is formed isotropically. In the following description, the insulating film 109A and the insulating film 109B are collectively referred to as the insulating film 109. Also, the trench formed by the surface of the insulating film 109B in the opening A3 is referred to as a trench T4, and the trench formed by the surface of the insulating film 109B in the trench T3 is referred to as a trench T5.

Note that the insulating film 109B may be omitted. In a case where the insulating film 109B is omitted, the details of which will be described in a below-mentioned first modification example, the anode electrode 122 and the P-type semiconductor region 104a can be brought into contact with each other in the second trench T2 as well as in the anode contact 108, which enables a contact with low resistance to be achieved.

On the other hand, in a case where the insulating film 109B is formed, it is possible to reduce the damage to the semiconductor substrate 101 due to ion implantation during contact formation, which will be described below.

Figure 15:
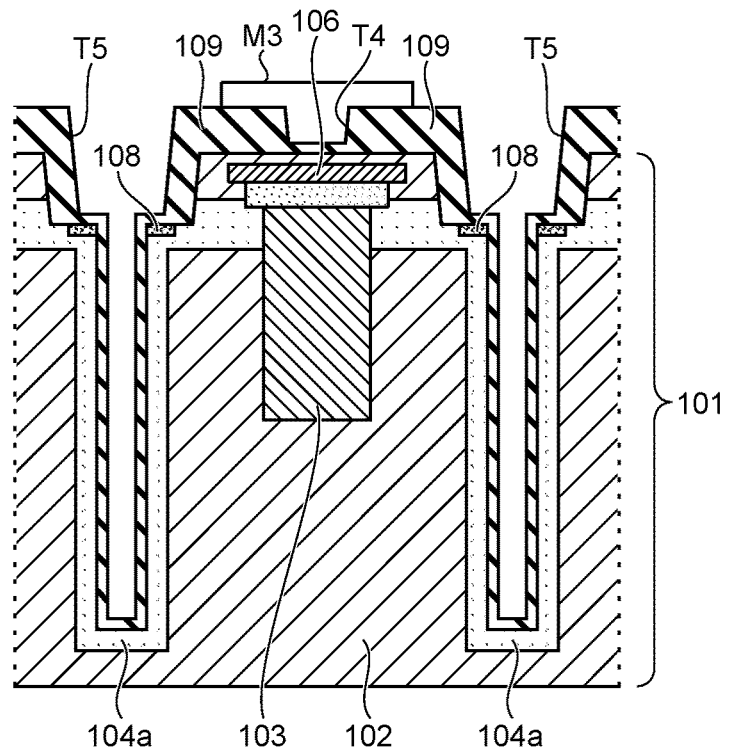
FIG. 15 is a process cross-sectional view illustrating the method for manufacturing the solid-state image sensor according to the first embodiment (Process 8).

Subsequently, as illustrated in FIG. 15, a mask M3 covering the trench T4 located above the N+-type semiconductor region 106 is formed, and acceptors are ion-implanted at high concentrations from the upper side of the mask M3 and the insulating film 109. At this time, the mask M3 and the insulating film 109 function as masks to cause the anode contact 108 containing high concentrations of acceptors to be formed at the bottom portion of the trench T5, which is a region at which the thickness of the insulating film 109 is small, in other words, the upper outer periphery of the P-type semiconductor region 104 (for example, refer to FIG. 7).

Figure 16:
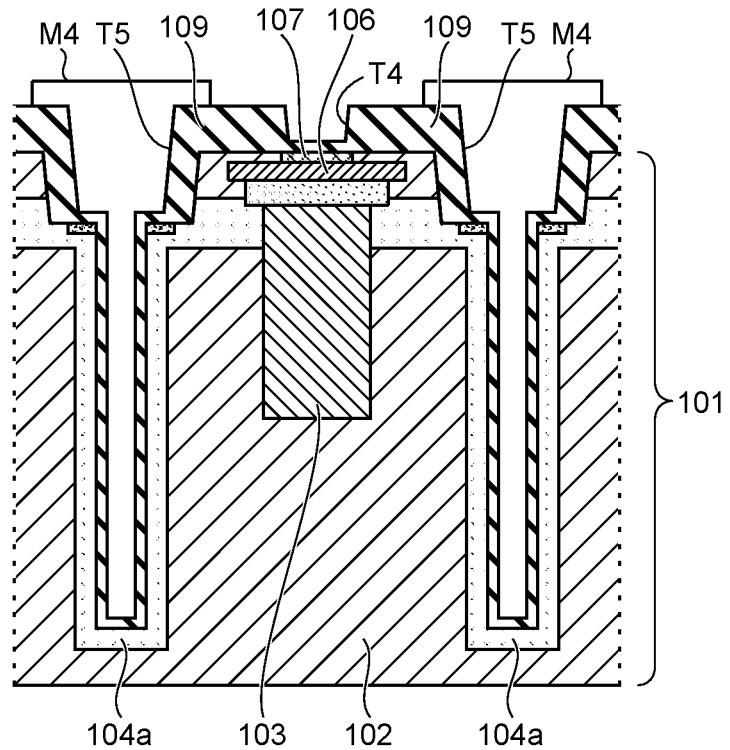
FIG. 16 is a process cross-sectional view illustrating the method for manufacturing the solid-state image sensor according to the first embodiment (Process 9).

Subsequently, as illustrated in FIG. 16, after removing the mask M3, a mask M4 covering the trench T5 formed in a grid pattern is formed, for example, and donors are ion-implanted at high concentrations from the upper side of the mask M4 and the insulating film 109. At this time, the mask M4 and the insulating film 109 function as masks to cause the cathode contact 107 containing high concentrations of donors to be formed at the bottom portion of the trench T4, which is a region at which the thickness of the insulating film 109 is small, in other words, a part of the semiconductor substrate 101 located on the N+-type semiconductor region 106.

Note that, for formation of the anode contact 108 and the cathode contact 107, not only the ion implantation method but also various methods such as solid phase diffusion and plasma doping can be used.

Figure 17:
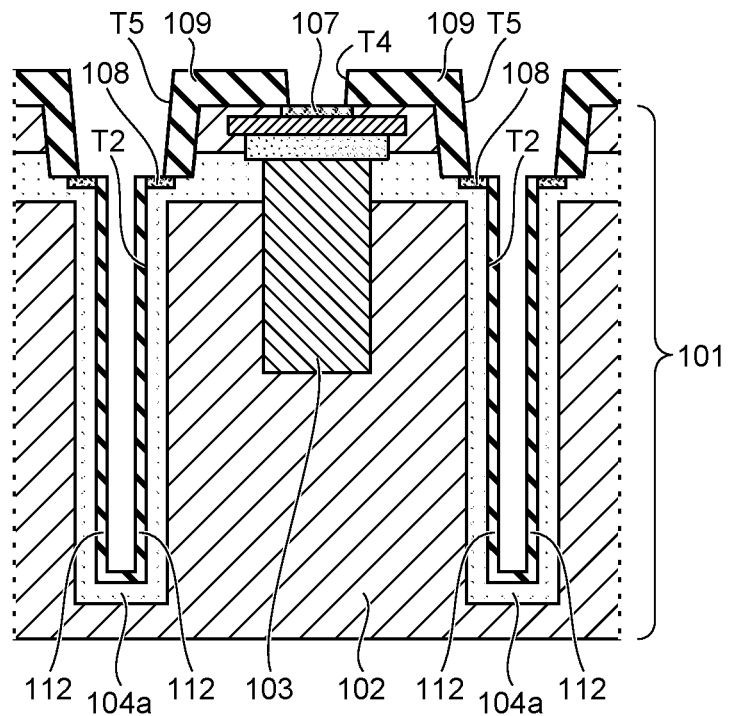
FIG. 17 is a process cross-sectional view illustrating the method for manufacturing the solid-state image sensor according to the first embodiment (Process 10).

Subsequently, as illustrated in FIG. 17, after removing the mask M4, by etching back the entire surface of the insulating film 109, for example, the insulating film 109 at the bottom portion of the trench T4 is removed to expose the cathode contact 107, and the insulating film 109 at the bottom portion of the trench T5 is removed to expose the anode contact 108.

At this time, the details of which will be described in a below-mentioned second modification example, by forming a mask having a predetermined opening pattern by means of photolithography or the like, the region to remove the insulating film 109 and expose the anode contact 108 may be limited.

In a case where the entire surface of the insulating film 109 is etched back, it is possible to secure a contact area between the anode contact 108 and the anode electrode 122, and low resistance contact can thus be formed. Also, since the anode contact 108 and the anode electrode 122 can be brought into contact with each other so as to surround the outer periphery of the P-type semiconductor region 104a, a uniform electric field can be formed in the photoelectric conversion region 102.

On the other hand, in a case where the region to remove the insulating film 109 is limited, the contact portion between the anode contact 108 and the anode electrode 122 can be adjusted, and the distribution of the electric field formed in the photoelectric conversion region 102 can thus be controlled.

Note that, in the present embodiment, the insulating film 109 remaining in the second trench T2 after the insulating film 109 is thinned is used as the insulating film 112 of the element separation unit 110.

Subsequently, a titanium (Ti)/titanium nitride (TiN) film, for example, is formed on the exposed surfaces of the cathode contact 107 and the anode contact 108, and annealing is performed at about 500° C. to 800° C. in that state. As a result, silicon (Si) and titanium (Ti) react with each other on the exposed surfaces of the cathode contact 107 and the anode contact 108 to form titanium silicide layers.

By forming the silicide on the surfaces (contact surfaces) of the cathode contact 107 and the anode contact 108 in this manner, the contact between the cathode contact 107 and the cathode electrode 121 and the contact between the anode contact 108 and the anode electrode 122 can be ohmic contact. Therefore, it is possible to reduce the resistance of those connections. As a result, since the contact area between the anode contact 108 and the anode electrode 122 can be reduced, the pixel size can be reduced, and the resolution can be increased.

Note that a Co/TiN film may be used instead of the Ti/TiN film. Even in this case, since the cobalt silicide layers are formed on the surfaces (contact surfaces) of the cathode contact 107 and the anode contact 108, the cathode contact 107 and the cathode electrode 121, and the anode contact 108 and the anode electrode 122, can be in ohmic contact.

In addition, by using various kinds of silicide such as nickel silicide instead of titanium silicide and cobalt silicide, the cathode contact 107 and the cathode electrode 121, and the anode contact 108 and the anode electrode 122 can be in ohmic contact.

Figure 18:
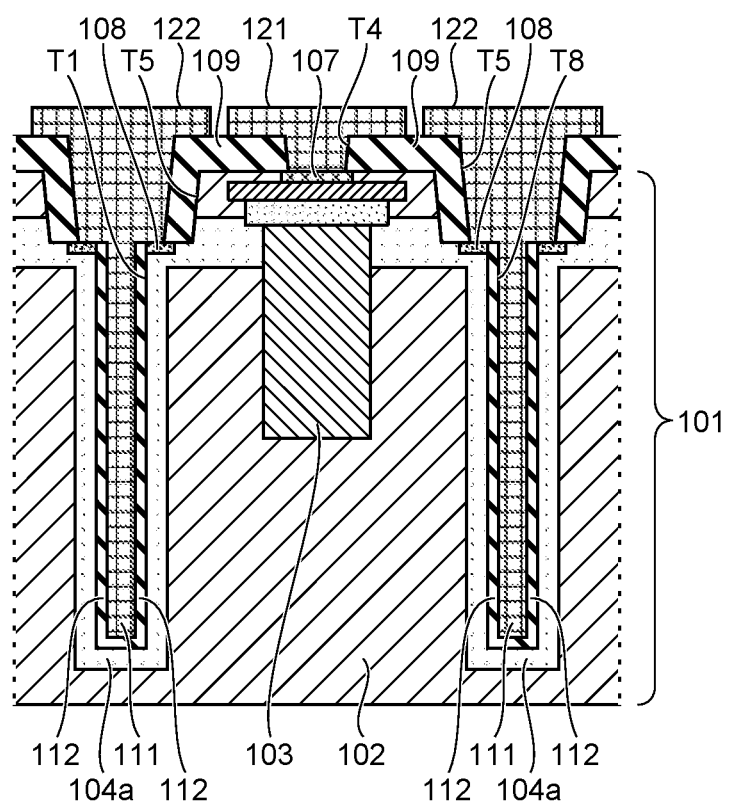
FIG. 18 is a process cross-sectional view illustrating the method for manufacturing the solid-state image sensor according to the first embodiment (Process 11).

Subsequently, as illustrated in FIG. 18, by using a lift-off method or the like, the light-shielding film 111 is formed in the first trench T1, the cathode electrode 121 in contact with the cathode contact 107 is formed in the trench T4, and the anode electrode 122 in contact with the anode contact 108 is formed in the second trench T2.

As described above, the materials for the light-shielding film 111, and the cathode electrode 121 and the anode electrode 122, can be various conductive materials, such as aluminum (Al), an aluminum alloy, and copper (Cu), instead of tungsten (W), that have the property of reflecting or absorbing visible light or light required for each element.

In a case where the same material is used for the light-shielding film 111, and the cathode electrode 121 and the anode electrode 122, they can be formed all at once. On the other hand, in a case where different materials are used for the light-shielding film 111, and the cathode electrode 121 and the anode electrode 122, the light-shielding film 111 is first formed, and then the cathode electrode 121 and the anode electrode 122 are formed by using a lift-off method or the like.

Subsequently, on the insulating film 109 on which the cathode electrode 121 and the anode electrode 122 are formed, the interconnect layer 120 including the interconnect 124 connected to the cathode electrode 121, an interconnect 126 connected to the anode electrode 122, and the interlayer insulating film 123 is formed. Also, the connection pads 125 and 127 made of copper (Cu) exposed on the surface of the interlayer insulating film 123 are formed.

Figure 19:
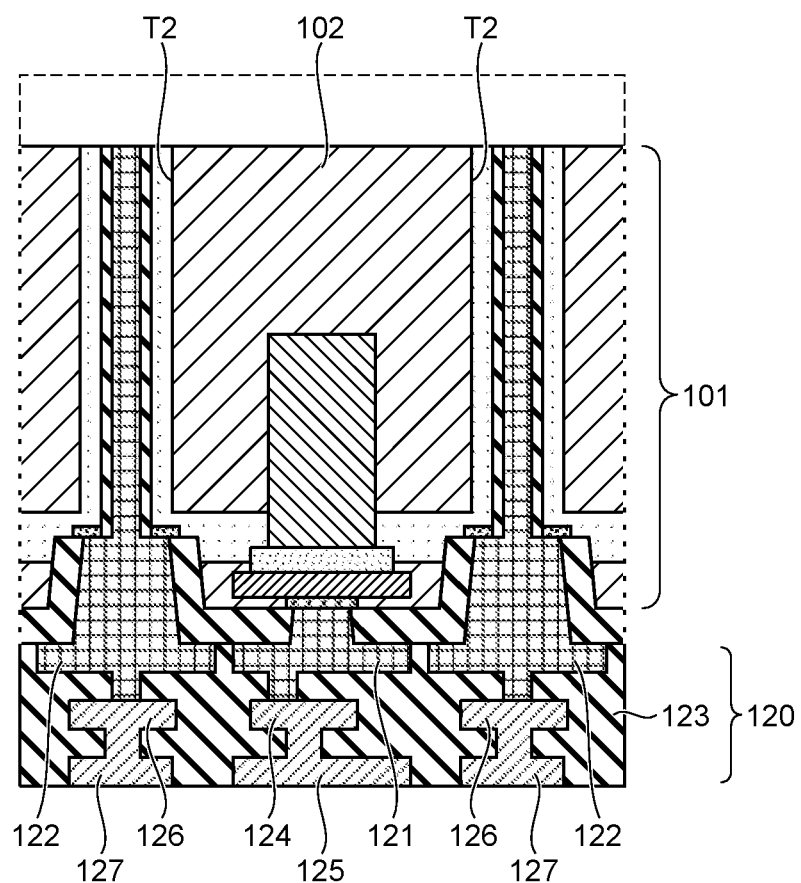
FIG. 19 is a process cross-sectional view illustrating the method for manufacturing the solid-state image sensor according to the first embodiment (Process 12).

Subsequently, as illustrated in FIG. 19, by thinning the semiconductor substrate 101 from the back surface, the second trench T2 is made to penetrate so that the light-shielding film 111 in the second trench T2 reaches the back surface of the semiconductor substrate 101. To thin the semiconductor substrate 101, chemical mechanical polishing (CMP) or the like may be used.

Figure 20:
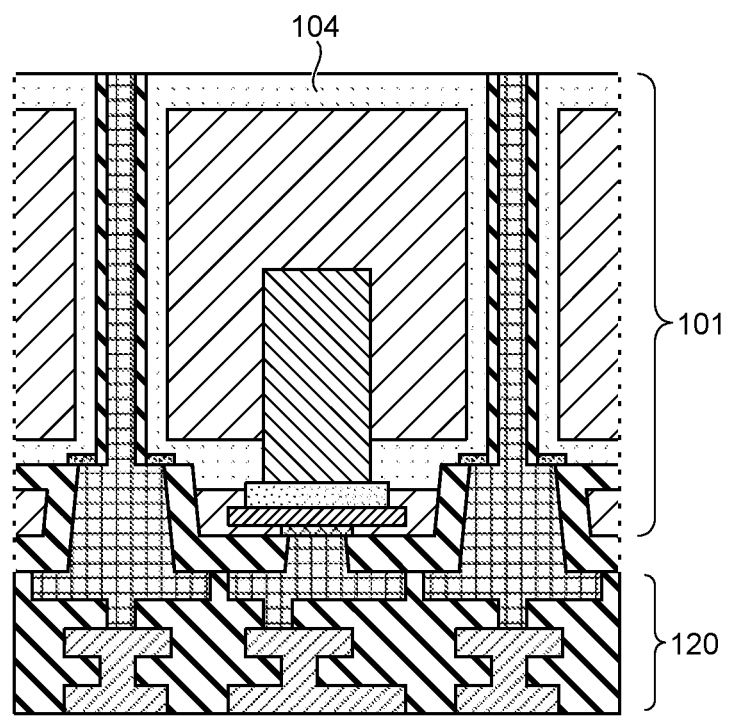
FIG. 20 is a process cross-sectional view illustrating the method for manufacturing the solid-state image sensor according to the first embodiment (Process 13).

Subsequently, acceptors are ion-implanted into the entire back surface of the semiconductor substrate 101. As a result, as illustrated in FIG. 20, the P-type semiconductor region 104 surrounding the photoelectric conversion region 102 is completed.

Thereafter, by sequentially forming the pinning layer 113, the planarizing film 114, the color filter 115, and the on-chip lens 116 on the back surface of the semiconductor substrate 101, the light receiving chip 71 in the image sensor 10 is formed. Then, by attaching the separately prepared circuit chip 72 and the light receiving chip 71 to each other, the image sensor 10 having a cross-sectional structure as illustrated in FIG. 6 is manufactured.

1.10 Effects

As described above, in the present embodiment, the position of the anode contact 108 and the position of the cathode contact 107 and/or the N+-type semiconductor region 106 are displaced in the height direction. Consequently, according to the present embodiment, the distance from the anode contact 108 to the cathode contact 107 and/or the N+-type semiconductor region 106 can be extended without enlarging the size of the SPAD pixel 20 in the lateral direction (direction parallel to the incident surface). As a result, since generation of a tunnel effect can be suppressed without enlarging the pixel size, avalanche amplification can be generated in a stable manner while suppressing a decrease in resolution.

1.11 Modification Examples

Next, several specific modification examples of the SPAD pixel 20 according to the first embodiment will be described.

1.11.1 First Modification Example

Figure 21:
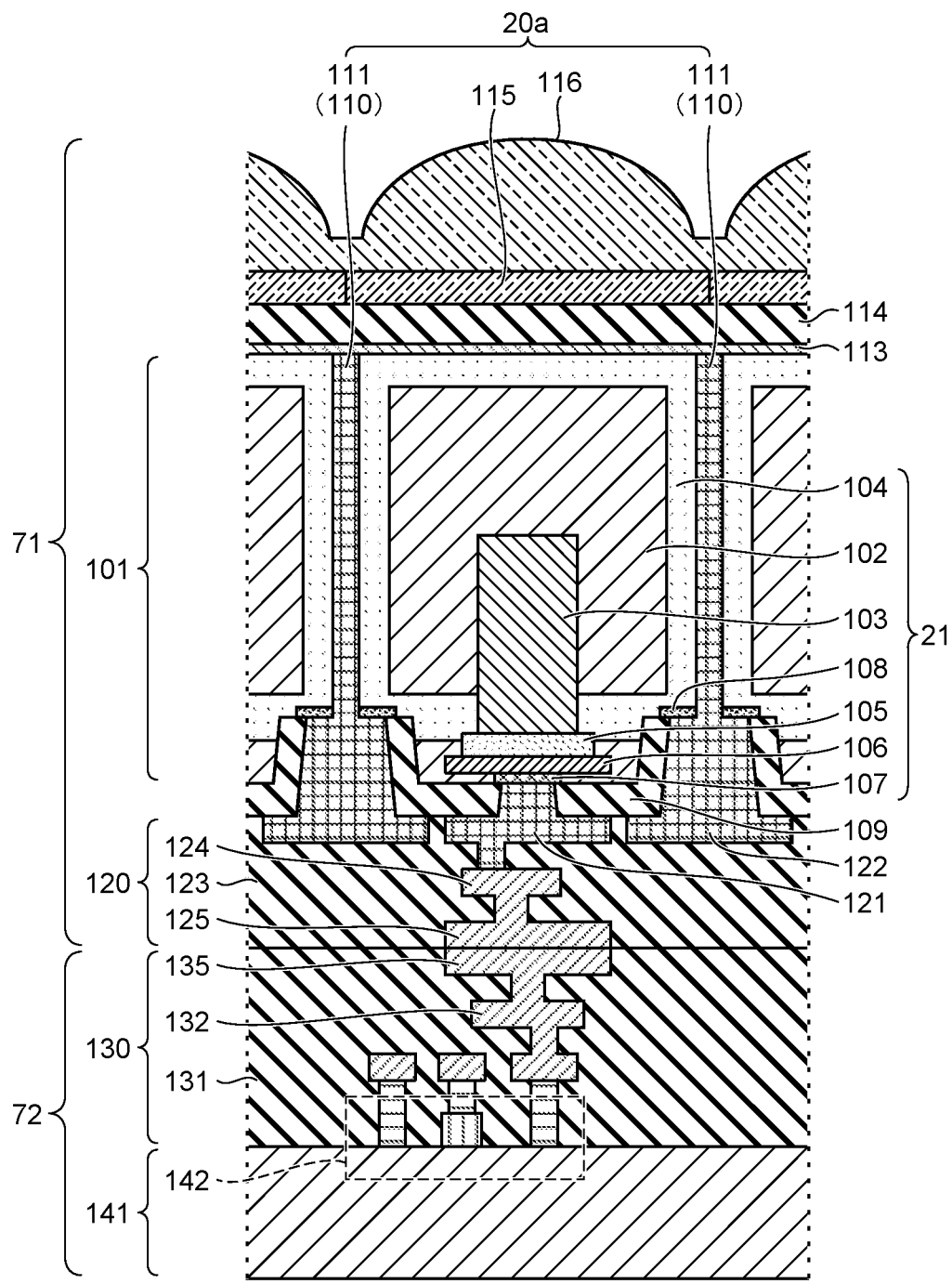
FIG. 21 is a vertical cross-sectional view illustrating an example of a cross-sectional structure of a surface of a SPAD pixel according to a first modification example of the first embodiment perpendicular to the light incident surface.

FIG. 21 is a vertical cross-sectional view illustrating an example of a cross-sectional structure of a surface of a SPAD pixel according to the first modification example perpendicular to the light incident surface.

As illustrated in FIG. 21, in a SPAD pixel 20a according to the first modification example, the insulating film 112 (corresponding to the insulating film 109B) in the second trench (corresponding to the second trench T2) is omitted in a similar structure to the cross-sectional structure described with reference to FIG. 6 and the like in the first embodiment.

As mentioned in the first embodiment, by omitting the insulating film 112 in the element separation unit 110 in this manner, the anode electrode 122 and the P-type semiconductor region 104 can be brought into contact with each other in the second trench as well as in the anode contact 108, which enables a contact with low resistance to be achieved.

1.11.2 Second Modification Example

Figure 22:
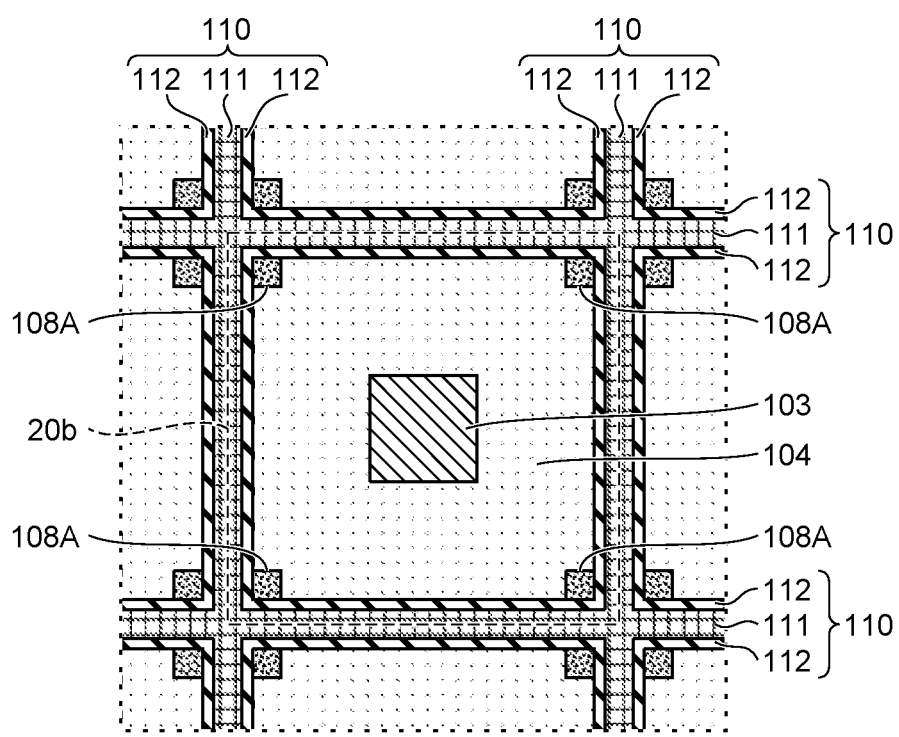
FIG. 22 is a horizontal cross-sectional view illustrating an example of a cross-sectional structure of a surface of a SPAD pixel according to a second modification example of the first embodiment parallel to the light incident surface.

FIG. 22 is a horizontal cross-sectional view illustrating an example of a cross-sectional structure of a surface of a SPAD pixel according to a second modification example parallel to the light incident surface. Note that FIG. 22 illustrates a surface corresponding to that in FIG. 7.

As illustrated in FIG. 22, in a SPAD pixel 20b according to the second modification example, the formation region of an anode contact 108A is limited so that the anode contact 108A comes in contact with a part of the outer periphery of the P-type semiconductor region 104 in a similar structure to the cross-sectional structure described with reference to FIG. 7 and the like in the first embodiment. In a specific example, the formation region of the anode contact 108A is limited to the four corners of the rectangular region partitioned by the element separation unit 110.

As mentioned in the first embodiment, by limiting the formation region of the anode contact 108A in this manner, the contact portion between the anode contact 108 and the anode electrode 122 can be adjusted, and the distribution of the electric field formed in the photoelectric conversion region 102 can thus be controlled.

1.11.3 Third Modification Example

Figure 23:
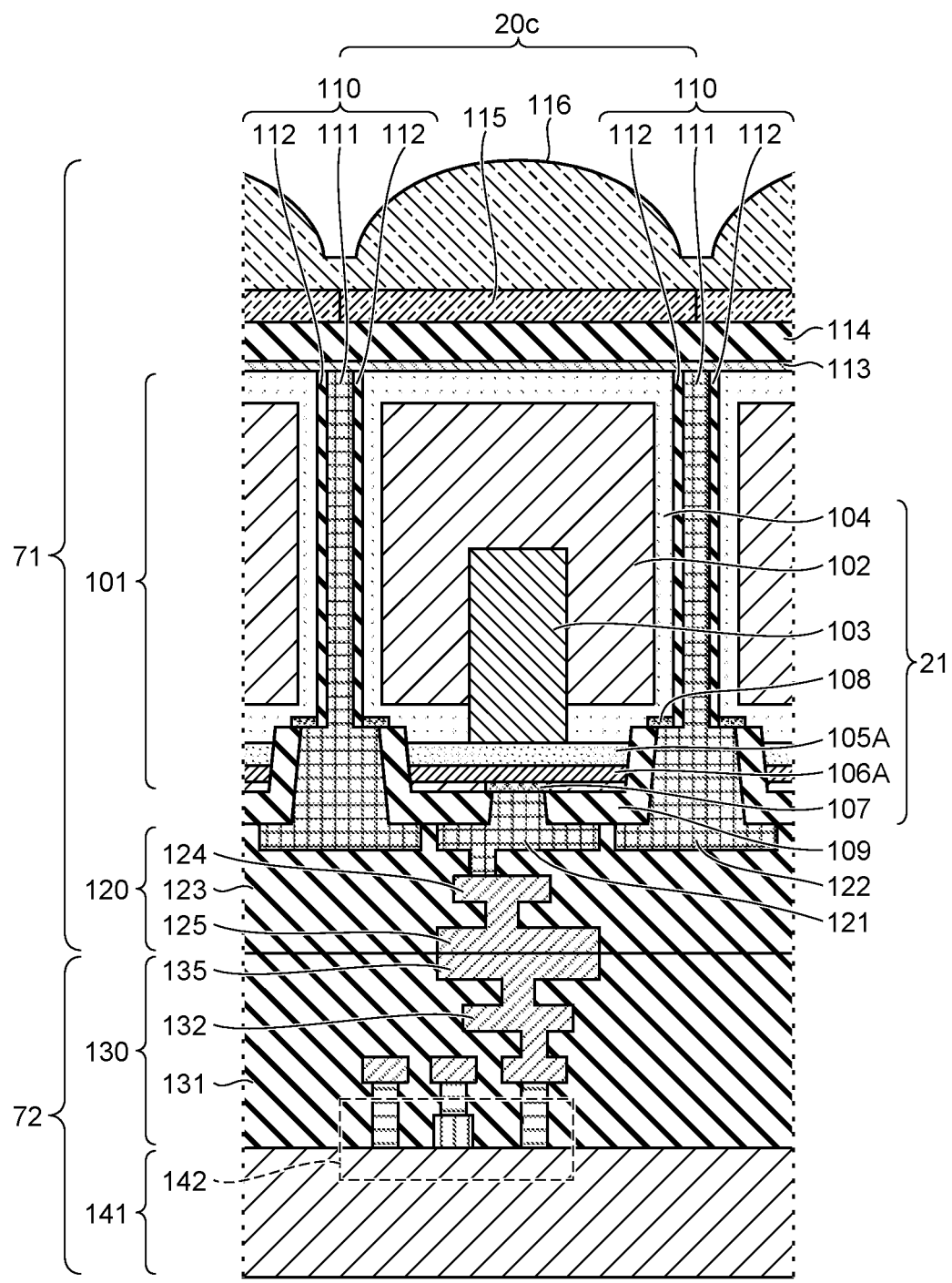
FIG. 23 is a vertical cross-sectional view illustrating an example of a cross-sectional structure of a surface of a SPAD pixel according to a third modification example of the first embodiment perpendicular to the light incident surface.

FIG. 23 is a vertical cross-sectional view illustrating an example of a cross-sectional structure of a surface of a SPAD pixel according to a third modification example perpendicular to the light incident surface.

As illustrated in FIG. 23, in a SPAD pixel 20c according to the third modification example, a P+-type semiconductor region 105A and an N+-type semiconductor region 106A extend to contact the insulating film 109 formed in the first trench in a similar structure to the cross-sectional structure described with reference to FIG. 6 and the like in the first embodiment.

By extending the P+-type semiconductor region 105A and the N+-type semiconductor region 106A in the entire region interposed between the first trenches in this manner, the region to generate avalanche amplification can be extended, and the quantum efficiency can thus be improved.

Also, by extending the P+-type semiconductor region 105A in the entire region interposed between the first trenches, charges generated in the vicinity of the anode contact 108 can be prevented from directly flowing into the N+-type semiconductor region 106A or the cathode contact 107. Thus, the amount of charges that do not contribute to avalanche amplification can be reduced, and the quantum efficiency can be improved.

1.11.4 Fourth Modification Example

Figure 24:
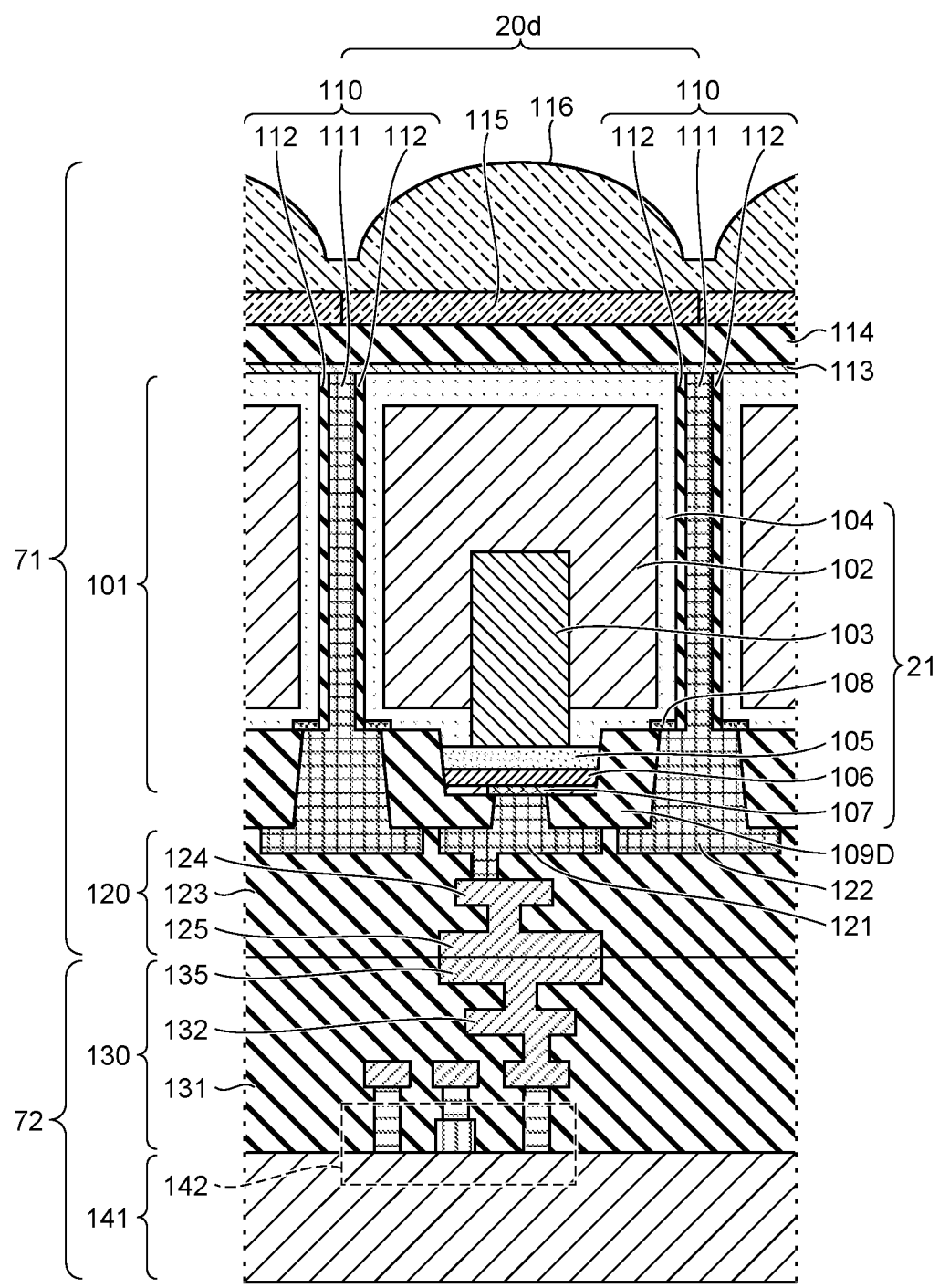
FIG. 24 is a vertical cross-sectional view illustrating an example of a cross-sectional structure of a surface of a SPAD pixel according to a fourth modification example of the first embodiment perpendicular to the light incident surface.

FIG. 24 is a vertical cross-sectional view illustrating an example of a cross-sectional structure of a surface of a SPAD pixel according to a fourth modification example perpendicular to the light incident surface.

As illustrated in FIG. 24, in a SPAD pixel 20d according to the fourth modification example, by extending the first trench, an insulating film 109D in the first trench is widened to the extent that it is in contact with at least the P+-type semiconductor region 105A in a similar structure to the cross-sectional structure described with reference to FIG. 6 and the like in the first embodiment.

By extending the first trench to bring the insulating film 109D into contact with the P+-type semiconductor region 105A in this manner, charges generated in the vicinity of the anode contact 108 can be prevented from directly flowing into the N+-type semiconductor region 106A or the cathode contact 107. Thus, the amount of charges that do not contribute to avalanche amplification can be reduced, and the quantum efficiency can be improved.

1.11.5 Fifth Modification Example

In a fifth modification example, several examples of the interconnection to the anode in the above-described embodiment and the modification examples thereof will be given. Note that, in the following description, for the sake of simplification, a case based on the first embodiment will be illustrated.

Figure 25:
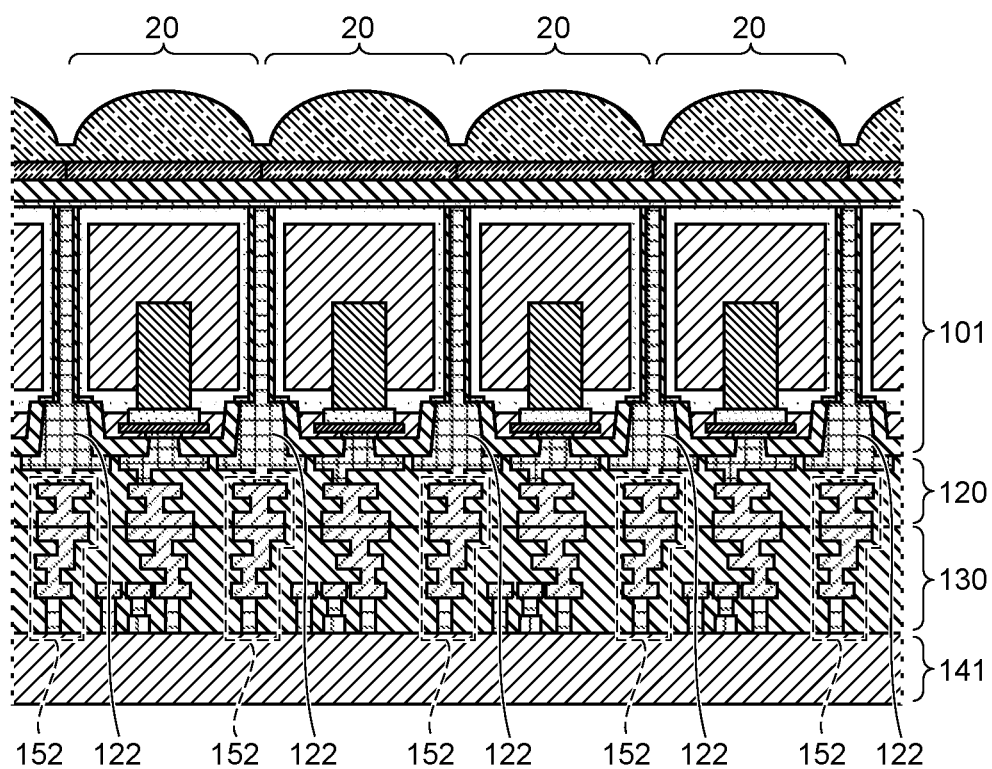
FIG. 25 is a diagram illustrating an example of interconnection to an anode according to the first embodiment.

FIG. 25 is a diagram illustrating an example of the interconnection to the anode according to the first embodiment. As illustrated in FIG. 25, in the first embodiment, an interconnect 152 for applying a reverse bias voltage V_SPAD is connected to the anode electrode 122 of each SPAD pixel 20 on a one-to-one basis.

However, for example, as can be seen with reference to FIG. 7, the anode electrodes 122 are continuous among the plurality of SPAD pixels 20. For example, all the SPAD pixels 20 arranged in the SPAD array unit 11 are electrically connected.

Therefore, it is not essential to provide the interconnect 152 to the anode electrode 122 of each SPAD pixel 20 on a one-to-one basis.

Figure 26:
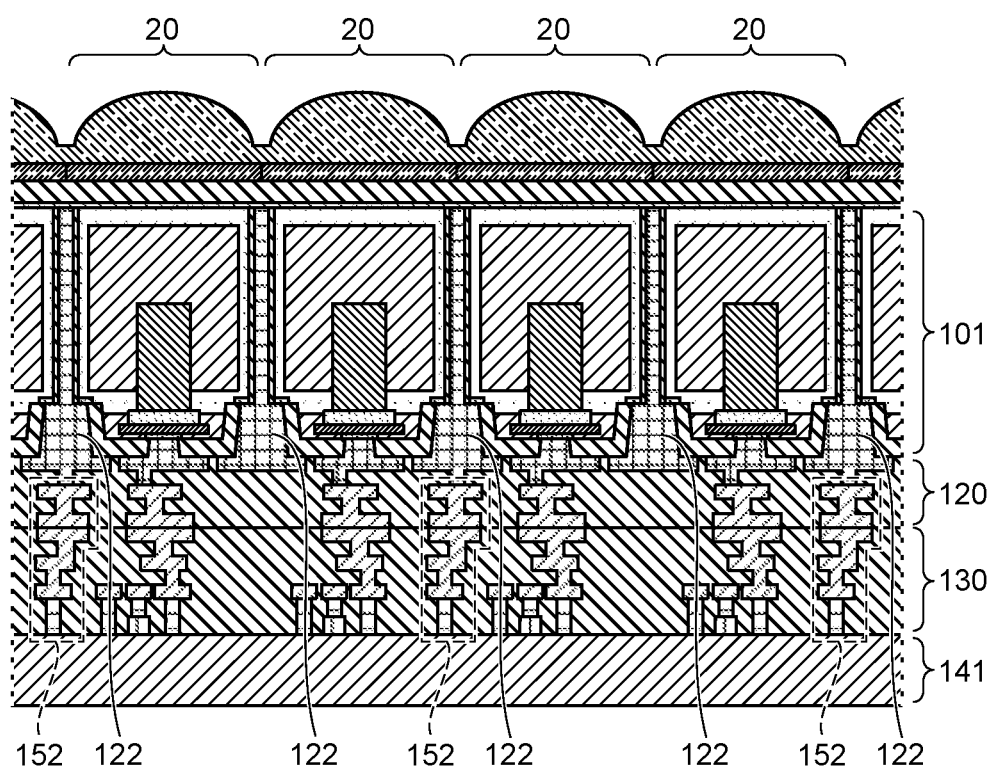
FIG. 26 is a diagram illustrating an example of interconnection to the anode according to a fifth modification example of the first embodiment.
Figure 27:
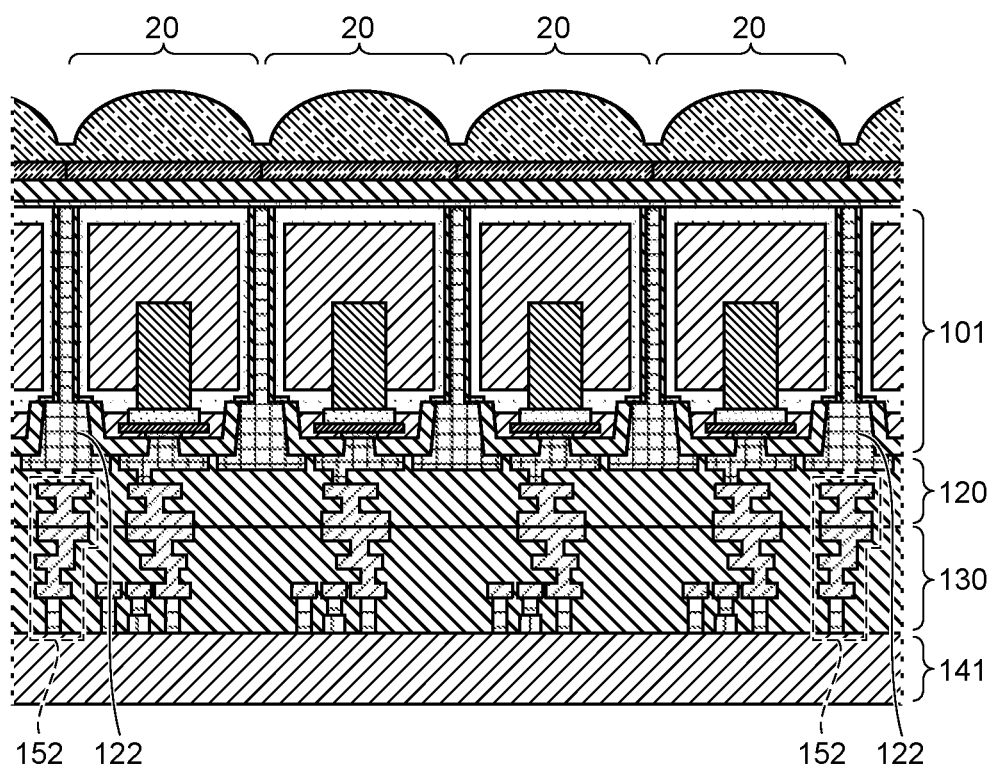
FIG. 27 is a diagram illustrating another example of interconnection to the anode according to the fifth modification example of the first embodiment.

The number of the interconnects 152 can be reduced by providing the interconnect 152 to every other SPAD pixel 20 as illustrated in FIG. 26 or providing the interconnect 152 to every third SPAD pixel 20 as illustrated in FIG. 27, for example.

Figure 28:
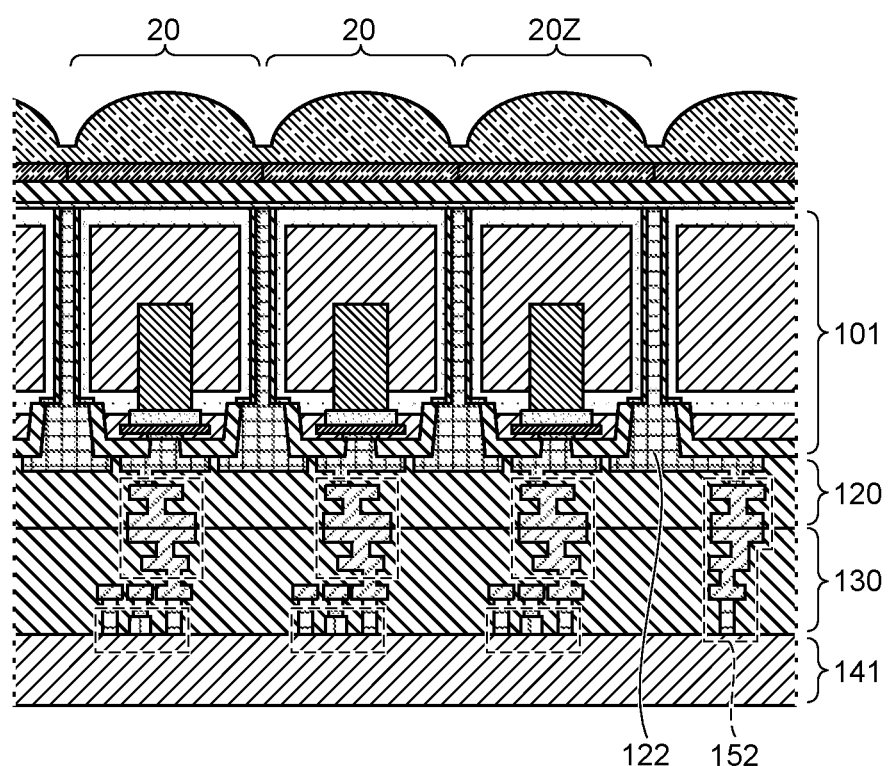
FIG. 28 is a diagram illustrating still another example of interconnection to the anode according to the fifth modification example of the first embodiment.

Alternatively, as illustrated in FIG. 28, a configuration is available in which the interconnect 152 is provided for at least one of SPAD pixels 20Z located on the outermost periphery of the SPAD array unit 11, and in which no interconnects 152 are provided for the other SPAD pixels 20 and 20Z.

By reducing the number of the interconnects 152 in this manner, the interconnect pattern can be simplified, which enables simplification of the manufacturing process and reduction of the manufacturing cost to be achieved.

Note that, although the case in which the cathode is N-type while the anode is P-type has been illustrated in the above-described embodiment and the modification examples thereof, the combination is not limited to this and can be modified in various ways such as a case where the cathode is P-type while the anode is N-type.

2. SECOND EMBODIMENT

Next, a solid-state image sensor and an electronic device according to a second embodiment will be described in detail with reference to the drawings.

The SPAD pixels 20, 20a, 20b, 20c, and 20d according to the above-described first embodiment and the modification examples thereof can be used not only for the electronic device 1 serving as an image capturing device that acquires image data such as a color image but also for an electronic device serving as a distance measuring device that measures a distance to an object, for example.

Figure 29:
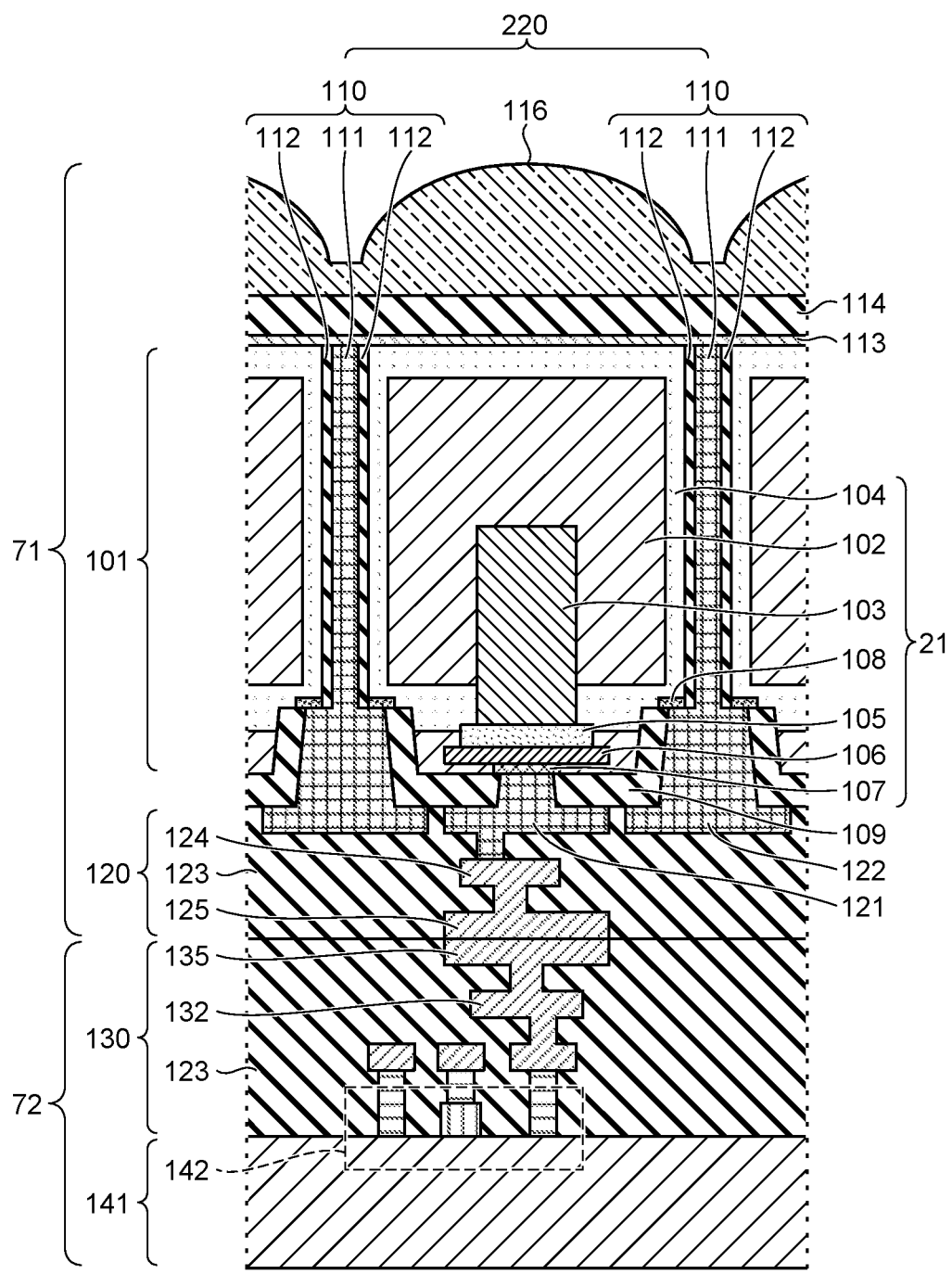
FIG. 29 is a vertical cross-sectional view illustrating an example of a cross-sectional structure of a surface of a SPAD pixel according to a second embodiment perpendicular to the light incident surface.

FIG. 29 is a vertical cross-sectional view illustrating an example of a cross-sectional structure of a surface of a SPAD pixel according to the second embodiment perpendicular to the light incident surface. As illustrated in FIG. 29, a SPAD pixel 220 has a structure in which the color filter 115 is omitted in a similar structure to the cross-sectional structure described with reference to FIG. 6 and the like in the first embodiment.

Even in such a case where the SPAD pixel 220 is used for the electronic device serving as the distance measuring device, as well as in the first embodiment, since the position of the anode contact 108 and the positions of the cathode contact 107 and/or the N+-type semiconductor region 106 are displaced from each other in the height direction, the distance from the anode contact 108 to the cathode contact 107 and/or the N+-type semiconductor region 106 can be extended without enlarging the size of the SPAD pixel 220 in the lateral direction (direction parallel to the incident surface). As a result, since generation of a tunnel effect can be suppressed without enlarging the pixel size, avalanche amplification can be generated in a stable manner while suppressing a decrease in resolution.

Since other configurations, operations, and effects may be the same as those of the above-described embodiment or the modification examples thereof, detailed description thereof will be omitted here.

3. THIRD EMBODIMENT

Next, a solid-state image sensor and an electronic device according to a third embodiment will be described in detail with reference to the drawings.

In the above-described embodiment and the modification examples thereof, although the FFTI type element separation unit 110 in which the second trench penetrates the semiconductor substrate 101 from the front surface side to the back surface side is exemplified, the element separation unit 110 is not limited to one of the FFTI type as described above.

Figure 30:
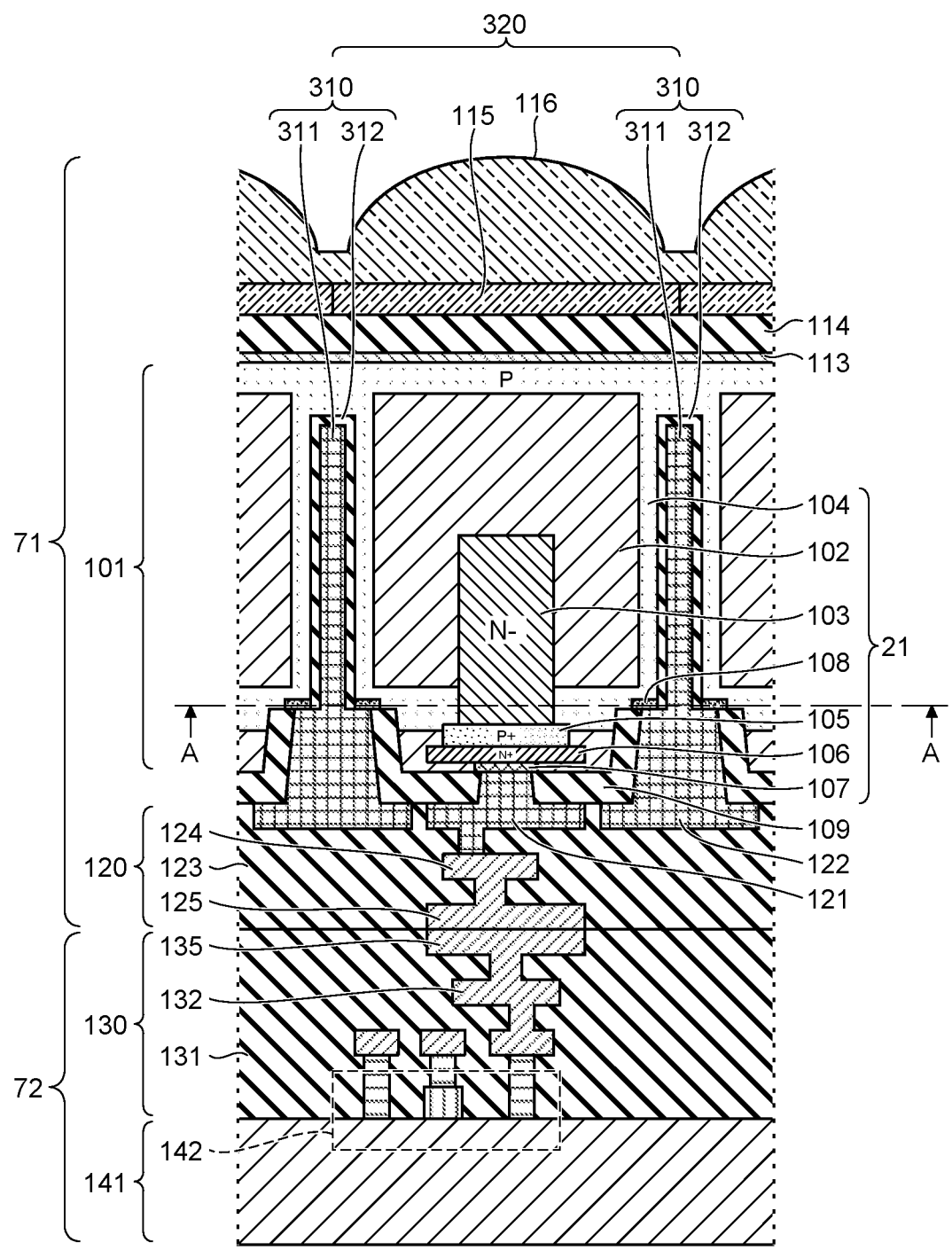
FIG. 30 is a vertical cross-sectional view illustrating an example of a cross-sectional structure of a surface of a SPAD pixel according to a third embodiment perpendicular to the light incident surface.

FIG. 30 is a vertical cross-sectional view illustrating an example of a cross-sectional structure of a surface of a SPAD pixel according to the third embodiment perpendicular to the light incident surface. As illustrated in FIG. 30, a SPAD pixel 320 has a structure in which the FFTI type element separation unit 110 is replaced with a DTI type element separation unit 310 in a similar structure to the cross-sectional structure described with reference to FIG. 6 and the like in the first embodiment.

The DTI type element separation unit 310 includes, in the second trench formed so as not to reach the back surface from the front surface side (lower surface side in the drawing) of the semiconductor substrate 101, an insulating film 312 covering the inner side surface and the bottom surface of the second trench and a light-shielding film 311 with which the inside of the second trench whose inner surface is covered with the insulating film 312 is filled.

Such an element separation unit 310 can be achieved, for example, by forming the shallow second trench or by using the thick semiconductor substrate 101.

In this manner, according to the present embodiment, the DTI type element separation unit 310 formed from the front surface side of the semiconductor substrate 101 is used. This can facilitate the process of thinning the semiconductor substrate 101 from the back surface side.

Further, by using the DTI type element separation unit 310 formed from the front surface side of the semiconductor substrate 101, the P-type semiconductor region 104 is not separated for each SPAD pixel 320 on the back surface side of the semiconductor substrate 101. As a result, the variation in how the electric field is distributed in each SPAD pixel 320 due to the variation in the contact resistance between the P-type semiconductor region 104 and the anode contact 108 is suppressed, and the electric field in each SPAD pixel 320 is leveled. Therefore, the yield of the image sensor 10 can be improved.

Since other configurations, operations, and effects may be the same as those of the above-described embodiment or the modification examples thereof, detailed description thereof will be omitted here.

4. FOURTH EMBODIMENT

Next, a solid-state image sensor and an electronic device according to a fourth embodiment will be described in detail with reference to the drawings.

Figure 31:
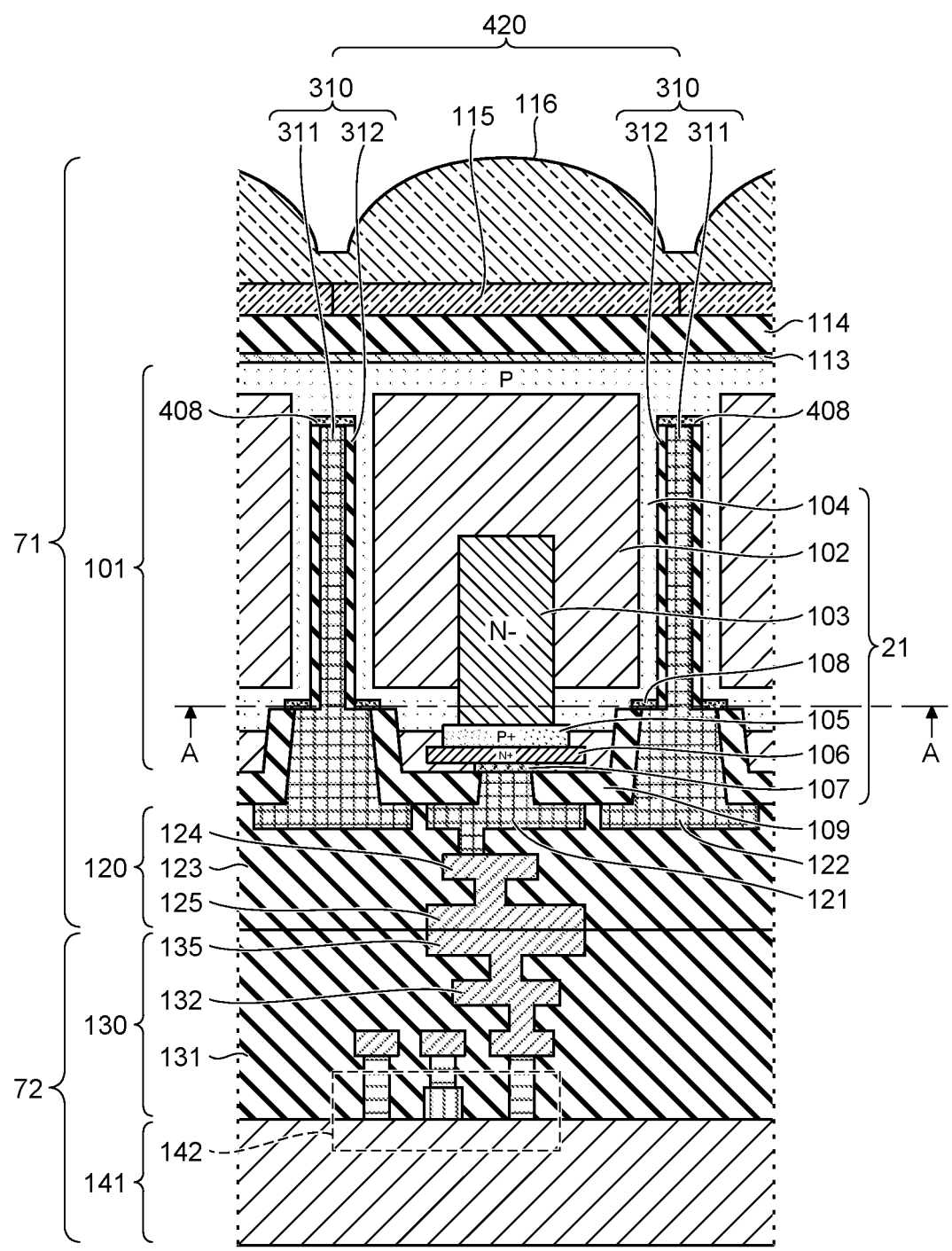
FIG. 31 is a vertical cross-sectional view illustrating an example of a cross-sectional structure of a surface of a SPAD pixel according to a fourth embodiment perpendicular to the light incident surface.

FIG. 31 is a vertical cross-sectional view illustrating an example of a cross-sectional structure of a surface of a SPAD pixel according to the fourth embodiment perpendicular to the light incident surface. As illustrated in FIG. 31, a SPAD pixel 420 has, for example, a structure in which an anode contact 408 is provided at the bottom portion of the second trench in a similar structure to the SPAD pixel 320 described with reference to FIG. 30 in the third embodiment.

According to such a structure, the light-shielding film 311 electrically connected to the anode electrode 122 is electrically connected to the P-type semiconductor region 104 on the back surface side of the semiconductor substrate 101 via the anode contact 408 at the bottom portion of the second trench. As a result, since the contact resistance between the P-type semiconductor region 104 and the anode contact 108 can further be reduced, and the variation in the contact resistance can be suppressed, the variation in how the electric field is distributed in each SPAD pixel 320 can further be suppressed. As a result, since the electric field in each SPAD pixel 320 is further leveled, the yield of the image sensor 10 can further be improved.

Since other configurations, operations, and effects may be the same as those of the above-described embodiment or the modification examples thereof, detailed description thereof will be omitted here.

5. FIFTH EMBODIMENT

Next, a solid-state image sensor and an electronic device according to a fifth embodiment will be described in detail with reference to the drawings.

In the third and fourth embodiments described above, the DTI type element separation unit 310 provided in the second trench formed from the front surface side of the semiconductor substrate 101 has been exemplified. On the other hand, in the fifth embodiment, an RDTI type element separation unit provided in the second trench formed from the back surface side of the semiconductor substrate 101 is exemplified.

Figure 32:
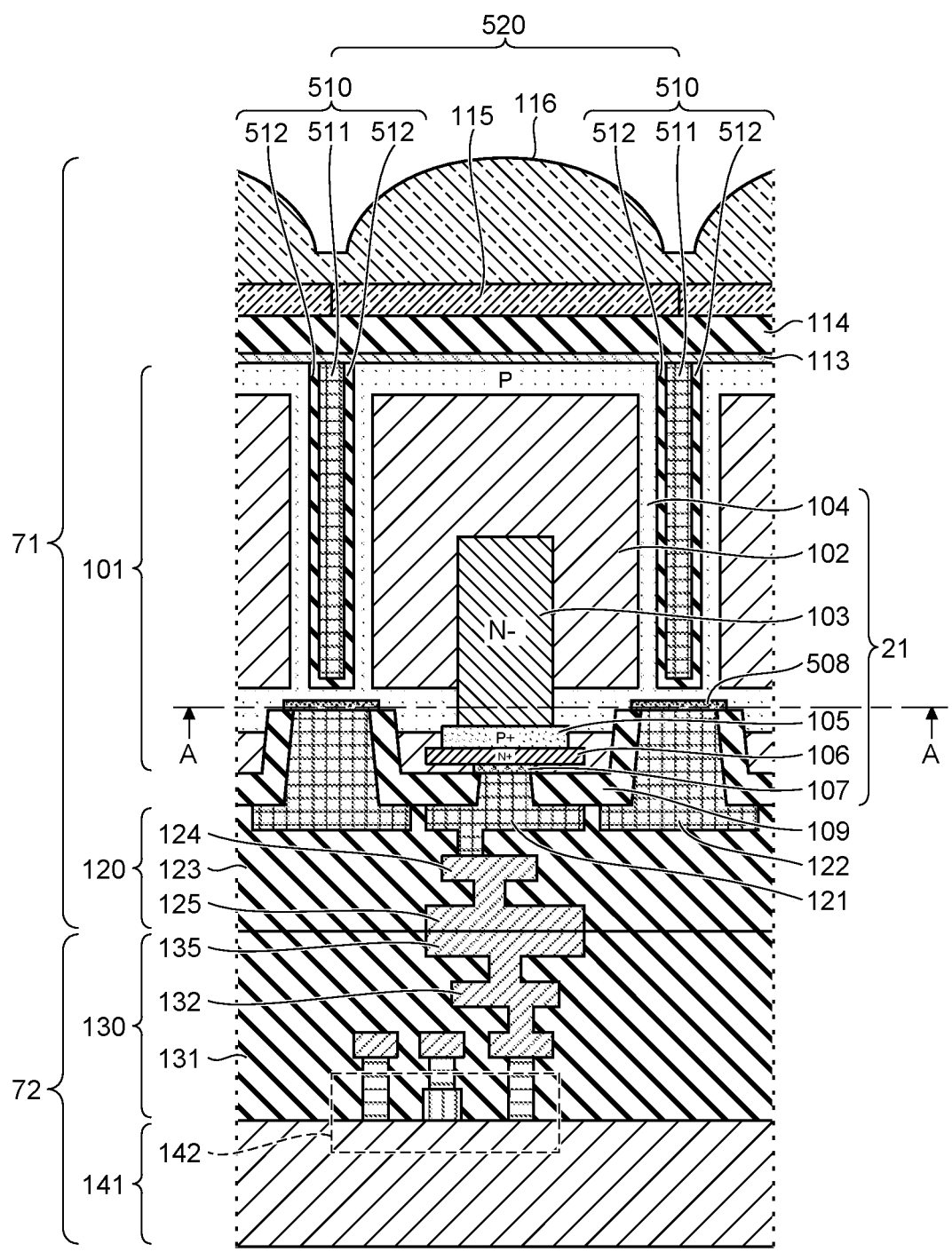
FIG. 32 is a vertical cross-sectional view illustrating an example of a cross-sectional structure of a surface of a SPAD pixel according to a fifth embodiment perpendicular to the light incident surface.

FIG. 32 is a vertical cross-sectional view illustrating an example of a cross-sectional structure of a surface of a SPAD pixel according to the fifth embodiment perpendicular to the light incident surface. As illustrated in FIG. 32, a SPAD pixel 520 has, for example, a structure in which the FFTI type element separation unit 110 is replaced with an RDTI type element separation unit 510, and in which the anode contact 108 is replaced with an anode contact 508 in a similar structure to the cross-sectional structure described with reference to FIG. 30 in the third embodiment.

The RDTI type element separation unit 510 includes, in the second trench formed so as not to reach the front surface from the back surface side (upper surface side in the drawing) of the semiconductor substrate 101, an insulating film 512 covering the inner side surface and the bottom surface of the second trench and a light-shielding film 511 with which the inside of the second trench whose inner surface is covered with the insulating film 512 is filled.

According to such a structure, since the anode electrode 122 and the element separation unit 520 are separated, it is possible to form the anode contact 508 on the entire back surface of the anode electrode 122. As a result, since the contact resistance between the P-type semiconductor region 104 and the anode contact 108 can further be reduced, the SPAD pixel 520 with better characteristics can be achieved.

Also, since the second trench can be formed from the back surface side of the semiconductor substrate 101, the process for forming the element separation unit 520 can be simplified further than in the case of forming the DTI type element separation unit 310 according to the third or fourth embodiment.

Since other configurations, operations, and effects may be the same as those of the above-described embodiment or the modification examples thereof, detailed description thereof will be omitted here.

6. SIXTH EMBODIMENT

Next, a solid-state image sensor and an electronic device according to a sixth embodiment will be described in detail with reference to the drawings.

In the above-described embodiment and the modification examples thereof, for example, a case where one photodiode 21 is provided for each of the color filters 115R, 115G, and 115B constituting the color filter array 60 of the Bayer array is illustrated. However, in a case of performing photon counting using an avalanche photodiode, even when a plurality of photons are incident on one photodiode 21 during one avalanche amplification, the incidents of the photons are counted as one time. Therefore, in order to count the number of incident photons more accurately, it is preferable to reduce the area occupied by each photodiode. Also, in a case where the illuminance is high, the dynamic range of each SPAD pixel 20 can be expanded by reducing the area occupied by each photodiode.

Figure 33:
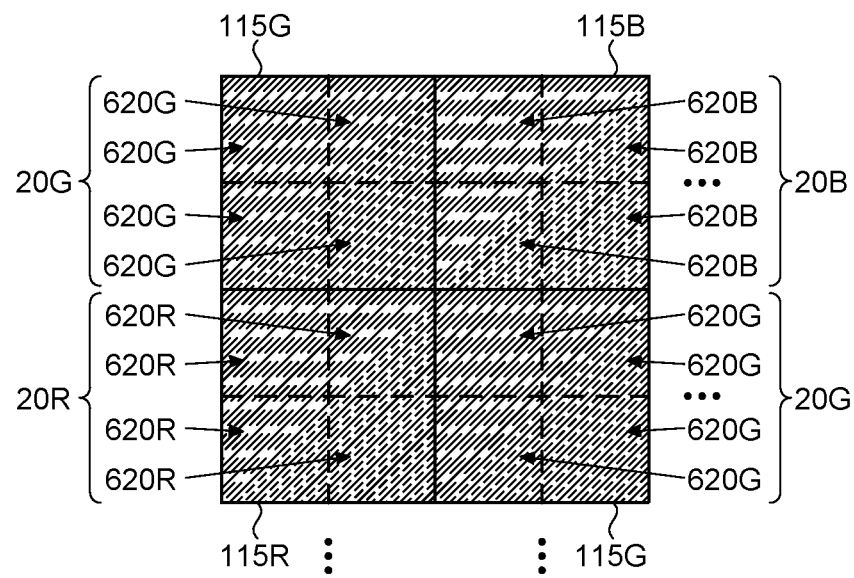
FIG. 33 is a plan view illustrating an example of a plan layout of SPAF pixels according to a sixth embodiment.

Under such circumstances, in the sixth embodiment, as illustrated in FIG. 33, each of SPAD pixels 20R, 20G, and 20B (hereinbelow, in a case where the SPAD pixels 20R, 20G, and 20B are not distinguished, the reference sign is 20) is divided into a plurality (four sets of 2×2 pixels in the present example) of SPAD pixels 620R, 620G, or 620B (hereinbelow, in a case where the SPAD pixels 620R, 620G, and 620B are not distinguished, the reference sign is 620). In other words, the plurality of SPAD pixels 620, 620G, or 620B share one color filter 115R, 115G, or 115B.

By dividing one SPAD pixel 20 into the plurality of SPAD pixels 620 in this manner, the area of each SPAD pixel 620 can be reduced, and the number of incident photons can thus be counted more accurately. Moreover, since the area occupied by each photodiode is reduced, the dynamic range of each SPAD pixel 20 can be expanded.

Figure 34:
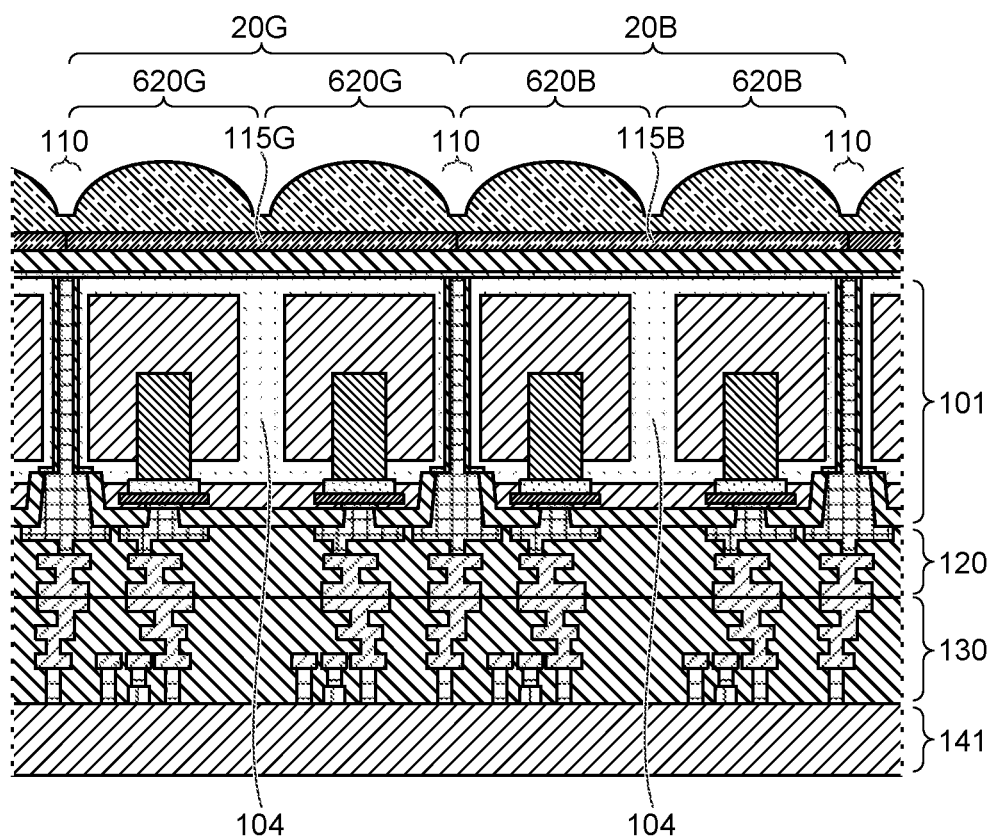
FIG. 34 is a vertical cross-sectional view illustrating an example of a cross-sectional structure of a surface of a SPAD pixel according to a sixth embodiment perpendicular to the light incident surface.

Note that, as illustrated in FIG. 34, the element separation unit 110 does not needed to be provided between the SPAD pixels 620 obtained by dividing one SPAD pixel 20. In this case, the P-type semiconductor region 104 may be arranged between the SPAD pixels 620 instead of the element separation unit 110. As a result, since the pixel pitch can be reduced as compared with the case where the element separation unit 110 is provided, the size of the image sensor 10 can further be reduced.

Since other configurations, operations, and effects may be the same as those of the above-described embodiment or the modification examples thereof, detailed description thereof will be omitted here.

7. SEVENTH EMBODIMENT

Next, a solid-state image sensor and an electronic device according to a seventh embodiment will be described in detail with reference to the drawings.

In the sixth embodiment described above, the case where the P-type semiconductor region 104 is arranged between the plurality of SPAD pixels 620 into which one SPAD pixel 20 is divided has been illustrated, but the structure is not limited to this.

Figure 35:
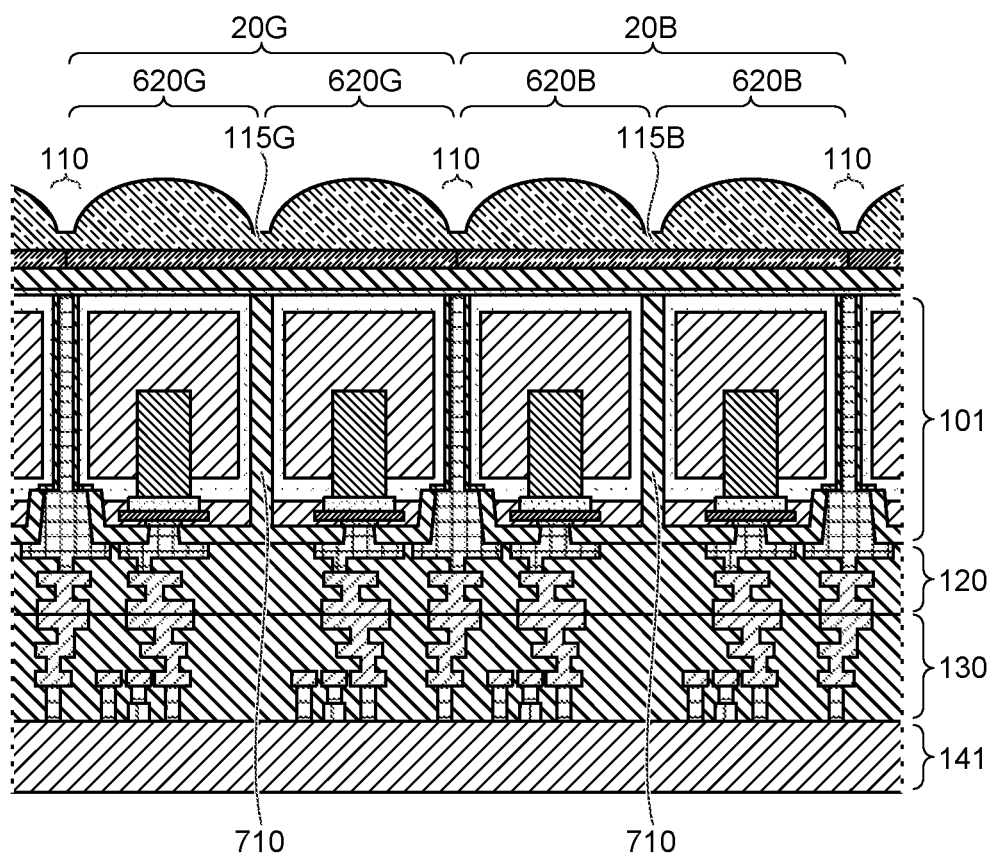
FIG. 35 is a vertical cross-sectional view illustrating an example of a cross-sectional structure of a surface of a SPAD pixel according to a seventh embodiment perpendicular to the light incident surface.

For example, as illustrated in FIG. 35, a trench can be provided between the adjacent SPAD pixels 620, and the inside of the trench can be filled with an insulating film 710.

According to such a structure, since it is possible to suppress the crosstalk of light between the adjacent SPAD pixels 620, the number of incident photons can be counted more accurately.

Since other configurations, operations, and effects may be the same as those of the above-described embodiment or the modification examples thereof, detailed description thereof will be omitted here.

8. EIGHTH EMBODIMENT

Next, a solid-state image sensor and an electronic device according to an eighth embodiment will be described in detail with reference to the drawings.

Figure 36:
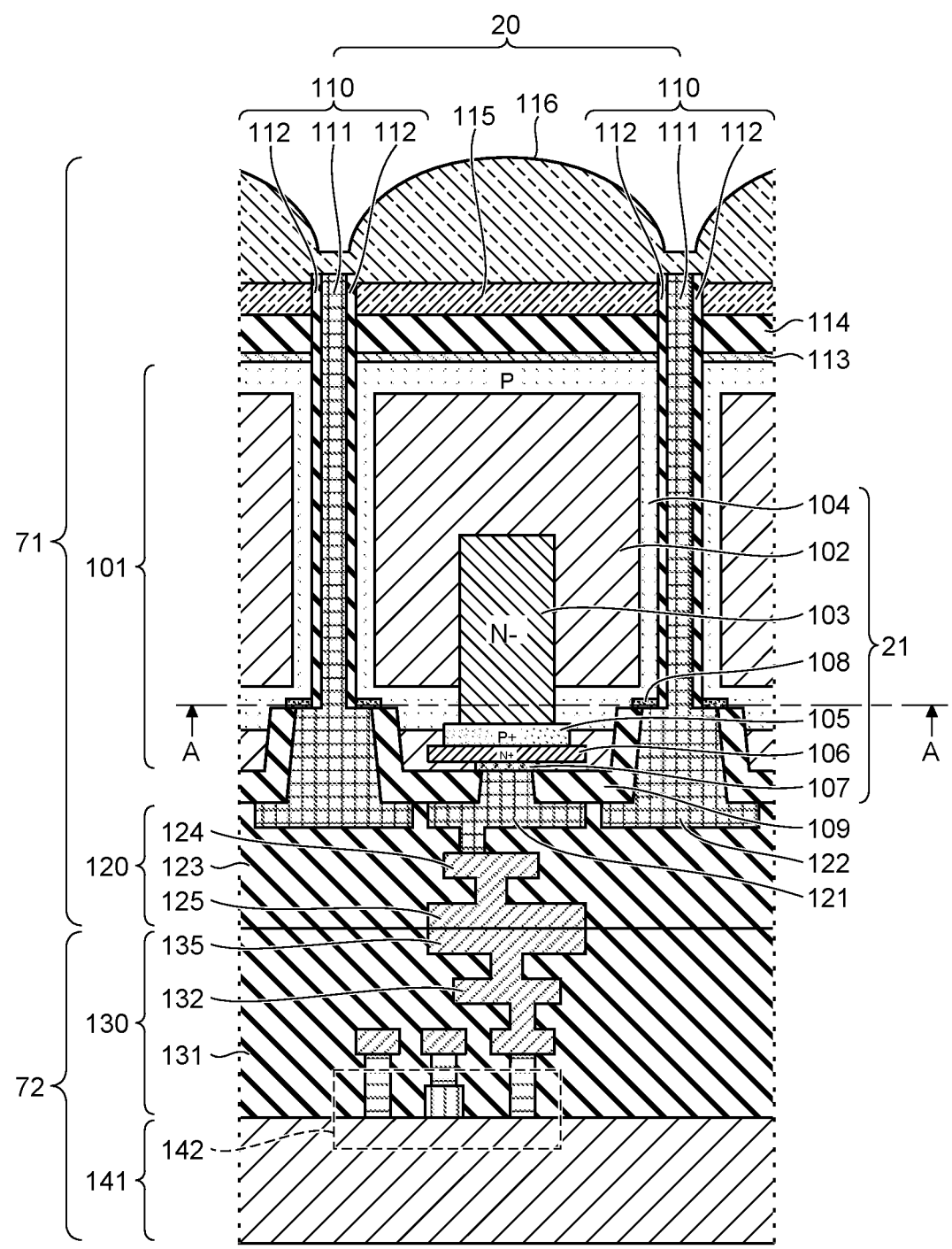
FIG. 36 is a vertical cross-sectional view illustrating an example of a cross-sectional structure of a surface of a SPAD pixel according to an eighth embodiment perpendicular to the light incident surface.

As illustrated in FIG. 36, the element separation units 110 and 510 in the above-described embodiments and the modification examples thereof may penetrate to go over the color filter 115, for example, instead of staying inside the semiconductor substrate 101.

By employing the structure in which the element separation unit 110 penetrates the color filter 115 and protrudes above the color filter 115, it is possible to reduce the crosstalk between the adjacent SPAD pixels 20.

Since other configurations, operations, and effects may be the same as those of the above-described embodiment or the modification examples thereof, detailed description thereof will be omitted here.

9. NINTH EMBODIMENT

Next, a solid-state image sensor and an electronic device according to a ninth embodiment will be described in detail with reference to the drawings.

In the above-described embodiments and the modification examples thereof, for example, the anode contact 108 is provided at the step portion between the first trench T1 and the second trench T2. In the ninth embodiment, a configuration for increasing the contact area between the anode contact and the anode electrode in such a structure will be described.

9.1 Example of Cross-Sectional Structure of SPAD Pixel

Figure 37:
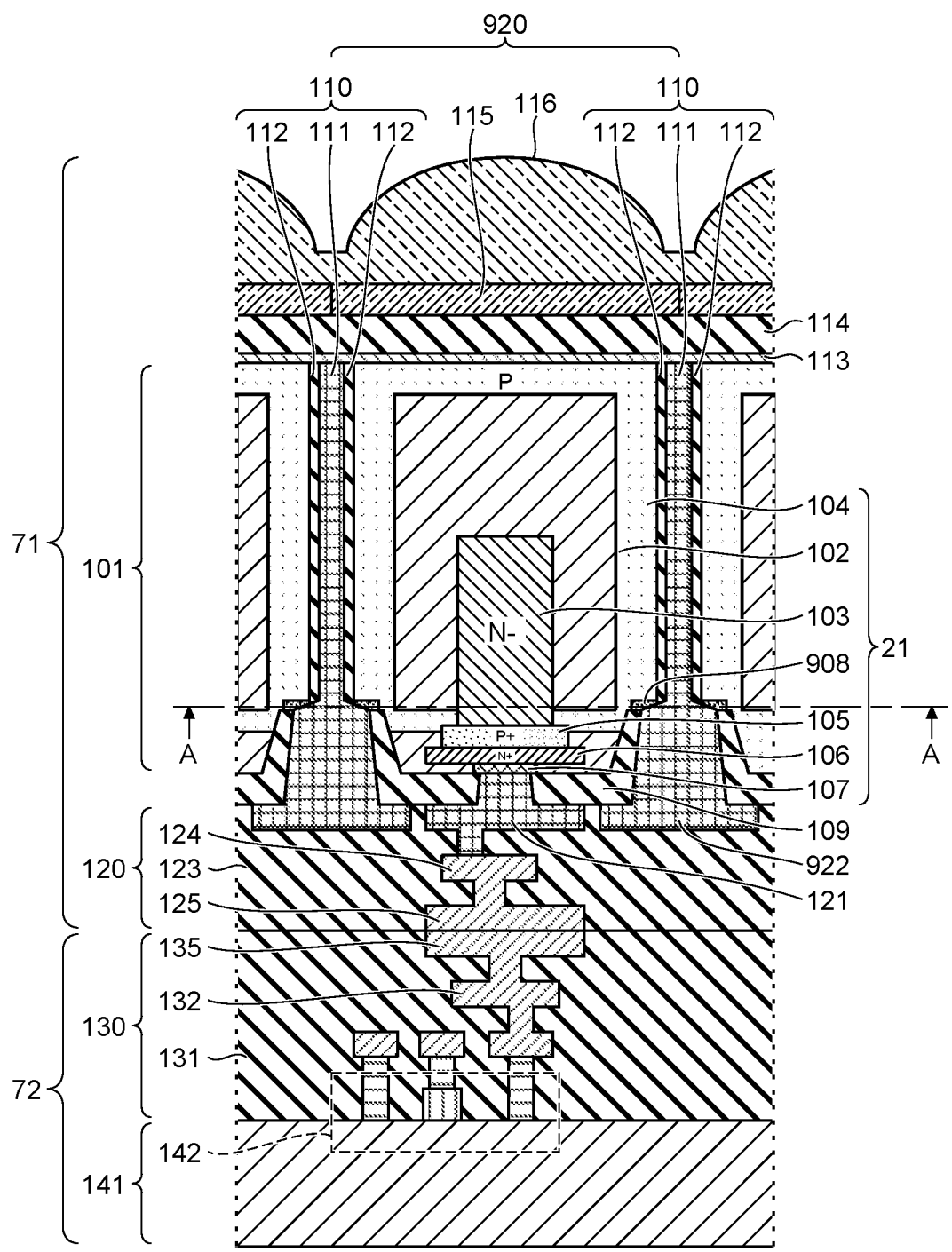
FIG. 37 is a vertical cross-sectional view illustrating an example of a cross-sectional structure of a surface of a SPAD pixel according to a ninth embodiment perpendicular to the light incident surface.
Figure 38:
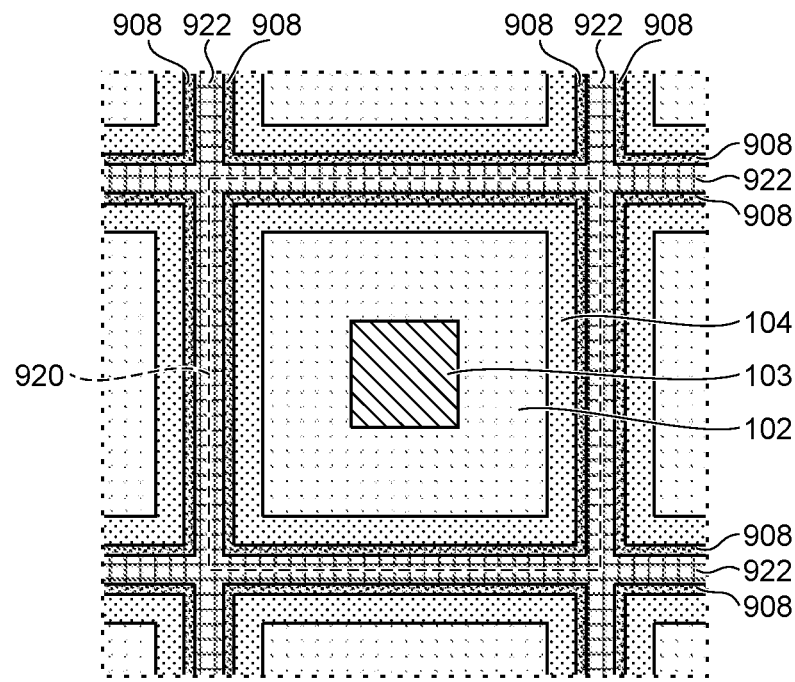
FIG. 38 is a horizontal cross-sectional view illustrating an example of a cross-sectional structure of the plane A-A in FIG. 37.

FIG. 37 is a vertical cross-sectional view illustrating an example of a cross-sectional structure of a surface of a SPAD pixel according to the ninth embodiment perpendicular to the light incident surface. FIG. 38 is a horizontal cross-sectional view illustrating an example of a cross-sectional structure of the plane A-A in FIG. 37.

Note that, in FIGS. 37 and 38, the boundary between the photoelectric conversion region 102 and the P-type semiconductor region 104 is slightly different from that in the above-mentioned drawings for convenience of the following description. For example, the upper surface of the photoelectric conversion region 102, that is, the surface thereof facing on the front surface (lower surface in the drawing) side of the semiconductor substrate 101, is drawn at the same height as the bottom portion of the first trench. Also, the side surface of the P-type semiconductor region 104 is drawn further inward than the inner end portion of an anode contact 908.

As illustrated in FIG. 37, the lower end portion of an anode electrode 922 included in a SPAD pixel 920 according to the ninth embodiment is not horizontal but inclined with respect to the front surface of the semiconductor substrate 101. More specifically, the lower end portion of the anode electrode 922 is inclined in the depth direction of the semiconductor substrate 101, that is, to the second trench side, from the end portion of the anode electrode 922 in the width direction toward the center portion thereof to which the light-shielding film 111 in the second trench is connected. Therefore, the distance from the center portion of the anode electrode 922 in the width direction to the front surface of the semiconductor substrate 101 is longer than the distance from the end portion of the anode electrode 922 in the width direction to the front surface of the semiconductor substrate 101.

Also, the anode contact 908 provided at the step portion between the first trench and the second trench contacts the inclined lower end portion of the anode electrode 922. That is, the anode contact 908 and the anode electrode 922 have inclined contact surfaces. As a result, the contact area between the anode contact 908 and the anode electrode 922 is larger than in the case where the contact area between the anode contact 108 and the anode electrode 122 is horizontal to the front surface of the semiconductor substrate 101 as in the SPAD pixel 20 in the first embodiment, for example.

In order to obtain such a structure, the following manufacturing method can be employed, for example.

Figure 39:
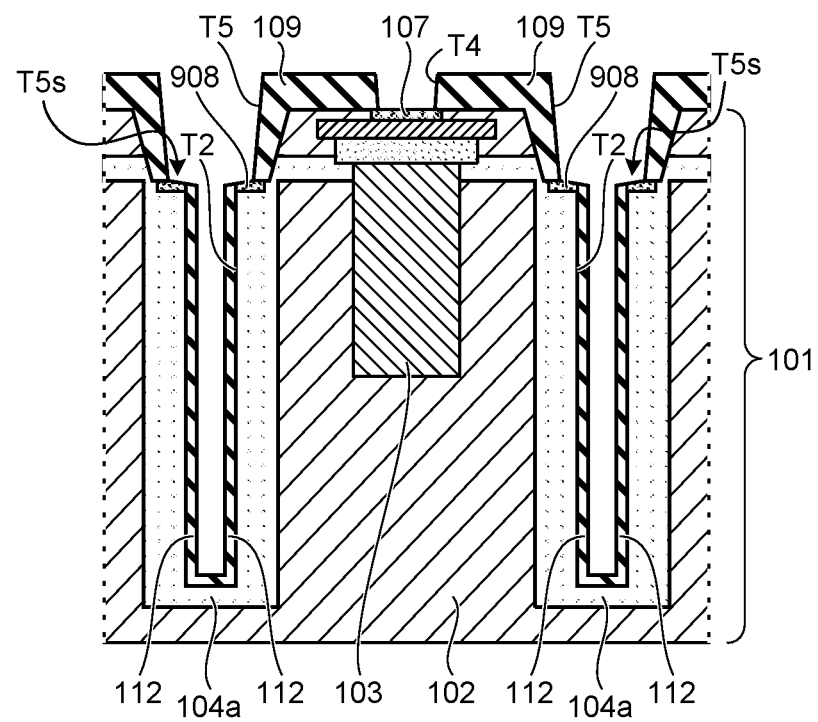
FIG. 39 is a process cross-sectional view illustrating a method for manufacturing the solid-state image sensor according to the ninth embodiment.

FIG. 39 is a process cross-sectional view illustrating a method for manufacturing the solid-state image sensor according to the ninth embodiment. As illustrated in FIG. 39, in the ninth embodiment, in a similar manufacturing stage to that for the cross-sectional structure described with reference to FIG. 17 in the first embodiment, a connection portion T5s of the bottom portion of the trench T5 to the second trench T2 is inclined.

More specifically, the cross-sectional structure illustrated in FIG. 39 illustrates a state where, after ion-implanting acceptors at high concentrations from the upper side of the insulating film 109 to the bottom portion of the trench T5, the entire surface of the insulating film 109 is etched back to remove the insulating film 109 at the bottom portion of the trench T5. At this time, by performing the etch back of the insulating film 109 longer than in the case of the first embodiment, for example, the connection portion to the second trench T2 protruding at an angle close to a right angle can be sloped, a part of the bottom portion of the trench T5 can be inclined, and the anode contact 908 can be exposed.

Thereafter, by filling the trench T5 with a conductive material, the anode electrode 922 that contacts the anode contact 908 on the inclined surface thereof can be formed in the first trench T1 whose side surface is covered with the insulating film 109.

9.2 Effects

As described above, in the present embodiment, the contact surface between the anode contact 908 and the anode electrode 922 is inclined with respect to the front surface of the semiconductor substrate 101. As a result, according to the present embodiment, it is possible to increase the contact area between the anode contact 908 and the anode electrode 922 and lower the contact resistance.

When the photodiode is irradiated with light, a large current flows into the anode contact and the anode electrode. At this time, in a case where the contact resistance at the anode contact is high, a voltage drop will occur.

In the present embodiment, such a voltage drop can be suppressed, and PDE can be improved. Also, since it is not necessary to raise the voltage value to compensate for the dropped voltage, it is possible to reduce the power consumption of the solid-state image sensor. As the scaling-down of the photodiode progresses, it is expected that the effect of lowering the contact resistance will further be enhanced.

9.3 Modification Examples

Next, several specific modification examples of the SPAD pixel 920 according to the ninth embodiment will be described.

In a SPAD pixel according to the modification example, the first trench and the second trench extend so as to surround the element region while following a winding track. That is, in the present example, in which the photodiodes 21 are arranged in a grid pattern, the length of each side of the first trench and the second trench is longer than the pitch of the photodiode 21.

As described above, since the first trench and the second trench surrounding the element region have redundancy in the extending direction, the contact area between the anode contact and the anode electrode can be increased.

9.3.1 First Modification Example

Figure 40:
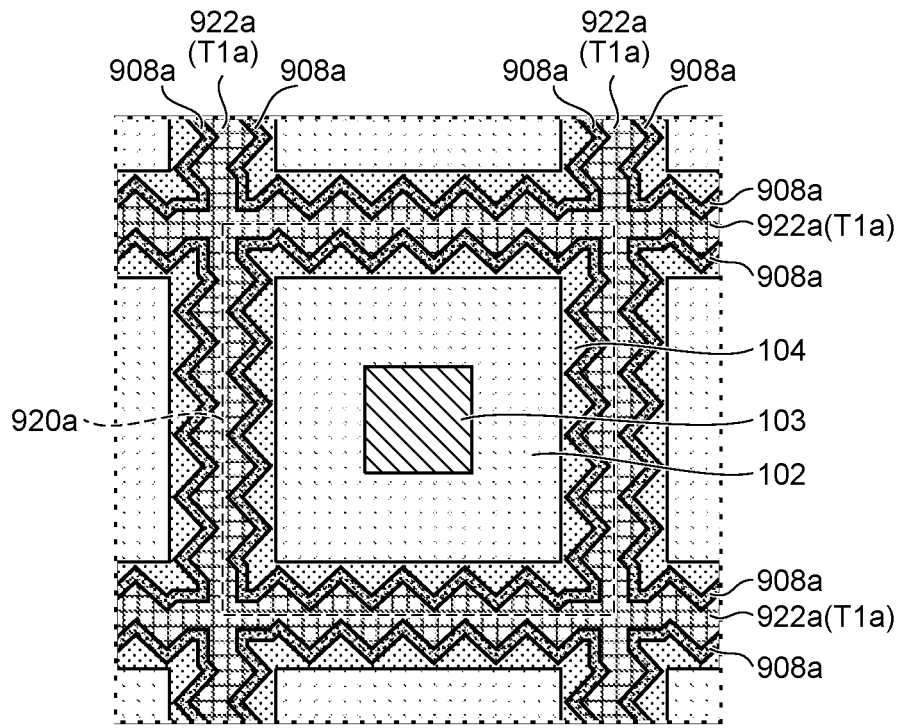
FIG. 40 is a horizontal cross-sectional view illustrating an example of a cross-sectional structure of a surface of a SPAD pixel according to a first modification example of the ninth embodiment parallel to the light incident surface.

FIG. 40 is a horizontal cross-sectional view illustrating an example of a cross-sectional structure of a surface of a SPAD pixel according to a first modification example of the ninth embodiment parallel to the light incident surface. Note that FIG. 40 illustrates a surface corresponding to that in FIG. 38.

As illustrated in FIG. 40, a SPAD pixel 920a according to the first modification example includes a first trench T1a formed in a zigzag shape in the extending direction of each side in a similar structure to the cross-sectional structure described with reference to FIG. 38 and the like in the ninth embodiment. The second trench provided along the bottom portion of the first trench T1a is also formed in a zigzag shape in the extending direction of each side.

An anode electrode 922a provided in the first trench T1a is formed in a zigzag shape in the extending direction of each side along the first trench T1a. The light-shielding film provided in the second trench is also formed in a zigzag shape in the extending direction of each side.

An anode contact 908a is formed in a zigzag shape in the extending direction of each side along the anode electrode 922a and comes into contact with the anode electrode 922a. As a result, the extending length of each side of the first trench T1a is longer than in the case where each side of the first trench is linear as in the SPAD pixel 920 in the ninth embodiment, for example, and the contact area between the anode contact 908a and the anode electrode 922a can be increased.

9.3.2 Second Modification Example

Figure 41:
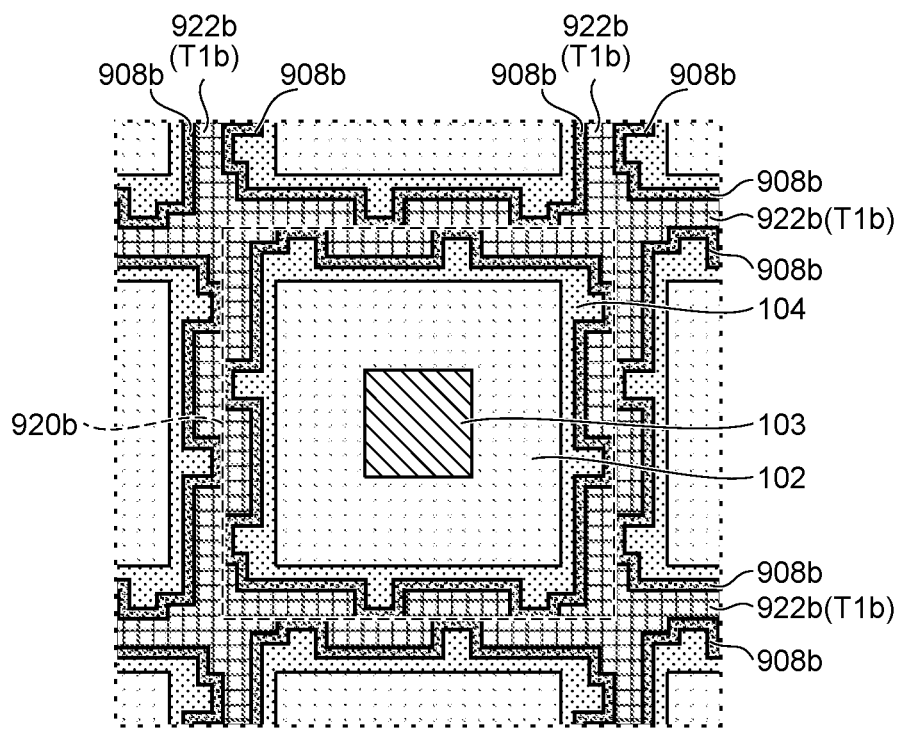
FIG. 41 is a horizontal cross-sectional view illustrating an example of a cross-sectional structure of a surface of a SPAD pixel according to a second modification example of the ninth embodiment parallel to the light incident surface.

FIG. 41 is a horizontal cross-sectional view illustrating an example of a cross-sectional structure of a surface of a SPAD pixel according to a second modification example of the ninth embodiment parallel to the light incident surface. Note that FIG. 41 illustrates a surface corresponding to that in FIG. 38.

As illustrated in FIG. 41, a SPAD pixel 920b according to the second modification example includes a first trench T1b formed in a crank shape in the extending direction of each side in a similar structure to the cross-sectional structure described with reference to FIG. 38 and the like in the ninth embodiment. The second trench provided along the bottom portion of the first trench T1b is also formed in a crank shape in the extending direction of each side.

An anode electrode 922b provided in the first trench T1b is formed in a crank shape in the extending direction of each side along the first trench T1b. The light-shielding film provided in the second trench is also formed in a crank shape in the extending direction of each side.

An anode contact 908b is formed in a crank shape in the extending direction of each side along the anode electrode 922b and comes into contact with the anode electrode 922b. As a result, the extending length of each side of the first trench T1b is longer than in the case where each side of the first trench is linear as in the SPAD pixel 920 in the ninth embodiment, for example, and the contact area between the anode contact 908b and the anode electrode 922b can be increased.

9.3.3 Third Modification Example

Figure 42:
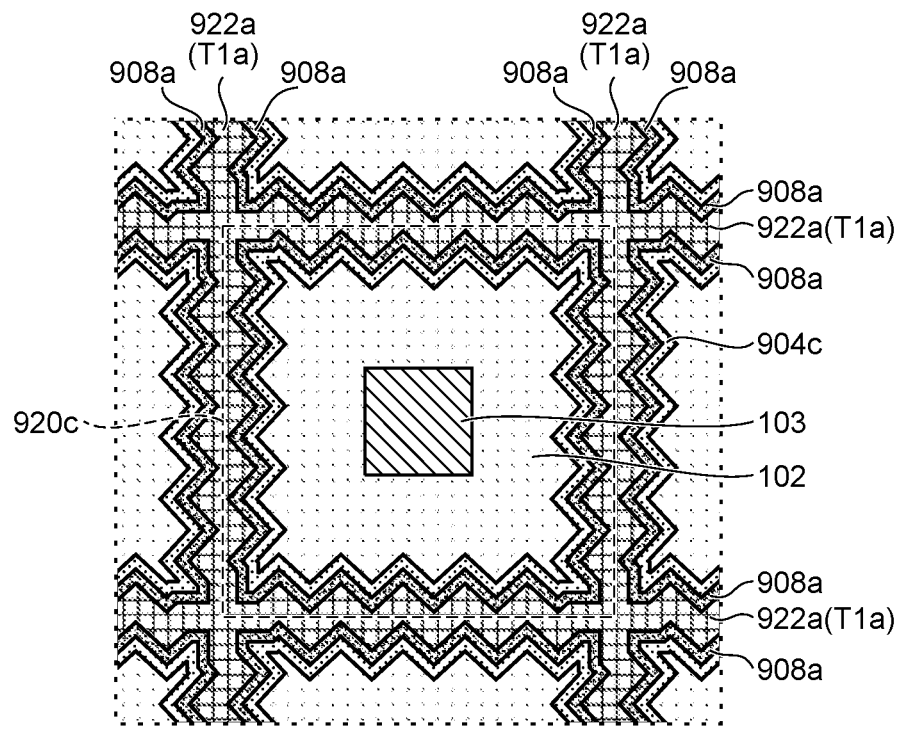
FIG. 42 is a horizontal cross-sectional view illustrating an example of a cross-sectional structure of a surface of a SPAD pixel according to a third modification example of the ninth embodiment parallel to the light incident surface.

FIG. 42 is a horizontal cross-sectional view illustrating an example of a cross-sectional structure of a surface of a SPAD pixel according to a third modification example of the ninth embodiment parallel to the light incident surface. Note that FIG. 42 illustrates a surface corresponding to that in FIG. 38.

As illustrated in FIG. 42, similarly to the first modification example, a SPAD pixel 920c according to the third modification example includes the first trench T1a, the anode electrode 922a, and the anode contact 908a formed in zigzag shapes in the extending direction of each side in a similar structure to the cross-sectional structure described with reference to FIG. 38 and the like in the ninth embodiment. Similarly to the first modification example, the second trench and the light-shielding film are also formed in zigzag shapes in the extending direction of each side.

A P-type semiconductor region 904c is formed in a zigzag shape in the extending direction of each side along the anode contact 908a and comes into contact with the anode contact 908a. As a result, the effective region of the photoelectric conversion region 102, which is a sensitivity region to light, can be enlarged further than in the case where each side of the P-type semiconductor region is linear as in the SPAD pixel 920a in the first modification example, for example.

As described above, in each of the first to third modification examples, the case where at least the anode contact and the anode electrode are formed in zigzag shapes or crank shapes in the extending direction of each side has been described. However, the anode contact and the anode electrode may be formed in other shapes such as a meandering shape and a corrugated shape as long as the anode contact and the anode electrode can be extended in length to cause the contact area thereof to be increased.

Also, in the above description, although the configurations in the first to third modification examples are applied to the configuration in the ninth embodiment, that is, the configuration in which the anode contact 908 and the anode electrode 922 are in contact with each other at the inclined surface, the present invention is not limited to this. The configurations in the first to third modification examples may be applied to the configuration in which the contact surface between the anode contact 108 and the anode electrode 122 is horizontal, such as the configuration in the first embodiment.

Further, for example, in the configuration in the first modification example of the first embodiment, the insulating film 112 is not formed in the second trench, and the anode contact 108 is also in contact with the light-shielding film 111 made of, for example, a conductive material. In a case where the configurations in the first to third modification examples are applied to such a configuration, the contact area between the anode contact and the light-shielding film is added to the contact area between the anode contact and the anode electrode, and the contact resistance can further be lowered. At this time, in a case where the contact surface between the anode contact and the anode electrode is horizontal, the contact area between the anode contact and the anode electrode is small, but the contact area between the anode contact and the light-shielding film is large. Therefore, either the configuration in which the contact surface between the anode contact and the anode electrode is horizontal or the configuration in which the contact surface is inclined can appropriately be selected so that the contact area between the anode contact and the anode electrode and the contact area between anode contact and the light-shielding film are larger.

10. EXAMPLE OF APPLICATION TO ELECTRONIC DEVICE

The solid-state imaging element described above can be applied to various electronic devices such as an image capturing device such as a digital still camera and a digital video camera, a mobile phone having an image capturing function, and another device having an image capturing function.

Figure 43:
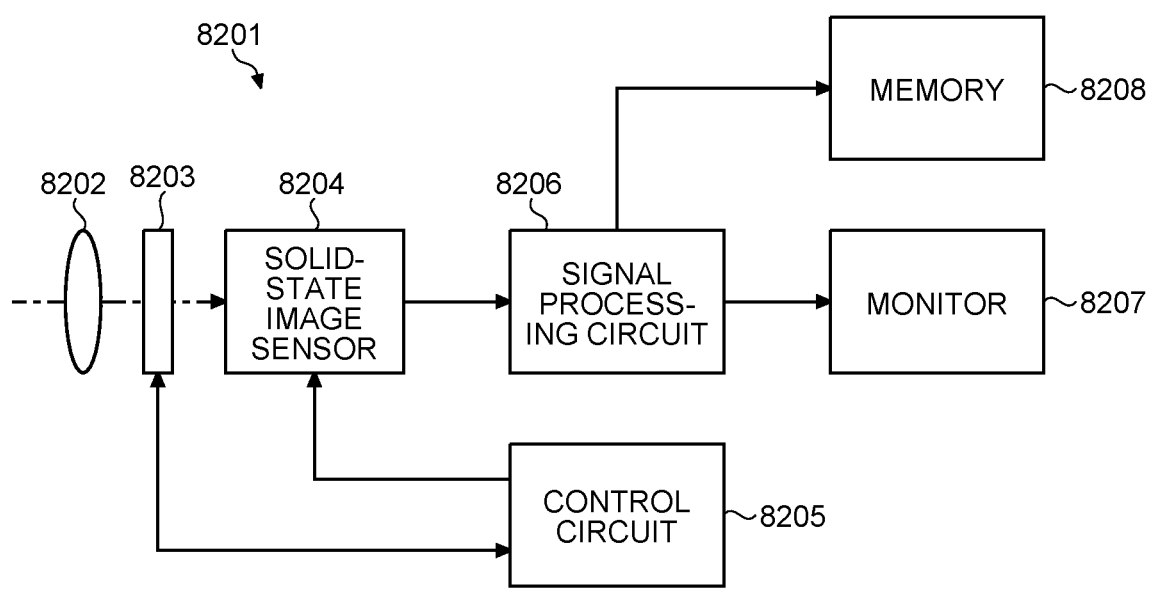
FIG. 43 is a diagram illustrating a configuration of an image capturing device as an electronic device using a solid-state imaging element to which the present technology is applied.

FIG. 43 is a block diagram illustrating a configuration example of an image capturing device as an electronic device to which the present technology is applied.

An image capturing device 8201 illustrated in FIG. 43 includes an optical system 8202, a shutter device 8203, a solid-state imaging element 8204, a drive circuit 8205, a signal processing circuit 8206, a monitor 8207, and a memory 8208, and can capture still images and moving images.

The optical system 8202 includes one or a plurality of lenses, and guides light (incident light) from a subject to the solid-state imaging element 8204 to form an image on the light receiving surface of the solid-state imaging element 8204.

The shutter device 8203 is arranged between the optical system 8202 and the solid-state imaging element 8204, and controls a light irradiation period and a light-shielding period to the solid-state imaging element 8204 in accordance with the control of a drive circuit 1005.

The solid-state imaging element 8204 is constituted by a package including the above-mentioned solid-state imaging element. The solid-state imaging element 8204 stores signal charges for a certain period of time in accordance with the light, passing through the optical system 8202 and the shutter device 8203, by which an image is formed on the light receiving surface. The signal charges stored in the solid-state imaging element 8204 is transferred in accordance with a drive signal (timing signal) supplied from the drive circuit 8205.

The drive circuit 8205 outputs a drive signal for controlling the transfer operation of the solid-state imaging element 8204 and the shutter operation of the shutter device 8203 to drive the solid-state imaging element 8204 and the shutter device 8203.

The signal processing circuit 8206 performs various kinds of signal processing on the signal charges output from the solid-state imaging element 8204. An image (image data) obtained in the signal processing performed by the signal processing circuit 8206 is supplied to the monitor 8207 for display, or supplied to the memory 8208 for storage (recording).

In the image capturing device 8201 configured in this manner, by using the solid-state imaging element 1 instead of the above-mentioned solid-state imaging element 8204, an image with low noise in all pixels can be captured.

11. EXAMPLE OF APPLICATION TO MOVABLE BODY

The technology according to the present disclosure can be applied to various products. For example, the technology according to the present disclosure may be applied to a device mounted in any of various movable bodies such as automobiles, electric vehicles, hybrid electric vehicles, motorcycles, bicycles, personal mobility, airplanes, drones, ships, robots, construction machines, and farm machines (tractors).

Figure 44:
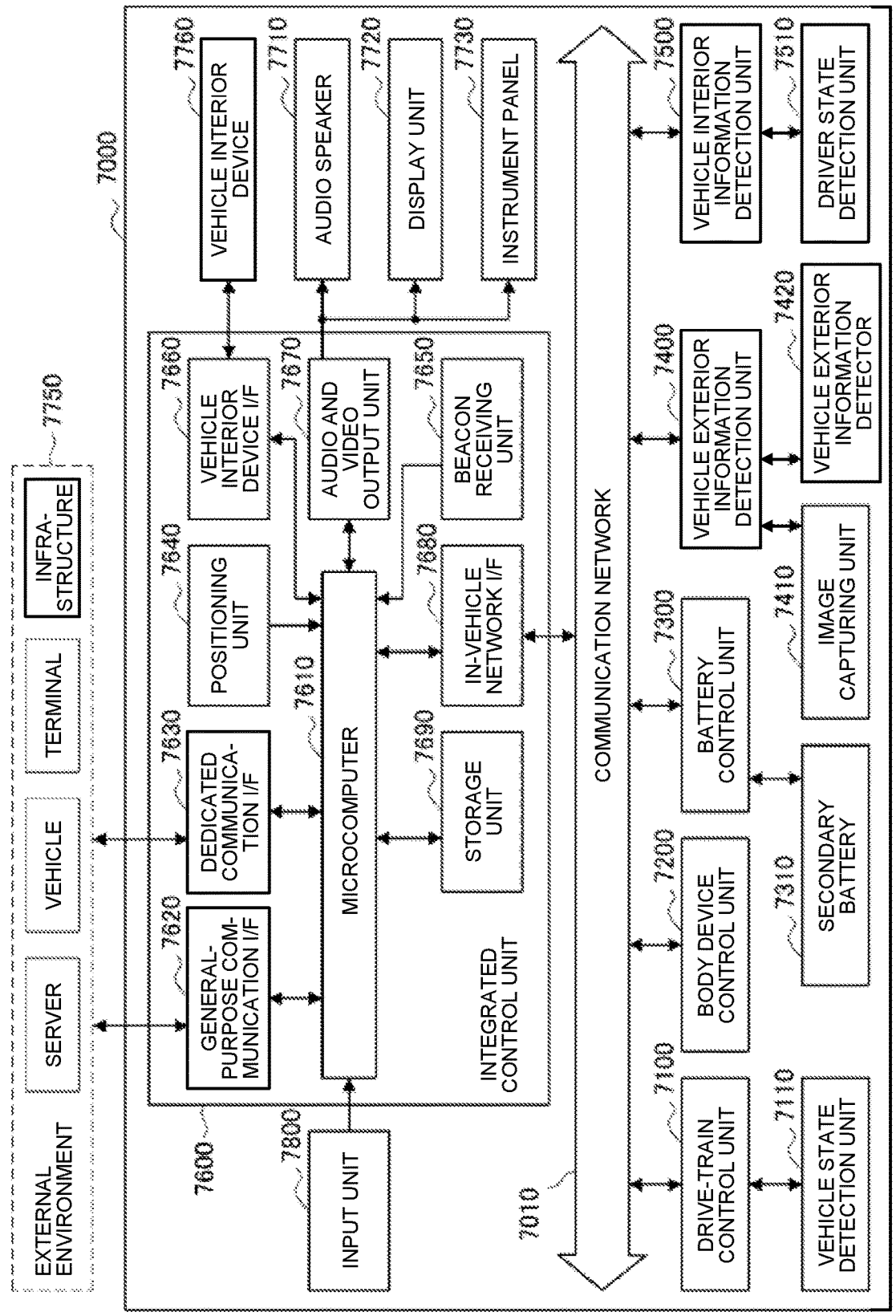
FIG. 44 is a block diagram illustrating an example of a schematic configuration of a vehicle control system.

FIG. 44 is a block diagram illustrating a schematic configuration example of a vehicle control system 7000, which is an example of a movable body control system to which the technology according to the present disclosure can be applied. The vehicle control system 7000 includes a plurality of electronic control units connected via a communication network 7010. In the example illustrated in FIG. 44, the vehicle control system 7000 includes a drive-train control unit 7100, a body device control unit 7200, a battery control unit 7300, a vehicle exterior information detection unit 7400, a vehicle interior information detection unit 7500, and an integrated control unit 7600. The communication network 7010 may be an in-vehicle communication network that conforms to an arbitrary standard such as Controller Area Network (CAN), Local Interconnect Network (LIN), Local Area Network (LAN), and FlexRay (registered trademark).

Each of the control units includes a microcomputer that performs arithmetic processing on the basis of various programs, a storage unit that stores programs executed by the microcomputer or parameters used for various arithmetic operations, and a drive circuit that drives various devices under control. Each of the control units includes a network I/F for communicating with the other control units via the communication network 7010, and a communication I/F for communicating with vehicle interior and exterior devices or sensors by wire or by wireless. FIG. 44 illustrates, as the functional components of the integrated control unit 7600, a microcomputer 7610, a general-purpose communication I/F 7620, a dedicated communication I/F 7630, a positioning unit 7640, a beacon receiving unit 7650, a vehicle interior device I/F 7660, an audio and video output unit 7670, an in-vehicle network I/F 7680, and a storage unit 7690. Each of the other control units also includes a microcomputer, a communication I/F, a storage unit, and the like.

The drive-train control unit 7100 controls the operations of the drive-train devices of the vehicle on the basis of various programs. For example, the drive-train control unit 7100 functions as a control device for a drive force generator for generating the drive force of the vehicle such as an internal combustion engine and a drive motor, a drive force transmission mechanism for transmitting the drive force to the wheels, a steering mechanism for adjusting the steering angle of the vehicle, a braking device for generating the braking force of the vehicle, and the like. The drive-train control unit 7100 may have a function as a control device such as Antilock Brake System (ABS) and Electronic Stability Control (ESC).

A vehicle state detection unit 7110 is connected to the drive-train control unit 7100. The vehicle state detection unit 7110 includes, for example, a gyro sensor that detects the angular velocity of the shaft rotation movement of the vehicle body, an acceleration sensor that detects the acceleration of the vehicle, or at least one out of sensors for detecting the accelerator pedal operation amount, the brake pedal operation amount, the steering wheel steering angle, the engine speed, the wheel rotation speed, and the like. The drive-train control unit 7100 performs arithmetic processing using a signal input from the vehicle state detection unit 7110, and controls the internal combustion engine, the drive motor, an electric power steering device, a brake device, and the like.

The body device control unit 7200 controls the operations of various devices mounted on the vehicle body on the basis of various programs. For example, the body device control unit 7200 functions as a control device for a keyless entry system, a smart key system, a power window device, or various lamps such as a headlamp, a back lamp, a brake lamp, a winker, and a fog lamp. In this case, the body device control unit 7200 may receive radio waves transmitted from a portable device that substitutes for the key or signals of various switches. The body device control unit 7200 receives inputs of these radio waves or signals and controls a vehicle door lock device, a power window device, a lamp, and the like.

The battery control unit 7300 controls a secondary battery 7310, which is a power source of the drive motor, on the basis of various programs. For example, the battery control unit 7300 receives from a battery device including the secondary battery 7310 information such as the battery temperature, the battery output voltage, and the remaining amount of the battery. The battery control unit 7300 performs arithmetic processing using these signals, and controls the temperature of the secondary battery 7310 or a cooling device provided in the battery device.

The vehicle exterior information detection unit 7400 detects information outside the vehicle equipped with the vehicle control system 7000. For example, at least one of an image capturing unit 7410 and a vehicle exterior information detector 7420 is connected to the vehicle exterior information detection unit 7400. The image capturing unit 7410 includes at least one of a Time Of Flight (ToF) camera, a stereo camera, a monocular camera, an infrared camera, and another camera. The vehicle exterior information detector 7420 includes, for example, at least one of an environment sensor for detecting the current weather, and a surrounding information detection sensor for detecting vehicles other than the vehicle equipped with the vehicle control system 7000, obstacles, pedestrians, or the like.

The environment sensor may be, for example, at least one of a raindrop sensor that detects rainy weather, a fog sensor that detects fog, a sunlight sensor that detects the amount of sunlight, and a snow sensor that detects snowfall. The surrounding information detection sensor may include at least one of an ultrasonic sensor, a radar device, and a Light Detection and Ranging (LIDAR) device or a Laser Imaging Detection and Ranging (LIDAR) device. The image capturing unit 7410 and the vehicle exterior information detector 7420 may be provided as independent sensors and devices, or may be provided as a device in which a plurality of sensors and devices are integrated.

Figure 45:
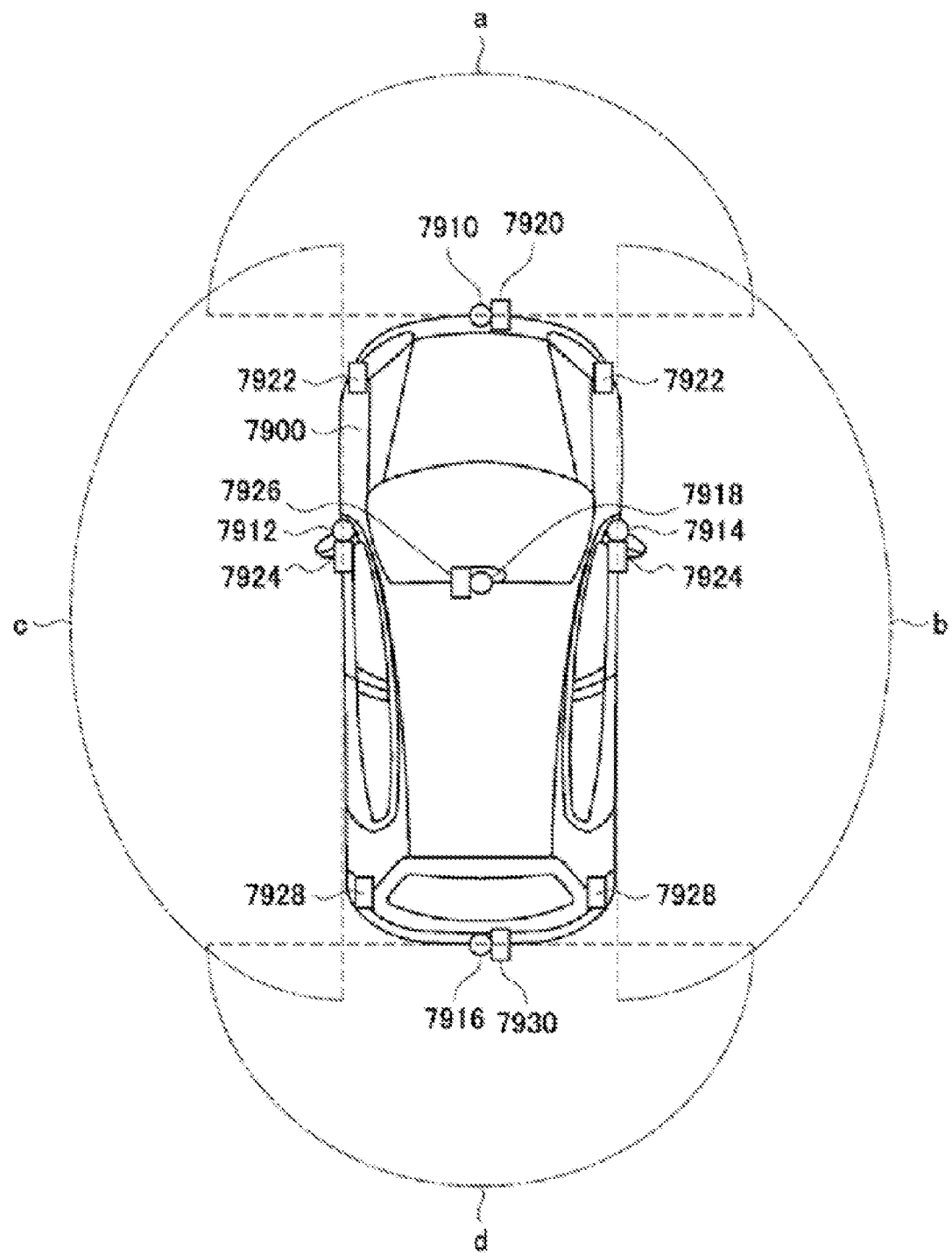
FIG. 45 is an explanatory diagram illustrating an example of installation positions of vehicle exterior information detectors and image capturing units.

Here, FIG. 45 illustrates an example of the installation positions of the image capturing units 7410 and the vehicle exterior information detectors 7420. An image capturing units 7910, 7912, 7914, 7916, and 7918 are provided at at least one position out of the front nose, the side mirrors, the rear bumper, the back door, and the upper part of the windshield in the vehicle interior of a vehicle 7900, for example. The image capturing unit 7910 provided at the front nose and the image capturing unit 7918 provided at the upper part of the windshield in the vehicle interior mainly acquire images of the front side of the vehicle 7900. The image capturing units 7912 and 7914 provided at the side mirrors mainly acquire images of the lateral sides of the vehicle 7900. The image capturing unit 7916 provided at the rear bumper or the back door mainly acquires an image of the rear side of the vehicle 7900. The image capturing unit 7918 provided at the upper part of the windshield in the vehicle interior is mainly used for detecting a lead vehicle, a pedestrian, an obstacle, a traffic light, a traffic sign, a lane, or the like.

Note that FIG. 45 illustrates examples of image capturing ranges for the respective image capturing units 7910, 7912, 7914, and 7916. An image capturing range a indicates an image capturing range for the image capturing unit 7910 provided at the front nose, image capturing ranges b and c indicate image capturing ranges for the image capturing units 7912 and 7914 provided at the side mirrors, respectively, and an image capturing range d indicates an image capturing range for the image capturing unit 7916 provided at the rear bumper or the back door. For example, by superimposing image data captured by the image capturing units 7910, 7912, 7914, and 7916, a bird's-eye view image of the vehicle 7900 as viewed from above can be obtained.

Vehicle exterior information detectors 7920, 7922, 7924, 7926, 7928, and 7930 provided at the front, rear, sides, and corners and at the upper part of the windshield in the vehicle interior in the vehicle 7900 may be ultrasonic sensors or radar devices, for example. The vehicle exterior information detectors 7920, 7926, and 7930 provided at the front nose, rear bumper, back door, and upper part of the windshield in the vehicle interior of the vehicle 7900 may be LIDAR devices, for example. These vehicle exterior information detectors 7920 to 7930 are mainly used for detecting a lead vehicle, a pedestrian, an obstacle, or the like.

Returning to FIG. 44, description is continued. The vehicle exterior information detection unit 7400 causes the image capturing unit 7410 to capture an image outside the vehicle and receives the captured image data. The vehicle exterior information detection unit 7400 also receives detection information from the connected vehicle exterior information detector 7420. In a case where the vehicle exterior information detector 7420 is an ultrasonic sensor, a radar device, or a LIDAR device, the vehicle exterior information detection unit 7400 causes the vehicle exterior information detector 7420 to emit ultrasonic waves, electromagnetic waves, or the like, and receives information for the received reflected waves. The vehicle exterior information detection unit 7400 may perform object detection processing or distance detection processing for a person, a vehicle, an obstacle, a sign, or a character on a road surface on the basis of the received information. The vehicle exterior information detection unit 7400 may perform environment recognition processing for recognizing rainfall, fog, a road surface condition, or the like on the basis of the received information. The vehicle exterior information detection unit 7400 may calculate the distance to an object outside the vehicle on the basis of the received information.

Also, the vehicle exterior information detection unit 7400 may perform image recognition processing or distance detection processing for a person, a vehicle, an obstacle, a sign, or a character on a road surface on the basis of the received image data. The vehicle exterior information detection unit 7400 may perform processing such as distortion correction and positional adjustment on the received image data, and synthesize image data captured by other image capturing units 7410 to generate a bird's-eye view image or a panoramic image. The vehicle exterior information detection unit 7400 may perform viewpoint switching processing using image data captured by other image capturing units 7410.

The vehicle interior information detection unit 7500 detects information inside the vehicle. For example, a driver state detection unit 7510 that detects a state of the driver is connected to the vehicle interior information detection unit 7500. The driver state detection unit 7510 may include a camera that captures an image of the driver, a biosensor that detects the driver's vital information, a microphone that collects sound inside the vehicle, or the like. The biosensor is provided on the seat surface or the steering wheel, for example, and detects vital information of the occupant sitting on the seat or the driver holding the steering wheel. The vehicle interior information detection unit 7500 may calculate the degree of fatigue or concentration of the driver and determine whether or not the driver falls asleep on the basis of the detection information input from the driver state detection unit 7510. The vehicle interior information detection unit 7500 may perform processing such as noise canceling processing on the collected audio signal.

The integrated control unit 7600 controls the overall operation in the vehicle control system 7000 on the basis of various programs. An input unit 7800 is connected to the integrated control unit 7600. The input unit 7800 is fulfilled by a device that can be input by the occupant, such as a touch panel, a button, a microphone, a switch, and a lever. Data obtained by recognizing voice input via the microphone may be input into the integrated control unit 7600. The input unit 7800 may be, for example, a remote control device using infrared rays or other radio waves, or an externally connected device such as a mobile phone and a personal digital assistant (PDA) that supports the operation of the vehicle control system 7000. The input unit 7800 may be, for example, a camera, in which case the occupant can input information by gesture. Alternatively, data obtained by detecting the movement of the wearable device worn by the occupant may be input. Further, the input unit 7800 may include, for example, an input control circuit that generates an input signal on the basis of the information input by the occupant or the like using the above input unit 7800 and outputs the input signal to the integrated control unit 7600. The occupant or the like operates this input unit 7800 to input various data into the vehicle control system 7000 and instruct the vehicle control system 7000 to perform processing operation.

The storage unit 7690 may include a read only memory (ROM) that stores various programs executed by the microcomputer, and a random access memory (RAM) that stores various parameters, calculation results, sensor values, or the like. Also, the storage unit 7690 may be fulfilled by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various devices existing in an external environment 7750. The general-purpose communication I/F 7620 may implement a cellular communication protocol such as Global System of Mobile communications (GSM (registered trademark), WiMAX (registered trademark), Long Term Evolution (LTE (registered trademark)), and LTE-Advanced (LTE-A), or other wireless communication protocols such as wireless LAN (also referred to as Wi-Fi (registered trademark)) and Bluetooth (registered trademark). For example, the general-purpose communication I/F 7620 may be connected to a device (for example, an application server or a control server) existing on an external network (for example, the Internet, a cloud network, or a business-operator-specific network) via a base station or an access point. Also, for example, the general-purpose communication I/F 7620 may be connected to a terminal (for example, a terminal of a driver, a pedestrian, or a store, or a Machine Type Communication (MTC) terminal) existing in the vicinity of the vehicle with use of a Peer To Peer (P2P) technique.

The dedicated communication I/F 7630 is a communication I/F that supports a communication protocol designed for use in vehicles. The dedicated communication I/F 7630 may implement Wireless Access in Vehicle Environment (WAVE), which is a combination of lower layer IEEE 802.11p and higher layer IEEE 1609, Dedicated Short Range Communications (DSRC), or a standard protocol such as a cellular communication protocol. The dedicated communication I/F 7630 typically performs V2X communication, which is a concept including one or more communication types out of communication between vehicles (Vehicle to Vehicle communication), communication between a road and a vehicle (Vehicle to Infrastructure communication), communication between a vehicle and a house (Vehicle to Home communication), and communication between a pedestrian and a vehicle (Vehicle to Pedestrian communication).

The positioning unit 7640 receives, for example, a Global Navigation Satellite System (GNSS) signal from a GNSS satellite (for example, a Global Positioning System (GPS) signal from a GPS satellite), performs positioning, and generates positional information including the latitude, longitude, and altitude of the vehicle. Note that the positioning unit 7640 may specify a current position by exchanging signals with a wireless access point, or may acquire positional information from a terminal having a positioning function such as a mobile phone, a PHS, and a smartphone.

The beacon receiving unit 7650 receives electric waves or electromagnetic waves transmitted from a wireless station or the like installed on the road, and acquires information such as a current position, traffic congestion, road closure, and required time. Note that the function of the beacon receiving unit 7650 may be included in the above-mentioned dedicated communication I/F 7630.

The vehicle interior device I/F 7660 is a communication interface that mediates connection between the microcomputer 7610 and various vehicle interior devices 7760 existing in the vehicle. The vehicle interior device I/F 7660 may establish wireless connection using a wireless communication protocol such as a wireless LAN, Bluetooth (registered trademark), Near Field Communication (NFC), and Wireless USB (WUSB). Also, the vehicle interior device I/F 7660 may establish wired communication by means of Universal Serial Bus (USB), High-Definition Multimedia Interface (HDMI (registered trademark)), Mobile High-definition Link (MHL), or the like via a not-illustrated connection terminal (and a cable if necessary). The vehicle interior device 7760 may include, for example, at least one of a mobile device or a wearable device owned by the occupant, and an information device carried in or attached to the vehicle. The vehicle interior device 7760 may also include a navigation device that searches for a route to an arbitrary destination. The vehicle interior device I/F 7660 exchanges control signals or data signals with these vehicle interior devices 7760.

The in-vehicle network I/F 7680 is an interface that mediates communication between the microcomputer 7610 and the communication network 7010. The in-vehicle network I/F 7680 transmits/receives signals and the like in accordance with a predetermined protocol supported by the communication network 7010.

The microcomputer 7610 of the integrated control unit 7600 controls the vehicle control system 7000 in accordance with various programs on the basis of information acquired via at least one of the general-purpose communication I/F 7620, the dedicated communication I/F 7630, the positioning unit 7640, the beacon receiving unit 7650, the vehicle interior device I/F 7660, and the in-vehicle network I/F 7680. For example, the microcomputer 7610 may calculate a control target value for the drive force generator, the steering mechanism, or the braking device on the basis of the acquired information inside and outside the vehicle, and output a control command to the drive-train control unit 7100. For example, the microcomputer 7610 may perform coordinate control for the purpose of fulfilling functions of Advanced Driver Assistance System (ADAS) including collision avoidance or impact mitigation of the vehicle, follow-up traveling based on an inter-vehicle distance, vehicle speed maintenance traveling, collision warning to the vehicle, lane departure warning to the vehicle, and the like. Also, the microcomputer 7610 may perform coordinate control for the purpose of autonomous driving or the like, in which the vehicle autonomously travels without relying on the driver's operation, by controlling the drive force generator, the steering mechanism, or the braking device on the basis of the acquired information inside and outside the vehicle.

The microcomputer 7610 may generate three-dimensional distance information between the vehicle and an object such as a surrounding structure and person on the basis of information acquired via at least one of the general-purpose communication I/F 7620, the dedicated communication I/F 7630, the positioning unit 7640, the beacon receiving unit 7650, the vehicle interior device I/F 7660, and the in-vehicle network I/F 7680 and create local map information including the peripheral information of the current position of the vehicle. Also, the microcomputer 7610 may predict danger such as a vehicle collision, a pedestrian or the like approaching, and entering a closed road on the basis of acquired information, and generate a warning signal. The warning signal may be, for example, a signal for generating a warning sound or lighting a warning lamp.

The audio and video output unit 7670 transmits at least either an audio output signal or a video output signal to an output device capable of visually or audibly notifying the occupant of the vehicle or the outside of the vehicle of information. In the example in FIG. 44, an audio speaker 7710, a display unit 7720, and an instrument panel 7730 are exemplified as output devices. The display unit 7720 may include, for example, at least one of an onboard display and a head-up display. The display unit 7720 may have an Augmented Reality (AR) display function. The output device may be another device, instead of these devices, such as a headphone, a wearable device such as an eyeglass-type display worn by the occupant, a projector, and a lamp. In a case where the output device is a display device, the display device visually displays results obtained by various kinds of processing performed by the microcomputer 7610 or information received from other control units in various formats such as text, an image, a table, and a graph. Also, in a case where the output device is an audio output device, the audio output device converts an audio signal composed of reproduced audio data, acoustic data, or the like into an analog signal and outputs the audio signal audibly.

Note that, in the example illustrated in FIG. 44, at least two control units connected via the communication network 7010 may be integrated as one control unit. Alternatively, each of the control units may be composed of a plurality of control units. Further, the vehicle control system 7000 may include another not-illustrated control unit. Further, in the above description, another one of the control units may have a part or all of the functions carried out by any one of the control units. That is, as long as information is transmitted and received via the communication network 7010, predetermined arithmetic processing may be performed by any of the control units. Similarly, a sensor or a device connected to one of the control units may be connected to another one of the control units, and the plurality of control units may transmit and receive detection information to and from each other via the communication network 7010.

Note that a computer program for fulfilling the respective functions of the electronic device 1 according to the present embodiment described with reference to FIG. 1 can be mounted on any of the control units or the like. It is also possible to provide a computer-readable recording medium in which such a computer program is stored. The recording medium is, for example, a magnetic disc, an optical disc, a magneto-optical disc, or a flash memory. Also, the above computer program may be distributed, for example, via a network without using a recording medium.

In the vehicle control system 7000 described above, the electronic device 1 according to the present embodiment described with reference to FIG. 1 can be applied to the integrated control unit 7600 serving as an application example illustrated in FIG. 44. For example, the storage unit 40 and the processor 50 of the electronic device 1 correspond to the microcomputer 7610, the storage unit 7690, and the in-vehicle network I/F 7680 of the integrated control unit 7600. However, the present invention is not limited to this, and the vehicle control system 7000 may correspond to a host 80 in FIG. 1.

Also, at least a part of the components of the electronic device 1 according to the present embodiment described with reference to FIG. 1 may be fulfilled in a module for the integrated control unit 7600 illustrated in FIG. 44 (for example, an integrated circuit module composed of one die). Alternatively, the electronic device 1 according to the present embodiment described with reference to FIG. 1 may be fulfilled by a plurality of control units of the vehicle control system 7000 illustrated in FIG. 44.

12. APPLICATION EXAMPLE TO ENDOSCOPIC SURGERY SYSTEM

In addition, the technology according to the present disclosure (the present technology) can be applied to various products. For example, the technology according to the present disclosure may be applied to an endoscopic surgery system.

Figure 46:
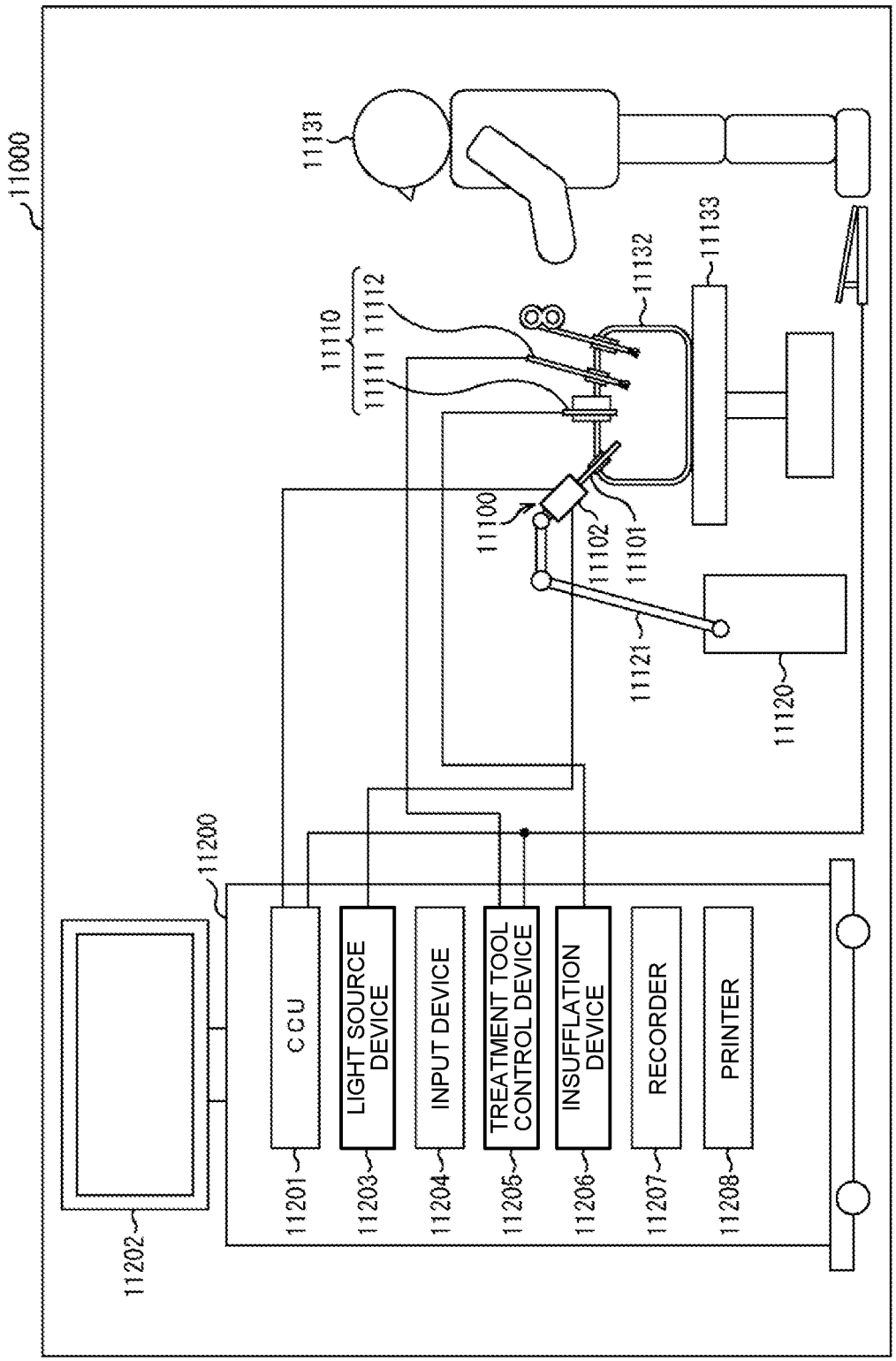
FIG. 46 is a diagram illustrating an example of a schematic configuration of an endoscopic surgery system.

FIG. 46 is a diagram illustrating an example of a schematic configuration of an endoscopic surgery system to which the technology according to the present disclosure (the present technique) can be applied.

FIG. 46 illustrates a state in which a surgeon (doctor) 11131 is performing surgery on a patient 11132 on a patient bed 11133 using an endoscopic surgery system 11000. As illustrated, the endoscopic surgery system 11000 includes an endoscope 11100, other surgical tools 11110 such as an insufflation tube 11111 and an energy treatment tool 11112, a support arm device 11120 that supports the endoscope 11100, and a cart 11200 that has mounted thereon various devices for endoscopic surgery.

The endoscope 11100 includes a lens barrel 11101 in which a region having a predetermined length from the tip end is inserted into the body cavity of the patient 11132, and a camera head 11102 connected to the base end of the lens barrel 11101. In the illustrated example, the endoscope 11100 serving as a so-called rigid scope having the rigid barrel 11101 is illustrated, but the endoscope 11100 may serve as a so-called flexible scope having a flexible barrel.

The tip end of the lens barrel 11101 is provided with an opening portion in which an objective lens is fitted. A light source device 11203 is connected to the endoscope 11100, and the light generated by the light source device 11203 is guided to the tip end of the lens barrel by a light guide extending inside the lens barrel 11101 and is emitted through the objective lens toward an observation target in the body cavity of the patient 11132. Note that the endoscope 11100 may be a forward-viewing endoscope, a forward-oblique viewing endoscope, or a side-viewing endoscope.

An optical system and an image capturing element are provided inside the camera head 11102, and reflected light (observation light) from the observation target is collected on the image capturing element by the optical system. The observation light is photoelectrically converted by the image capturing element, and an electric signal corresponding to the observation light, that is, an image signal corresponding to the observation image, is generated. The image signal is transmitted to a camera control unit (CCU) 11201 as RAW data.

The CCU11201 includes a central processing unit (CPU), a graphics processing unit (GPU), and the like, and comprehensively controls operation of the endoscope 11100 and a display device 11202. Further, the CCU 11201 receives an image signal from the camera head 11102, and performs on the image signal various kinds of image processing, such as development processing (demosaic processing), for displaying an image based on the image signal.

The display device 11202 displays an image based on the image signal subjected to image processing performed by the CCU 11201 under the control of the CCU 11201.

The light source device 11203 includes a light source such as a light emitting diode (LED), and supplies irradiation light for use in photographing a surgical site or the like to the endoscope 11100.

An input device 11204 is an input interface to the endoscopic surgery system 11000. The user can input various kinds of information and instructions into the endoscopic surgery system 11000 via the input device 11204. For example, the user inputs an instruction to change the image capturing conditions (type of irradiation light, magnification, focal length, and the like) for the endoscope 11100.

A treatment tool control device 11205 controls driving of the energy treatment tool 11112 for ablation of tissue, incision, sealing of blood vessels, and the like. An insufflation device 11206 supplies gas into the body cavity of the patient 11132 through the insufflation tube 11111 in order to inflate the body cavity for the purpose of securing the field of view for the endoscope 11100 and securing the surgeon's work space. A recorder 11207 is a device that can record various kinds of information related to surgery. A printer 11208 is a device that can print various kinds of information related to surgery in various formats such as text, an image, and a graph.

Note that the light source device 11203 that supplies the irradiation light for photographing the surgical site to the endoscope 11100 can be composed of a white light source including, for example, an LED, a laser light source, or a combination thereof. In a case where the white light source includes a combination of RGB laser light sources, the output intensity and output timing of each color (each wavelength) can be controlled with high accuracy. Therefore, the white balance of a captured image can be adjusted in the light source device 11203. Also, in this case, by irradiating the observation target with the laser light beams from the respective RGB laser light sources in a time-division manner and controlling driving of the image capturing element of the camera head 11102 in synchronization with the irradiation timing, the images corresponding to the respective RGB laser light beams can be captured in a time-division manner. According to this method, a color image can be obtained without providing a color filter in the image capturing element.

Also, driving of the light source device 11203 may be controlled so as to change the intensity of the output light at predetermined time intervals. By controlling driving of the image capturing element of the camera head 11102 in synchronization with the timing of the change of the light intensity to acquire an image in a time-division manner and synthesizing the image, a high dynamic range image without so-called underexposure and overexposure can be generated.

Also, the light source device 11203 may be configured to be able to supply light in a predetermined wavelength band corresponding to special light observation. In the special light observation, for example, by emitting light in a narrower band than irradiation light used during normal observation (that is, white light) with use of dependence of light absorption on wavelength in body tissue, so-called narrow band light observation (Narrow Band Imaging), in which a predetermined tissue such as a blood vessel in a superficial portion of the mucous membrane is photographed with high contrast, is performed. Alternatively, in the special light observation, fluorescence observation, in which an image is obtained by fluorescence generated by emitting excitation light, may be performed. In the fluorescence observation, a body tissue can be irradiated with excitation light to observe fluorescence from the body tissue (autofluorescence observation), or a reagent such as indocyanine green (ICG) can be locally injected into a body tissue, the body tissue can be irradiated with excitation light corresponding to the fluorescence wavelength of the reagent, to obtain a fluorescence image. The light source device 11203 may be configured to be able to supply narrow band light and/or excitation light corresponding to such special light observation.

Figure 47:
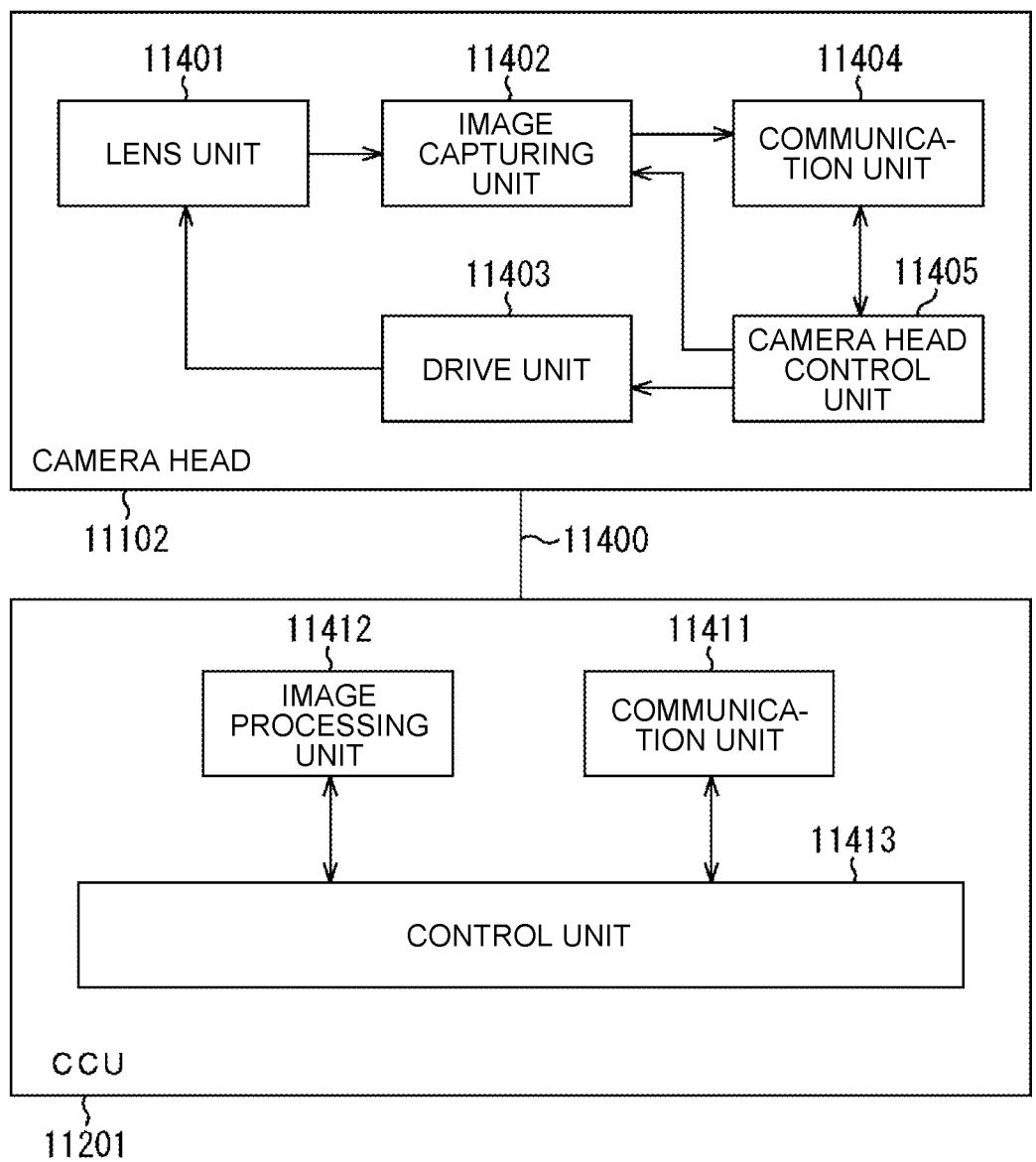
FIG. 47 is a block diagram illustrating an example of a functional configuration of a camera head and a CCU.

FIG. 47 is a block diagram illustrating an example of a functional configuration of the camera head 11102 and the CCU 11201 illustrated in FIG. 46.

The camera head 11102 includes a lens unit 11401, an image capturing unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected to each other so as to be able to communicate with each other by means of a transmission cable 11400.

The lens unit 11401 is an optical system provided at a connection portion to the lens barrel 11101. The observation light taken in from the tip end of the lens barrel 11101 is guided to the camera head 11102 and incident on the lens unit 11401. The lens unit 11401 is formed by combining a plurality of lenses including a zoom lens and a focus lens.

The image capturing unit 11402 is composed of an image capturing element. The number of the image capturing elements constituting the image capturing unit 11402 may be one (so-called single plate type) or a plurality (so-called multi-plate type). In a case where the image capturing unit 11402 is in the multi-plate type, for example, image signals corresponding to the RGB colors may be generated by each of the image capturing elements and synthesized to obtain a color image. Alternatively, the image capturing unit 11402 may include a pair of image capturing elements for acquiring image signals for the right eye and the left eye corresponding to 3D (Dimensional) display, respectively. The 3D display enables the surgeon 11131 to more accurately grasp the depth of a living tissue in a surgical site. Note that, in a case where the image capturing unit 11402 is in the multi-plate type, a plurality of lens units 11401 may be provided corresponding to the respective image capturing elements.

Further, the image capturing unit 11402 does not necessarily have to be provided on the camera head 11102. For example, the image capturing unit 11402 may be provided inside the lens barrel 11101 immediately next to the objective lens.

The drive unit 11403 includes an actuator, and is controlled by the camera head control unit 11405 to move the zoom lens and the focus lens of the lens unit 11401 by a predetermined distance along the optical axis. As a result, the magnification and focus of the image captured by the image capturing unit 11402 can be adjusted as appropriate.

The communication unit 11404 includes a communication device for transmitting and receiving various kinds of information to and from the CCU 11201. The communication unit 11404 transmits an image signal obtained from the image capturing unit 11402 as RAW data to the CCU 11201 via the transmission cable 11400.

Also, the communication unit 11404 receives a control signal for controlling driving of the camera head 11102 from the CCU 11201 and supplies the control signal to the camera head control unit 11405. The control signal includes information about image capturing conditions such as information to specify the frame rate of the captured image, information to specify the exposure value at the time of image capturing, and/or information to specify the magnification and focus of the captured image.

Note that the image capturing conditions such as the frame rate, exposure value, magnification, and focus may be appropriately specified by the user, or may be automatically set by the control unit 11413 of the CCU 11201 on the basis of the acquired image signal. In the latter case, the endoscope 11100 has a so-called Auto Exposure (AE) function, Auto Focus (AF) function, and Auto White Balance (AWB) function.

The camera head control unit 11405 controls driving of the camera head 11102 on the basis of a control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Further, the communication unit 11411 transmits a control signal for controlling driving of the camera head 11102 to the camera head 11102. The image signal and the control signal can be transmitted by means of electric communication, optical communication, or the like.

The image processing unit 11412 performs various kinds of image processing on an image signal serving as the RAW data transmitted from the camera head 11102.

The control unit 11413 performs various kinds of control regarding image capturing of a surgical site and the like by the endoscope 11100 and display of the captured image obtained by the image capturing of the surgical site and the like. For example, the control unit 11413 generates a control signal for controlling driving of the camera head 11102.

Also, the control unit 11413 causes the display device 11202 to display a captured image of a surgical site or the like on the basis of an image signal subjected to image processing by the image processing unit 11412. At this time, the control unit 11413 may recognize various objects in the captured image by using various image recognition techniques. For example, by detecting the shape and color of the edge of an object included in the captured image, the control unit 11413 can detect a surgical tool such as forceps, a specific living part, bleeding, mist at the time of using the energy treatment tool 11112, and the like. When the control unit 11413 displays a captured image on the display device 11202, the control unit 11413 may superimpose and display various kinds of surgical support information on the image of the surgical site by using the recognition result. By superimposing and displaying the surgical support information and presenting it to the surgeon 11131, it becomes possible to reduce the burden on the surgeon 11131 and to ensure that the surgeon 11131 can proceed with the surgery.

The transmission cable 11400 connecting the camera head 11102 to the CCU 11201 is an electric signal cable compatible with electric signal communication, an optical fiber compatible with optical communication, or a composite cable thereof.

Here, in the illustrated example, the communication is performed by wire using the transmission cable 11400, but the communication between the camera head 11102 and the CCU 11201 may be performed by wireless.

An example of an endoscopic surgery system to which the technology according to the present disclosure can be applied has been described above. The technology according to the present disclosure can be applied to, for example, the endoscope 11100, the image capturing unit 11402 of the camera head 11102, and the like in the configurations described above. By applying the technology according to the present disclosure to the image capturing unit 11402 or the like, it is possible to acquire high-luminance image data while suppressing a decrease in resolution.

Note that, although the endoscopic surgery system has been described here as an example, the technology according to the present disclosure may be applied to another system such as a microscopic surgery system.

Although the embodiments of the present disclosure have been described above, the technical scope of the present disclosure is not limited to the above-described embodiments, and various modifications can be made without departing from the gist of the present disclosure. Also, the components in the different embodiments and modification examples may appropriately be combined.

Further, the effects of the respective embodiments described in the present specification are illustrative only and are not limited, and other effects may be provided.

13. APPENDIX

Note that the present technology can also employ the following configuration.

(1)

A solid-state image sensor comprising:
  a semiconductor substrate including a first trench provided on a first surface and a second trench provided along a bottom portion of the first trench; and
  a photoelectric conversion element provided on the semiconductor substrate,
  wherein the photoelectric conversion element includes
  a photoelectric conversion region provided in an element region partitioned by the first trench and the second trench in the semiconductor substrate and photoelectrically converting incident light to generate a charge,
  a first semiconductor region surrounding the photoelectric conversion region in the element region,
  a first contact in contact with the first semiconductor region at the bottom portion of the first trench,
  a first electrode in contact with the first contact in the first trench,
  a second semiconductor region provided in a region in the element region in contact with the first semiconductor region and having a first conductive type, which is an equal type to that of the first semiconductor region,
  a third semiconductor region serving as a region in the element region in contact with the second semiconductor region, provided between the second semiconductor region and the first surface, and having a second conductive type, which is an opposite type to that of the first conductive type,
  a second contact provided on the first surface so as to be in contact with the third semiconductor region, and
  a second electrode in contact with the second contact, and
  a second surface at which the first contact and the first electrode are in contact with each other is inclined with respect to the first surface.

(2)

The solid-state image sensor according to (1), wherein the second surface is inclined to the second trench side from an end portion of the first electrode in a width direction toward a center portion thereof.

(3)

The solid-state image sensor according to (1) or (2), wherein
  the first trench and the second trench extend so as to surround the element region while following a winding track.

(4)

The solid-state image sensor according to any one of (1) to (3), wherein
  a distance of the first contact from the first surface is longer than a distance of the third semiconductor region from the first surface.

(5)

The solid-state image sensor according to any one of (1) to (4), wherein
  the first contact comes in contact with the first semiconductor region so as to surround an outer periphery of the first semiconductor region.

(6)

The solid-state image sensor according to any one of (1) to (5), further comprising:
  a light-shielding film provided inside the second trench.

(7)

The solid-state image sensor according to (6), wherein
  the light-shielding film is made of an equal material to the first electrode.

(8)

The solid-state image sensor according to (6) or (7), further comprising:
  an insulating film provided between the light-shielding film and the first semiconductor region.

(9)

A solid-state image sensor comprising:
  a semiconductor substrate including a first trench provided on a first surface and a second trench provided along a bottom portion of the first trench; and
  a photoelectric conversion element provided on the semiconductor substrate,
  wherein the photoelectric conversion element includes
  a photoelectric conversion region provided in an element region partitioned by the first trench and the second trench in the semiconductor substrate and photoelectrically converting incident light to generate a charge,
  a first semiconductor region surrounding the photoelectric conversion region in the element region, a first contact in contact with the first semiconductor region at the bottom portion of the first trench, a first electrode in contact with the first contact in the first trench, a second semiconductor region provided in a region in the element region in contact with the first semiconductor region and having a first conductive type, which is an equal type to that of the first semiconductor region, a third semiconductor region serving as a region in the element region in contact with the second semiconductor region, provided between the second semiconductor region and the first surface, and having a second conductive type, which is an opposite type to that of the first conductive type, a second contact provided on the first surface so as to be in contact with the third semiconductor region, and a second electrode in contact with the second contact, and the first trench and the second trench extend so as to surround the element region while following a winding track.

(10)
The solid-state image sensor according to (9), wherein each of the first trench and the second trench is formed in at least any of a zigzag shape, a crank shape, and a meandering shape in an extending direction.

(11)
The solid-state image sensor according to (9) or (10), wherein
the first electrode extends so as to surround the element region while following a winding track along the first trench.

(12)
The solid-state image sensor according to (11), wherein the first contact extends so as to surround an outer periphery of the first semiconductor region while following a winding track along the first electrode and comes in contact with the first electrode.

(13)
The solid-state image sensor according to (12), wherein the first semiconductor region extends so as to surround the photoelectric conversion region while following a winding track along the first contact and comes in contact with the first contact.

(14)
The solid-state image sensor according to any one of (9) to (13), wherein
the plurality of photoelectric conversion elements are provided,
the plurality of photoelectric conversion elements are arranged in a grid pattern,
a pitch of each of the plurality of photoelectric conversion elements in a first direction is equal to a pitch thereof in a second direction perpendicular to the first direction, and
a length of one side of each of the first trench and the second trench surrounding the element region is longer than the pitch of each of the plurality of photoelectric conversion elements.

(15)
The solid-state image sensor according to any one of (9) to (14), further comprising:
a light-shielding film provided inside the second trench.

(16)
The solid-state image sensor according to (15), wherein the light-shielding film is made of an equal material to the first electrode.

(17)
The solid-state image sensor according to (15) or (16), wherein
the light-shielding film is in contact with the first semiconductor region.

(18)
The solid-state image sensor according to (15) or (16), further comprising:
an insulating film provided between the light-shielding film and the first semiconductor region.

(19)
An electronic device comprising:
a solid-state image sensor;
an optical system forming an image on a light receiving surface of the solid-state image sensor by means of incident light; and
a processor controlling the solid-state image sensor,
wherein the solid-state image sensor includes
a semiconductor substrate including a first trench provided on a first surface and a second trench provided along a bottom portion of the first trench, and
a photoelectric conversion element provided on the semiconductor substrate,
the photoelectric conversion element includes
a photoelectric conversion region provided in an element region partitioned by the first trench and the second trench in the semiconductor substrate and photoelectrically converting incident light to generate a charge,
a first semiconductor region surrounding the photoelectric conversion region in the element region,
a first contact in contact with the first semiconductor region at the bottom portion of the first trench,
a first electrode in contact with the first contact in the first trench,
a second semiconductor region provided in a region in the element region in contact with the first semiconductor region and having a first conductive type, which is an equal type to that of the first semiconductor region,
a third semiconductor region serving as a region in the element region in contact with the second semiconductor region, provided between the second semiconductor region and the first surface, and having a second conductive type, which is opposite to that of the first conductive type,
a second contact provided on the first surface so as to be in contact with the third semiconductor region, and
a second electrode in contact with the second contact, and
a second surface at which the first contact and the first electrode are in contact with each other is inclined with respect to the first surface.

(20)
An electronic device comprising:
a solid-state image sensor;
an optical system forming an image on a light receiving surface of the solid-state image sensor by means of incident light; and
a processor controlling the solid-state image sensor,
wherein the solid-state image sensor includes
a semiconductor substrate including a first trench provided on a first surface and a second trench provided along a bottom portion of the first trench, and
a photoelectric conversion element provided on the semiconductor substrate,
the photoelectric conversion element includes
a photoelectric conversion region provided in an element region partitioned by the first trench and the second trench in the semiconductor substrate and photoelectrically converting incident light to generate a charge, a first semiconductor region surrounding the photoelectric conversion region in the element region, a first contact in contact with the first semiconductor region at the bottom portion of the first trench, a first electrode in contact with the first contact in the first trench, a second semiconductor region provided in a region in the element region in contact with the first semiconductor region and having a first conductive type, which is an equal type to that of the first semiconductor region, a third semiconductor region serving as a region in the element region in contact with the second semiconductor region, provided between the second semiconductor region and the first surface, and having a second conductive type, which is opposite to that of the first conductive type, a second contact provided on the first surface so as to be in contact with the third semiconductor region, and a second electrode in contact with the second contact, and the first trench and the second trench extend so as to surround the element region while following a winding track.

REFERENCE SIGNS LIST

1 ELECTRONIC DEVICE
10 SOLID-STATE IMAGE SENSOR
11 SPAD ARRAY UNIT
12 DRIVE CIRCUIT
13 OUTPUT CIRCUIT
15 TIMING CONTROL CIRCUIT
20, 20a, 20b, 20c, 20d, 220, 20B, 20G, 20R, 620B, 620G, 620R, 920, 920a, 920b, 920c SPAD PIXEL
21 PHOTODIODE
22 READOUT CIRCUIT
23 QUENCH RESISTOR
24 SELECTION TRANSISTOR
25 DIGITAL CONVERTER
251 RESISTOR
26 INVERTER
27 BUFFER
30 IMAGE CAPTURING LENS
40 STORAGE UNIT
50 PROCESSOR
60 COLOR FILTER ARRAY
61 UNIT PATTERN
71 LIGHT RECEIVING CHIP
72 CIRCUIT CHIP
101, 141 SEMICONDUCTOR SUBSTRATE
102 PHOTOELECTRIC CONVERSION REGION
103 N--TYPE SEMICONDUCTOR REGION
104, 104a, 904c P-TYPE SEMICONDUCTOR REGION
105, 105A P+-TYPE SEMICONDUCTOR REGION
106, 106A N+-TYPE SEMICONDUCTOR REGION
107 CATHODE CONTACT
108, 108A, 408, 508, 908, 908a, 908b ANODE CONTACT
109, 109A, 109B, 109D INSULATING FILM
110, 310, 510 ELEMENT SEPARATION UNIT
111, 311, 511 LIGHT-SHIELDING FILM
112, 312, 512, 710 INSULATING FILM
113 PINNING LAYER
114 PLANARIZING FILM
115, 115R, 115G, 115B COLOR FILTER
116 ON-CHIP LENS
120, 130 INTERCONNECT LAYER
121 CATHODE ELECTRODE
122, 922, 922a, 922b ANODE ELECTRODE
123, 131 INTERLAYER INSULATING FILM
124, 132 INTERCONNECT
125, 135 CONNECTION PAD
142 CIRCUIT ELEMENT
252, 262 NMOS TRANSISTOR
261 PMOS TRANSISTOR
A1, A2, A3 OPENING
LD PIXEL DRIVE LINE
LS OUTPUT SIGNAL LINE
M1, M2, M3, M4 MASK
T1, T1a, T1b FIRST TRENCH
T2 SECOND TRENCH
T3, T4, T5, T11 TRENCH

What is claimed is:

1. A solid-state image sensor comprising:
    a semiconductor substrate including a first trench provided on a first surface and a second trench provided along a bottom portion of the first trench; and
    a photoelectric conversion element provided on the semiconductor substrate,
    wherein the photoelectric conversion element includes
    a photoelectric conversion region provided in an element region partitioned by the first trench and the second trench in the semiconductor substrate and photoelectrically converting incident light to generate a charge,
    a first semiconductor region surrounding the photoelectric conversion region in the element region,
    a first contact in contact with the first semiconductor region at the bottom portion of the first trench,
    a first electrode in contact with the first contact in the first trench,
    a second semiconductor region provided in a region in the element region in contact with the first semiconductor region and having a first conductive type, which is an equal type to that of the first semiconductor region,
    a third semiconductor region serving as a region in the element region in contact with the second semiconductor region, provided between the second semiconductor region and the first surface, and having a second conductive type, which is an opposite type to that of the first conductive type,
    a second contact provided on the first surface so as to be in contact with the third semiconductor region, and
    a second electrode in contact with the second contact, and
    a second surface at which the first contact and the first electrode are in contact with each other is inclined with respect to the first surface.

2. The solid-state image sensor according to claim 1, wherein
    the second surface is inclined to the second trench side from an end portion of the first electrode in a width direction toward a center portion thereof.

3. The solid-state image sensor according to claim 1, wherein
    the first trench and the second trench extend so as to surround the element region while following a winding track.

4. The solid-state image sensor according to claim 1, wherein
    a distance of the first contact from the first surface is longer than a distance of the third semiconductor region from the first surface.

5. The solid-state image sensor according to claim 1, wherein
the first contact comes in contact with the first semiconductor region so as to surround an outer periphery of the first semiconductor region.

6. The solid-state image sensor according to claim 1, further comprising:
a light-shielding film provided inside the second trench.

7. The solid-state image sensor according to claim 6, wherein
the light-shielding film is made of an equal material to the first electrode.

8. The solid-state image sensor according to claim 6, further comprising:
an insulating film provided between the light-shielding film and the first semiconductor region.

9. A solid-state image sensor comprising:
a semiconductor substrate including a first trench provided on a first surface and a second trench provided along a bottom portion of the first trench; and
a photoelectric conversion element provided on the semiconductor substrate,
wherein the photoelectric conversion element includes
a photoelectric conversion region provided in an element region partitioned by the first trench and the second trench in the semiconductor substrate and photoelectrically converting incident light to generate a charge,
a first semiconductor region surrounding the photoelectric conversion region in the element region,
a first contact in contact with the first semiconductor region at the bottom portion of the first trench,
a first electrode in contact with the first contact in the first trench,
a second semiconductor region provided in a region in the element region in contact with the first semiconductor region and having a first conductive type, which is an equal type to that of the first semiconductor region,
a third semiconductor region serving as a region in the element region in contact with the second semiconductor region, provided between the second semiconductor region and the first surface, and having a second conductive type, which is an opposite type to that of the first conductive type,
a second contact provided on the first surface so as to be in contact with the third semiconductor region, and
a second electrode in contact with the second contact, and
the first trench and the second trench extend so as to surround the element region while following a winding track.

10. The solid-state image sensor according to claim 9, wherein
each of the first trench and the second trench is formed in at least any of a zigzag shape, a crank shape, and a meandering shape in an extending direction.

11. The solid-state image sensor according to claim 9, wherein
the first electrode extends so as to surround the element region while following a winding track along the first trench.

12. The solid-state image sensor according to claim 11, wherein
the first contact extends so as to surround an outer periphery of the first semiconductor region while following a winding track along the first electrode and comes in contact with the first electrode.

13. The solid-state image sensor according to claim 12, wherein
the first semiconductor region extends so as to surround the photoelectric conversion region while following a winding track along the first contact and comes in contact with the first contact.

14. The solid-state image sensor according to claim 9, wherein
the plurality of photoelectric conversion elements are provided,
the plurality of photoelectric conversion elements are arranged in a grid pattern,
a pitch of each of the plurality of photoelectric conversion elements in a first direction is equal to a pitch thereof in a second direction perpendicular to the first direction, and
a length of one side of each of the first trench and the second trench surrounding the element region is longer than the pitch of each of the plurality of photoelectric conversion elements.

15. The solid-state image sensor according to claim 9, further comprising:
a light-shielding film provided inside the second trench.

16. The solid-state image sensor according to claim 15, wherein
the light-shielding film is made of an equal material to the first electrode.

17. The solid-state image sensor according to claim 15, wherein
the light-shielding film is in contact with the first semiconductor region.

18. The solid-state image sensor according to claim 15, further comprising:
an insulating film provided between the light-shielding film and the first semiconductor region.

19. An electronic device comprising:
a solid-state image sensor;
an optical system forming an image on a light receiving surface of the solid-state image sensor by means of incident light; and
a processor controlling the solid-state image sensor,
wherein the solid-state image sensor includes
a semiconductor substrate including a first trench provided on a first surface and a second trench provided along a bottom portion of the first trench, and
a photoelectric conversion element provided on the semiconductor substrate,
the photoelectric conversion element includes
a photoelectric conversion region provided in an element region partitioned by the first trench and the second trench in the semiconductor substrate and photoelectrically converting incident light to generate a charge,
a first semiconductor region surrounding the photoelectric conversion region in the element region,
a first contact in contact with the first semiconductor region at the bottom portion of the first trench,
a first electrode in contact with the first contact in the first trench,
a second semiconductor region provided in a region in the element region in contact with the first semiconductor region and having a first conductive type, which is an equal type to that of the first semiconductor region,
a third semiconductor region serving as a region in the element region in contact with the second semiconductor region, provided between the second semiconductor region and the first surface, and having a second conductive type, which is opposite to that of the first conductive type, a second contact provided on the first surface so as to be in contact with the third semiconductor region, and a second electrode in contact with the second contact, and a second surface at which the first contact and the first electrode are in contact with each other is inclined with respect to the first surface.

20. An electronic device comprising:

a solid-state image sensor;

an optical system forming an image on a light receiving surface of the solid-state image sensor by means of incident light; and a processor controlling the solid-state image sensor, wherein the solid-state image sensor includes a semiconductor substrate including a first trench provided on a first surface and a second trench provided along a bottom portion of the first trench, and a photoelectric conversion element provided on the semiconductor substrate, the photoelectric conversion element includes a photoelectric conversion region provided in an element region partitioned by the first trench and the second trench in the semiconductor substrate and photoelectrically converting incident light to generate a charge, a first semiconductor region surrounding the photoelectric conversion region in the element region, a first contact in contact with the first semiconductor region at the bottom portion of the first trench, a first electrode in contact with the first contact in the first trench, a second semiconductor region provided in a region in the element region in contact with the first semiconductor region and having a first conductive type, which is an equal type to that of the first semiconductor region, a third semiconductor region serving as a region in the element region in contact with the second semiconductor region, provided between the second semiconductor region and the first surface, and having a second conductive type, which is opposite to that of the first conductive type, a second contact provided on the first surface so as to be in contact with the third semiconductor region, and a second electrode in contact with the second contact, and the first trench and the second trench extend so as to surround the element region while following a winding track.

* * * * *